US012635355B2

(12) United States Patent
Yamazaki et al.

(10) Patent No.: US 12,635,355 B2
(45) Date of Patent: May 19, 2026

(54) DISPLAY APPARATUS AND MANUFACTURING METHOD OF THE DISPLAY APPARATUS

(71) Applicant: SEMICONDUCTOR ENERGY LABORATORY CO., LTD., Atsugi (JP)

(72) Inventors: Shunpei Yamazaki, Setagaya (JP); Satoshi Seo, Sagamihara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 390 days.

(21) Appl. No.: 18/549,205

(22) PCT Filed: Mar. 4, 2022

(86) PCT No.: PCT/IB2022/051908
§ 371 (c)(1),
(2) Date: Sep. 6, 2023

(87) PCT Pub. No.: WO2022/189916
PCT Pub. Date: Sep. 15, 2022

(65) Prior Publication Data
US 2024/0172487 A1     May 23, 2024

(30) Foreign Application Priority Data
Mar. 11, 2021    (JP) ................................. 2021-039663

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/35* (2023.02);
(Continued)

(58) Field of Classification Search
CPC .. H10K 59/122; H10K 59/1201; H10K 59/35; H10K 59/871; H10K 59/8722;
(Continued)

(56) References Cited

U.S. PATENT DOCUMENTS

| | | |
|---|---|---|
| 5,953,985 A | 9/1999 | Kobayashi |
| 6,120,338 A | 9/2000 | Hirano et al. |

(Continued)

FOREIGN PATENT DOCUMENTS

| | | |
|---|---|---|
| CN | 108717942 A | 10/2018 |
| CN | 109755396 A | 5/2019 |

(Continued)

OTHER PUBLICATIONS

International Search Report (Application No. PCT/IB2022/051908) Dated Jun. 7, 2022.
(Continued)

*Primary Examiner* — Donald L Raleigh
(74) *Attorney, Agent, or Firm* — Fish & Richardson P.C.

(57) ABSTRACT

A high-resolution display apparatus is provided. A display apparatus having a high aperture ratio is provided. The display apparatus includes a first light-emitting element and a second light-emitting element. In the first light-emitting element, a first pixel electrode, a first light-emitting layer, and a common electrode are stacked in this order. In the second light-emitting element, a second pixel electrode, a second light-emitting layer, and the common electrode are stacked in this order. A first layer and a second layer are included in a region between the first light-emitting element and the second light-emitting element. The first layer overlaps with the second light-emitting layer and includes the same material as the first light-emitting layer. The second layer overlaps with the first light-emitting layer and includes the same material as the second light-emitting layer. An end
(Continued)

portion of the first light-emitting layer and an end portion of the first layer are provided to face each other in the region between the first light-emitting element and the second light-emitting element. An end portion of the second light-emitting layer and an end portion of the second layer are provided to face each other in the region between the first light-emitting element and the second light-emitting element.

12 Claims, 24 Drawing Sheets

(51) Int. Cl.
    *H10K 59/35*          (2023.01)
    *H10K 59/80*          (2023.01)
(52) U.S. Cl.
    CPC ....... *H10K 59/871* (2023.02); *H10K 59/8722*
                    (2023.02); *H10K 59/873* (2023.02)
(58) Field of Classification Search
    CPC .... H10K 59/873; H10K 59/121; H10K 50/13;
                    H10K 71/12; H10K 71/166; G09F 9/30;
                    H05B 33/10; H05B 33/12; H05B 33/22;
                    H05B 33/26; H05B 33/28; H05B 33/14
    See application file for complete search history.

(56)                References Cited

U.S. PATENT DOCUMENTS

| | | | |
|---|---|---|---|
| 10,079,357 | B2 | 9/2018 | Song et al. |
| 11,088,208 | B2 | 8/2021 | Kim et al. |
| 11,678,550 | B2 | 6/2023 | Kato |
| 11,785,827 | B2 | 10/2023 | Yamazaki et al. |
| 12,096,671 | B2 | 9/2024 | Kato |
| 2002/0072139 | A1 | 6/2002 | Kashiwabara |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0123268 | A1 | 5/2017 | Sasaki et al. |
| 2017/0141167 | A1 | 5/2017 | Naganuma |
| 2017/0256754 | A1 | 9/2017 | Defranco et al. |
| 2018/0190908 | A1 | 7/2018 | Ke et al. |
| 2019/0181368 | A1 | 6/2019 | Kim et al. |
| 2020/0043983 | A1 | 2/2020 | Kim et al. |
| 2020/0057330 | A1 | 2/2020 | Yamazaki et al. |
| 2020/0194705 | A1* | 6/2020 | Kim ...................... H10K 59/38 |
| 2020/0203662 | A1 | 6/2020 | Mollard et al. |
| 2020/0343322 | A1 | 10/2020 | Jia et al. |
| 2021/0043705 | A1 | 2/2021 | Lim et al. |
| 2023/0006140 | A1 | 1/2023 | Nakamura et al. |
| 2023/0009750 | A1 | 1/2023 | Yamazaki et al. |
| 2023/0052149 | A1 | 2/2023 | Yamazaki et al. |
| 2025/0008802 | A1 | 1/2025 | Kato |

FOREIGN PATENT DOCUMENTS

| | | |
|---|---|---|
| CN | 110783380 A | 2/2020 |
| CN | 111326545 A | 6/2020 |
| CN | 112349752 A | 2/2021 |
| EP | 3125331 A | 2/2017 |
| JP | 2000-036385 A | 2/2000 |
| JP | 2003-059663 A | 2/2003 |
| JP | 2008-098106 A | 4/2008 |
| JP | 2008-147072 A | 6/2008 |
| JP | 2008-251270 A | 10/2008 |
| JP | 2012-160473 A | 8/2012 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-160305 A | 10/2020 |
| KR | 2015-0137280 A | 12/2015 |
| KR | 2017-0015620 A | 2/2017 |
| KR | 2019-0050460 A | 5/2019 |
| KR | 2020-0014176 A | 2/2020 |
| KR | 2020-0057922 A | 5/2020 |
| KR | 2020-0072964 A | 6/2020 |
| KR | 2021-0017179 A | 2/2021 |
| TW | 201727332 | 8/2017 |
| WO | WO-2017/072634 | 5/2017 |
| WO | WO-2018/087625 | 5/2018 |
| WO | WO-2019/228259 | 12/2019 |
| WO | WO-2020/004086 | 1/2020 |

OTHER PUBLICATIONS

Written Opinion (Application No. PCT/IB2022/051908) Dated Jun. 7, 2022.

Papadopoulos.N et al., "AMOLED Displays with In-Pixel Photodetector", Liquid Crystals and Display Technology, Jul. 9, 2020, pp. 1-19.

Zakhidov.A et al., "Orthogonal processing: A new strategy for organic electronics", Chem. Sci. (Chemical Science), Apr. 7, 2011, vol. 2, No. 6, pp. 1178-1182.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

(56)        References Cited

OTHER PUBLICATIONS

Taiwanese Office Action (Application No. 111108065) Dated Dec.
31, 2025.

* cited by examiner

FIG. 17A
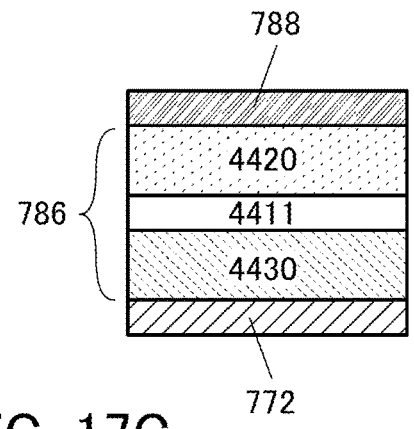
FIG. 17B
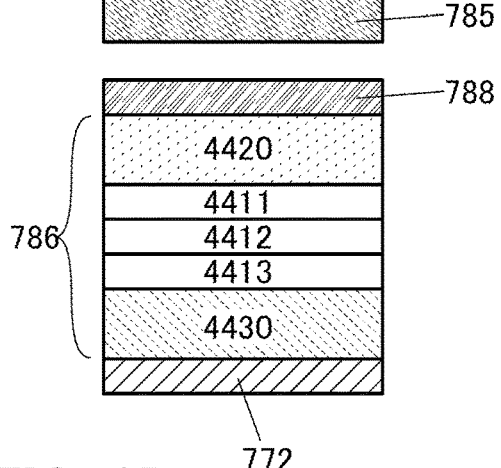
FIG. 17C
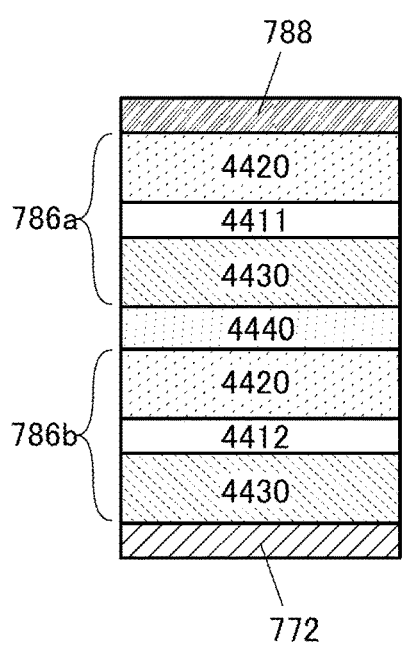
FIG. 17D
FIG. 17E
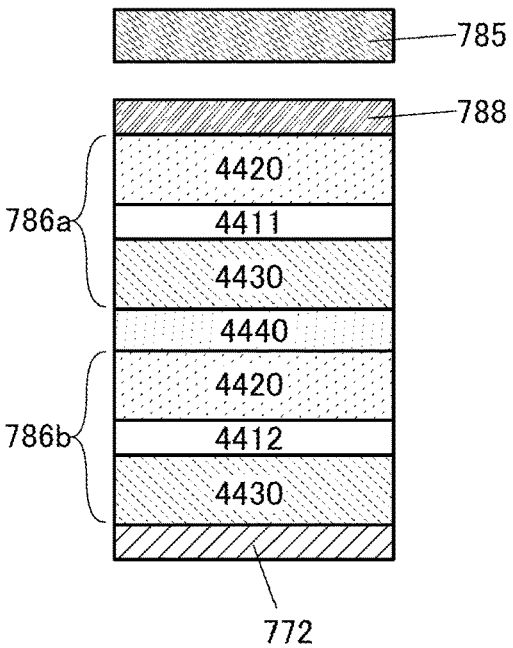
FIG. 17F

FIG. 21A
7100
7101
7000
7103
7111
FIG. 21B
7200
7211
7000
7212
7213
7214
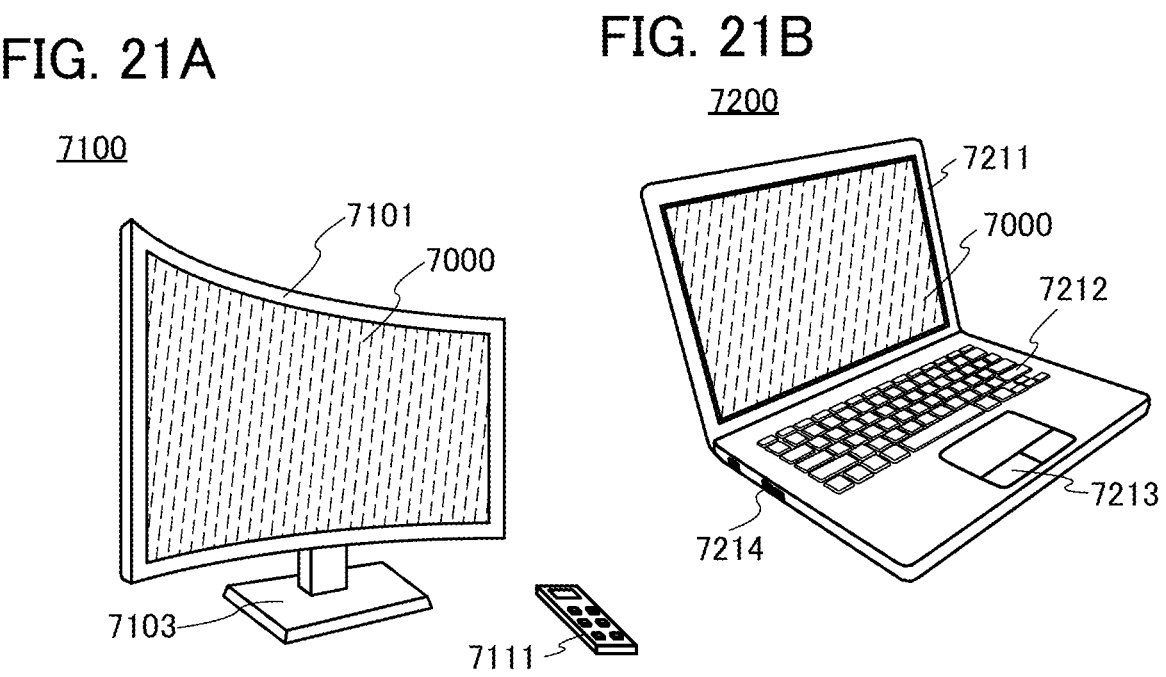
FIG. 21C
7300
7301
7303
7000
7311
FIG. 21D
7400
7401
7000
7411
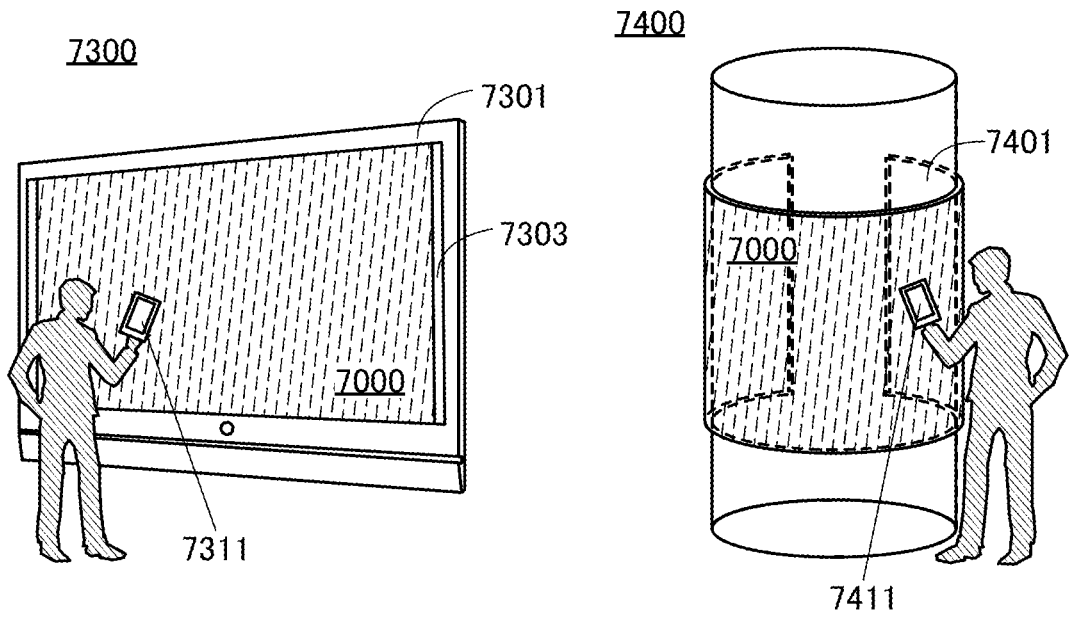

FIG. 22A
FIG. 22B
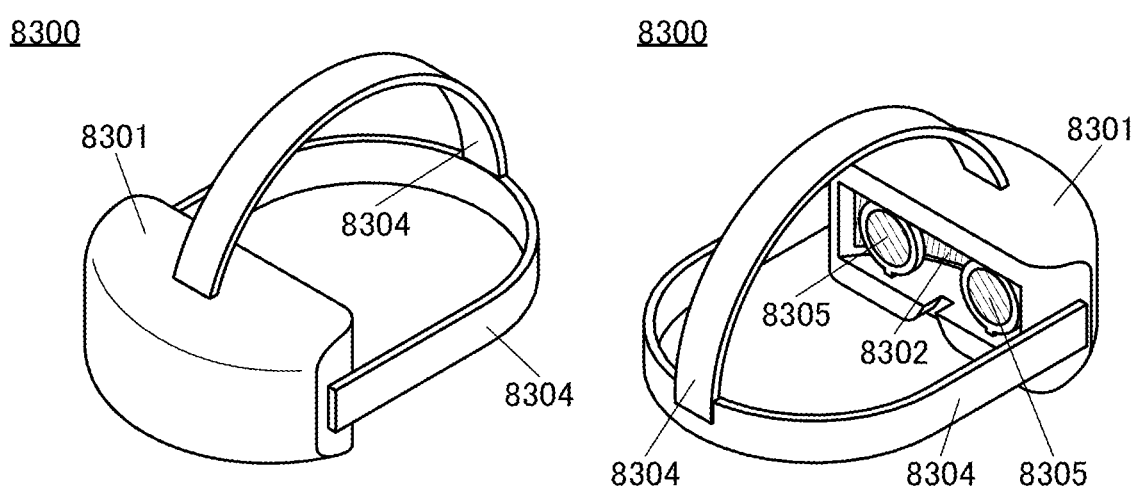
FIG. 22C
FIG. 22D
FIG. 22E
FIG. 22F
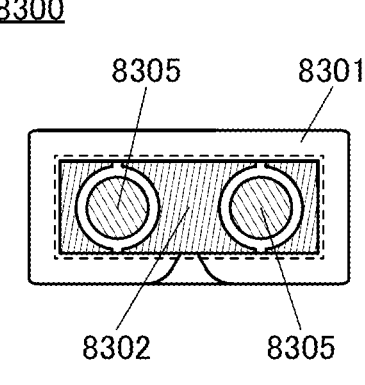
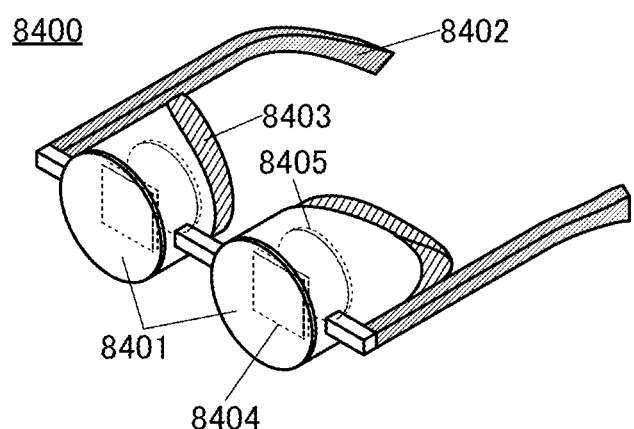

9101

9102

9200

9201

9201

9201

DISPLAY APPARATUS AND MANUFACTURING METHOD OF THE DISPLAY APPARATUS

CROSS REFERENCE TO RELATED APPLICATIONS

This application is a U.S. National Phase Application under 35 U.S.C. § 371 of International Application PCT/IB2022/051908, filed on Mar. 4, 2022, which is incorporated by reference and claims the benefit of a foreign priority application filed in Japan on Mar. 11, 2021, as Application No. 2021-039663.

TECHNICAL FIELD

One embodiment of the present invention relates to a display apparatus. One embodiment of the present invention relates to a manufacturing method of the display apparatus.

Note that one embodiment of the present invention is not limited to the above technical field. Examples of a technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a laptop computer. Furthermore, higher resolution has been required for a stationary display apparatus such as a television device or a monitor device along with an increase in definition. Examples of devices required to have the highest resolution include devices for virtual reality (VR) and augmented reality (AR).

Examples of display apparatuses that can be used for a display panel include, typically, a liquid crystal display apparatus, a light-emitting apparatus including a light-emitting element such as an organic EL (Electro Luminescence) element or a light-emitting diode (LED), and electronic paper performing display by an electrophoretic method or the like.

Patent Document 1, for example, discloses an example of a display apparatus for VR using an organic EL element.

REFERENCE

Patent Document

[Patent Document 1] PCT International Publication No. 2018/087625

SUMMARY OF THE INVENTION

Problems to be Solved by the Invention

An object of one embodiment of the present invention is to provide a high-resolution display apparatus. Another object of one embodiment of the present invention is to provide a display apparatus with a high aperture ratio. An object of one embodiment of the present invention is to provide a display apparatus with high luminance. Another object of one embodiment of the present invention is to provide a high-contrast display apparatus. Another object of one embodiment of the present invention is to provide a highly reliable display apparatus.

An object of one embodiment of the present invention is to provide a display apparatus having a novel structure. An object of one embodiment of the present invention is to provide a manufacturing method of a novel display apparatus. Another object of one embodiment of the present invention is to provide a manufacturing method of the above-described display apparatus with high yield. Another object of one embodiment of the present invention is to at least reduce at least one of problems of the conventional technique.

Note that the description of these objects does not preclude the existence of other objects. One embodiment of the present invention does not have to achieve all of these objects. Note that objects other than these can be derived from the descriptions of the specification, the drawings, the claims, and the like.

Means for Solving the Problems

One embodiment of the present invention is a display apparatus including a first light-emitting element and a second light-emitting element. In the first light-emitting element, a first pixel electrode, a first light-emitting layer, and a common electrode are stacked in this order. In the second light-emitting element, a second pixel electrode, a second light-emitting layer, and the common electrode are stacked in this order. A first layer and a second layer are included in a region between the first light-emitting element and the second light-emitting element. The first layer overlaps with the second light-emitting layer and includes the same material as the first light-emitting layer. The second layer overlaps with the first light-emitting layer and includes the same material as the second light-emitting layer. An end portion of the first light-emitting layer and an end portion of the first layer are provided to face each other in the region between the first light-emitting element and the second light-emitting element. An end portion of the second light-emitting layer and an end portion of the second layer are provided to face each other in the region between the first light-emitting element and the second light-emitting element.

Another embodiment of the present invention is a display apparatus including a first light-emitting element and a second light-emitting element. In the first light-emitting element, a first pixel electrode, a first light-emitting layer, a first intermediate layer, a third light-emitting layer, and a common electrode are stacked in this order. In the second light-emitting element, a second pixel electrode, a second light-emitting layer, a second intermediate layer, a fourth light-emitting layer, and the common electrode are stacked in this order. A first layer, a second layer, a third layer, and a fourth layer are included between the first light-emitting element and the second light-emitting element. The first layer overlaps with the second light-emitting layer, the second intermediate layer, and the fourth light-emitting layer and includes the same material as the first light-emitting layer. The second layer overlaps with the first light-emitting layer, the first intermediate layer, and the third light-emitting layer and includes the same material as the second light-emitting layer. The third layer overlaps with the first layer and includes the same material as the third light-emitting layer. The fourth layer overlaps with the second layer and includes the same material as the fourth light-emitting layer. An end portion of the first light-emitting layer and an end portion of the first layer are provided to face each other in a region between the first light-emitting element and the second light-emitting element. An end portion of the second light-emitting layer and an end portion of the second layer are provided to face each other in the region between the first light-emitting element and the second light-emitting element. An end portion of the third light-emitting layer and an end portion of the third layer are provided to face each other in the region between the first light-emitting element and the second light-emitting element. An end portion of the fourth light-emitting layer and an end portion of the fourth layer are provided to face each other in the region between the first light-emitting element and the second light-emitting element.

In the above, preferably, the first light-emitting layer and the third light-emitting layer comprise the same material and the second light-emitting layer and the fourth light-emitting layer comprise the same material.

In any of the above, a resin layer is preferably included. The resin layer is preferably positioned in the region between the first light-emitting element and the second light-emitting element. Preferably, the end portion of the first light-emitting layer and the end portion of the first layer face each other with the resin layer interposed therebetween, and the end portion of the second light-emitting layer and the end portion of the second layer face each other with the resin layer interposed therebetween.

In any of the above, a first insulating layer is preferably included. Preferably, the first insulating layer is positioned in the region between the first light-emitting element and the second light-emitting element, and the first insulating layer is in contact with the end portion of the first light-emitting layer, the end portion of the second light-emitting layer, the end portion of the first layer, and the end portion of the second layer.

Another embodiment of the present invention is a manufacturing method of a display apparatus including a first step of forming a first pixel electrode and a second pixel electrode side by side, a second step of forming an island-shaped first light-emitting layer over the first pixel electrode with use of a first metal mask, a third step of forming an island-shaped second light-emitting layer over the second pixel electrode with use of a second metal mask so that the second light-emitting layer overlaps with an end portion of the first light-emitting layer, a fourth step of dividing each of the first light-emitting layer and the second light-emitting layer by etching in a region between the first pixel electrode and the second pixel electrode, and a fifth step of forming a common electrode covering the first light-emitting layer and the second light-emitting layer.

In the above, a sixth step of forming a resin layer in a slit formed by the etching is preferably included after the fourth step and before the fifth step.

In the above, a photosensitive organic resin is preferably used for the resin layer.

In any of the above, a seventh step of forming a first insulating layer in contact with a side surface of the first light-emitting layer and a side surface of the second light-emitting layer that are exposed by the etching is preferably included after the fourth step and before the sixth step.

In the above, an inorganic insulating film formed by an atomic layer deposition method is preferably used for the first insulating layer.

Effect of the Invention

According to one embodiment of the present invention, a high-resolution display apparatus can be provided. Alternatively, a novel display apparatus with a high aperture ratio can be provided. Alternatively, a display apparatus with high luminance can be provided. Alternatively, a high-contrast display apparatus can be provided. Alternatively, a highly reliable display apparatus can be provided.

According to one embodiment of the present invention, a display apparatus having a novel structure can be provided. Alternatively, a novel display apparatus and a manufacturing method of the display apparatus can be provided. Alternatively, a manufacturing method of the above-described display apparatus with high yield can be provided. According to one embodiment of the present invention, at least one of problems of the conventional technique can be reduced.

Note that the description of these effects does not preclude the existence of other effects. One embodiment of the present invention does not need to have all of these effects. Note that effects other than these can be derived from the descriptions of the specification, the drawings, the claims, and the like.

BRIEF DESCRIPTION OF THE DRAWINGS

FIG. 7A and FIG. 7B are diagrams illustrating a structure example of a display apparatus.

FIG. 9A to FIG. 9C are diagrams illustrating an example of a manufacturing method of a display apparatus.

FIG. 17A to FIG. 17F are diagrams each illustrating a structure example of a light-emitting device.

FIG. 21A to FIG. 21D are diagrams each illustrating an example of an electronic device.

FIG. 22A to FIG. 22F are diagrams each illustrating an example of an electronic device.

MODE FOR CARRYING OUT THE INVENTION

Figures 1A, 1B, 1C, 1D:
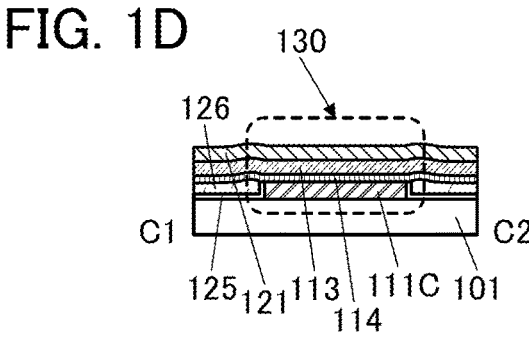
FIG. 1A to FIG. 1D are diagrams illustrating a structure example of a display apparatus.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first," "second," and the like are used in order to avoid confusion among components and do not limit the number.

In this specification and the like, the term "film" and the term "layer" can be interchanged with each other. For example, in some cases, the term "conductive layer" and the term "insulating layer" can be interchanged with the term "conductive film" and the term "insulating film", respectively.

Note that in this specification, an EL layer means a layer containing at least a light-emitting substance (also referred to as a light-emitting layer) or a stacked-layer body including the light-emitting layer provided between a pair of electrodes of a light-emitting element.

In this specification and the like, a display panel that is one embodiment of a display apparatus has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, a structure example of a display apparatus of one embodiment of the present invention and an example of a manufacturing method of the display apparatus will be described.

One embodiment of the present invention is a display apparatus including a light-emitting element (also referred to as a light-emitting device). The display apparatus includes at least two light-emitting elements of different emission colors. The light-emitting elements each include a pair of electrodes and an EL layer therebetween. The light-emitting elements are preferably organic EL elements (organic electroluminescent elements). Two or more light-emitting elements emitting different colors include respective EL layers containing different materials. For example, three kinds of light-emitting elements emitting red (R), green (G), and blue (B) light are included, whereby a full-color display apparatus can be obtained.

It is known that in the case where some or all of EL layers are separately formed for light-emitting elements of different colors, the EL layers are formed by an evaporation method using a shadow mask such as a fine metal mask (hereinafter, also referred to as an FMM). However, this method causes a deviation from the designed shape and position of an island-shaped organic film due to various influences such as the accuracy of the FMM, the positional deviation between the FMM and a substrate, a warp of the FMM, and the vapor-scattering-induced expansion of outline of the formed film; accordingly, it is difficult to achieve a high resolution and a high aperture ratio of the display apparatus. Thus, a measure has been taken for pseudo improvement in resolution (also referred to pixel density) by employing a unique pixel arrangement such as a PenTile arrangement, for example.

In a manufacturing method with the use of an FMM, two adjacent island-shaped organic films can be formed so as to partly overlap with each other in order that the resolution and the aperture ratio can be increased as much as possible. In this case, the distance between light-emitting regions can be much shorter than that in the case where the two island-shaped organic films do not overlap with each other. However, when the two adjacent island-shaped organic films are formed to overlap with each other, current leakage between two adjacent light-emitting elements through the overlapping organic films might occur to cause unintentional light emission. This causes luminance decrease, contrast decrease, and the like to degrade display quality. Furthermore, the leakage current adversely affects electric power efficiency, power consumption, and the like.

In view of the above, according to one embodiment of the present invention, the respective organic films of two adjacent light-emitting elements are separately formed with the use of an FMM so as to partly overlap with each other. Specifically, at least layers including light-emitting organic compounds (also referred to as light-emitting layers) are separately formed with the use of an FMM. In this case, other organic film included in the light-emitting elements may use a common film without being separately formed. A stacked organic film in which at least two kinds of light-emitting layers and another organic film are stacked is positioned in a region between the two adjacent light-emitting elements. Then, the portion positioned between the two adjacent light-emitting elements is etched by a photolithography method to divide the stacked organic film. This can cut a current leakage route (leakage path) through the two adjacent light-emitting elements. Accordingly, a higher luminance, a higher contrast, higher power efficiency, lower power consumption, or the like can be achieved.

Furthermore, an insulating layer is preferably formed to protect side surfaces of the stacked organic film that are exposed by the etching. Thus, the reliability of the display apparatus can be increased.

As described above, one embodiment of the present invention can achieve a display apparatus in which minute light-emitting elements are integrated. It is not necessary to conduct a pseudo improvement in resolution by employing a unique pixel arrangement such as a PenTile arrangement; thus, the display apparatus can achieve a resolution higher than or equal to 300 ppi, higher than or equal to 500 ppi, higher than or equal to 700 pp, or higher than or equal to 1000 ppi while having what is called a stripe arrangement where R, G, and B are arranged in one direction. Furthermore, a display apparatus with an effective light-emitting area ratio (aperture ratio) higher than or equal to 15%, higher than or equal to 20%, higher than or equal to 30% and lower than 100% can be achieved.

In one embodiment of the present invention, a minute light-emitting element can be fabricated with high accuracy, so that a complex arrangement method of pixels can be achieved. For example, various arrangement methods such as an S-stripe arrangement, a Bayer arrangement, and a delta alignment can be employed in addition to a stripe arrangement.

Note that in this specification and the like, an effective light-emitting area ratio is the proportion of the area of a region that can be regarded as a light-emitting region in one pixel, with respect to the area of one pixel that is calculated from a repeated pixel pitch in a display apparatus.

More specific structure examples and manufacturing method examples of the display apparatus of one embodiment of the present invention are described below with reference to drawings.

Structure Example 1

In FIG. 1A, a schematic top view of a display apparatus 100 of one embodiment of the present invention is illustrated. The display apparatus 100 includes a plurality of light-emitting elements 110R exhibiting red, a plurality of light-emitting elements 110G exhibiting green, and a plurality of light-emitting elements 110B exhibiting blue. In FIG. 1A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 1A illustrates what is called a stripe arrangement, in which light-emitting elements of the same color are arranged in one direction. Note that the arrangement method of the light-emitting elements is not limited thereto; another arrangement method such as an S-stripe arrangement, a delta arrangement, a Bayer arrangement, or a zigzag arrangement may be employed, or a PenTile arrangement may also be used.

The light-emitting elements 110R, the light-emitting elements 110G, and the light-emitting elements 110B are arranged in the X direction. The light-emitting elements of the same color are arranged in the Y direction intersecting with the X direction.

As the light-emitting elements 110R, the light-emitting elements 110G, and the light-emitting elements 110B, EL elements such as OLEDs (Organic Light Emitting Diodes) or QLEDs (Quantum-dot Light Emitting Diodes) are preferably used. Examples of light-emitting substances contained in the EL elements include a substance that emits fluorescent light (a fluorescent material), a substance that emits phosphorescent light (a phosphorescent material), and a substance that exhibits thermally activated delayed fluorescence (a thermally activated delayed fluorescent (TADF) material). Examples of the light-emitting substances contained in the EL elements include inorganic compounds (e.g., quantum dot materials) in addition to organic compounds.

FIG. 1B is a schematic cross-sectional view taken along the dashed-dotted line A1-A2 in FIG. 1A, and FIG. 1C is a schematic cross-sectional view taken along the dashed-dotted line B1-B2.

FIG. 1B illustrates cross sections of the light-emitting element 110R, the light-emitting element 110G, and the light-emitting element 110B. The light-emitting element 110R includes a pixel electrode 111R, an organic layer 115, an organic layer 112R, an organic layer 116, an organic layer 114, and a common electrode 113. The light-emitting element 110G includes a pixel electrode 111G, the organic layer 115, an organic layer 112G, the organic layer 116, the organic layer 114, and the common electrode 113. The light-emitting element 110B includes a pixel electrode 111B, the organic layer 115, an organic layer 112B, the organic layer 116, the organic layer 114, and the common electrode 113. The organic layer 114 and the common electrode 113 are shared by the light-emitting element 110R, the light-emitting element 110G, and the light-emitting element 110B. The organic layer 114 can also be referred to as a common layer.

The organic layer 112R included in the light-emitting element 110R contains at least a light-emitting organic compound that emits red light. The organic layer 112G included in the light-emitting element 110G contains at least a light-emitting organic compound that emits green light. The organic layer 112B included in the light-emitting element 110B contains at least a light-emitting organic compound that emits blue light. Each of the organic layer 112R, the organic layer 112G, and the organic layer 112B can also be referred to as a light-emitting layer.

Hereafter, the term "light-emitting element 110" is sometimes used to describe matters common to the light-emitting elements 110R, 110G, and 110B. Likewise, in the description of matters common to the components that are distinguished using alphabets, such as the organic layer 112R, the organic layer 112G, and the organic layer 112B, reference numerals without such alphabets are sometimes used.

The stacked film positioned between the pixel electrode and the common electrode 113 can be referred to as an EL layer in each light-emitting element.

In each light-emitting element, the organic layer 115 is a layer positioned between the organic layer 112 and the pixel electrode 111. The organic layer 116 is a layer positioned between the organic layer 112 and the organic layer 114. The organic layer 114 is a layer positioned between the organic layer 116 and the common electrode 113.

The organic layer 115, the organic layer 116, and the organic layer 114 can each independently include one or more of an electron-injection layer, an electron-transport layer, a hole-injection layer, and a hole-transport layer. For example, it is possible that the organic layer 115 has a stacked-layer structure of a hole-injection layer and a hole-transport layer from the pixel electrode 111 side, the organic layer 116 includes an electron-transport layer, and the organic layer 114 includes an electron-injection layer. Alternatively, it is possible that the organic layer 115 has a stacked-layer structure of an electron-injection layer and an electron-transport layer from the pixel electrode 111 side, the organic layer 116 includes a hole-transport layer, and the organic layer 114 includes a hole-injection layer.

Note that the "organic layer" positioned between a pair of electrodes of a light-emitting element, such as the organic layer 112, the organic layer 114, the organic layer 115, or the organic layer 116, means a "layer that constitutes an organic EL element" and does not necessarily contain an organic compound. For example, a film not containing an organic compound but containing only an inorganic compound or an inorganic substance can be used for each of the organic layer 112, the organic layer 114, the organic layer 115, and the organic layer 116.

The pixel electrode 111R, the pixel electrode 111G, and the pixel electrode 111B are provided for the respective light-emitting elements. The common electrode 113 and the organic layer 114 are each provided as a continuous layer shared by the light-emitting elements. A conductive film having a transmitting property with respect to visible light is used for either the pixel electrodes or the common electrode 113, and a conductive film having a reflective property is used for the other. When the pixel electrodes have light-transmitting properties and the common electrode 113 has a reflective property, a bottom-emission display apparatus can be obtained; by contrast, when the pixel electrodes have reflective properties and the common electrode 113 has a light-transmitting property, a top-emission display apparatus can be obtained. Note that when both the pixel electrodes and the common electrode 113 have light-transmitting properties, a dual emission display apparatus can be obtained.

A protective layer 121 is provided over the common electrode 113 to cover the light-emitting element 110R, the light-emitting element 110G, and the light-emitting element 110B. The protective layer 121 has a function of inhibiting diffusion of impurities such as water into the light-emitting elements from above.

A slit 120 is provided between two adjacent light-emitting elements. The slit 120 corresponds to the portion where the organic layer 115, the organic layer 112, and the organic layer 116 positioned between the two adjacent light-emitting elements are etched.

In the slit 120, an insulating layer 125 and a resin layer 126 are provided. The insulating layer 125 is provided along a sidewall and a bottom surface of the slit 120. The resin layer 126 is provided over the insulating layer 125 and has a function of filling a depressed portion positioned in the slit 120 and planarizing the top surface. The planarization for the depressed portion in the slit 120 by the resin layer 126 can improve coverage with the organic layer 114, the common electrode 113, and the protective layer 121. In addition, the slit 120 can be formed at the same time as an opening portion for an external connection terminal such as a connection electrode 111C and thus they can be formed without increasing steps. The slit 120, which includes the insulating layer 125 and the resin layer 126, also has an effect of preventing a short circuit between the pixel electrode 111 and the common electrode 113. The resin layer 126 has an effect of improving adhesion of the organic layer 114. That is, providing the resin layer 126 improves adhesion of the organic layer 114, so that peeling of the organic layer 114 can be inhibited. Moreover, the insulating layer 125 is provided in contact with a side surface of an organic layer (e.g., the organic layer 115), thereby preventing contact between the organic layer and the resin layer 126. If the organic layer is in contact with the resin layer 126, the organic layer might be dissolved by an organic solvent or the like contained in the resin layer 126. In view of this, the insulating layer 125 is provided between the organic layer and the resin layer 126 as described in this embodiment to protect the side surface of the organic layer. Note that the slit 120 can be configured to divide at least one or more of a hole-injection layer, a hole-transport layer, an electron-blocking layer, a light-emitting layer, a hole-blocking layer, an electron-transport layer, and an electron-injection layer.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. An inorganic insulating film such as an aluminum oxide film, a hafnium oxide film, or a silicon oxide film is formed by an ALD method as the insulating layer 125, whereby the insulating layer 125 can have few pinholes and an excellent function of protecting the EL layer.

Note that in this specification and the like, oxynitride refers to a material that contains more oxygen than nitrogen, and nitride oxide refers to a material that contains more nitrogen than oxygen. For example, in the case where silicon oxynitride is described, it refers to a material that contains more oxygen than nitrogen in its composition. In the case where silicon nitride oxide is described, it refers to a material that contains more nitrogen than oxygen in its composition.

The insulating layer 125 can be deposited by a sputtering method, a CVD method, a PLD method, an ALD method, or the like. The insulating layer 125 is preferably formed by an ALD method achieving good coverage.

An insulating layer containing an organic material can be suitably used as the resin layer 126. As the resin layer 126, an acrylic resin, a polyimide resin, an epoxy resin, an imide resin, a polyamide resin, a polyimide-amide resin, a silicone resin, a siloxane resin, a benzocyclobutene-based resin, a phenol resin, a precursor of any of these resins, or the like can be used, for example. For the resin layer 126, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin may be used. A photosensitive resin can also be used for the resin layer 126. A photoresist may be used for the photosensitive resin. For the photosensitive resin, a positive type material or a negative type material can be used. A colored material (e.g., a material containing a black pigment) may be used for the resin layer 126 to add the function of blocking stray light from an adjacent pixel and inhibiting color mixture. A reflective film (e.g., a metal film containing one or more selected from silver, palladium, copper, titanium, aluminum, and the like) may be provided between the insulating layer 125 and the resin layer 126 so that light emitted from the light-emitting layer is reflected by the reflective film; hence, the function of increasing the light extraction efficiency may be added.

A top surface of the resin layer 126 is preferably as flat as possible and is gently curved in some cases. Although FIG. 1B and the like show an example in which the top surface of the resin layer 126 has a wave shape with a depressed portion and a projected portion, the present invention is not limited thereto. The top surface of the resin layer 126 may be a convex surface, a concave surface, or a flat surface, for example.

As the protective layer 121, a stacked film of an inorganic insulating film and an organic insulating film can be used. For example, a structure in which an organic insulating film is interposed between a pair of inorganic insulating films is preferable. Furthermore, the organic insulating film preferably functions as a planarization film. Accordingly, the top surface of the organic insulating film can be flat, and accordingly, coverage with the inorganic insulating film thereover is improved, leading to an improvement in barrier properties. Since the top surface of the protective layer 121 is flat, when a component (e.g., a color filter, an electrode of a touch sensor, or a lens array) is provided above the protective layer 121, the component is less affected by an uneven shape caused by components therebelow, which is preferable.

The protective layer 121 can have, for example, a single-layer structure or a stacked-layer structure at least including an inorganic insulating film. For the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide may be used for the protective layer 121.

As illustrated in FIG. 1C, the slit 120 may be provided also between the light-emitting elements of the same color. The slit 120 thus provided suitably prevents unintentional light emission from being caused by a current flowing through the two adjacent EL layers even in the light-emitting elements of the same color. As a result, the contrast can be increased to achieve a display apparatus with high display quality.

Note that in the Y direction, a band-shaped organic layer 112R, a band-shaped organic layer 112G, or a band-shaped organic layer 112B may be formed so that the organic layer 112R, the organic layer 112G, or the organic layer 112B in the light-emitting elements of the same color become continuous. When the organic layer 112R and the like are formed in a band-like shape, a space for dividing the layers is not needed and thus the area of a non-light-emitting region between the light-emitting elements can be reduced, resulting in a higher aperture ratio.

FIG. 1A illustrates a connection electrode 111C that is electrically connected to the common electrode 113. The connection electrode 111C is supplied with a potential (e.g., an anode potential or a cathode potential) that is to be supplied to the common electrode 113. The connection electrode 111C is provided outside of a display region where the light-emitting elements 110R and the like are arranged. In FIG. 1A, the common electrode 113 is illustrated by a dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface, the top surface of the connection electrode 111C can have a band-like shape, an L shape, a square bracket shape, a quadrangular shape, or the like.

FIG. 1D is a schematic cross-sectional view taken along the dashed-dotted line C1-C2 in FIG. 1A. FIG. 1D illustrates a connection portion 130 in which the connection electrode 111C and the common electrode 113 are electrically connected to each other. In the connection portion 130, the common electrode 113 is provided over the connection electrode 111C with the organic layer 114 therebetween. The insulating layer 125 is provided in contact with a side surface of the connection electrode 111C, and the resin layer 126 is provided over the insulating layer 125.

Note that the organic layer 114 is not necessarily provided in the connection portion 130. In that case, in the connection portion 130, the common electrode 113 is provided over and in contact with the connection electrode 111C and the protective layer 121 is provided to cover the common electrode 113.

Figures 2A, 2B, 2C:
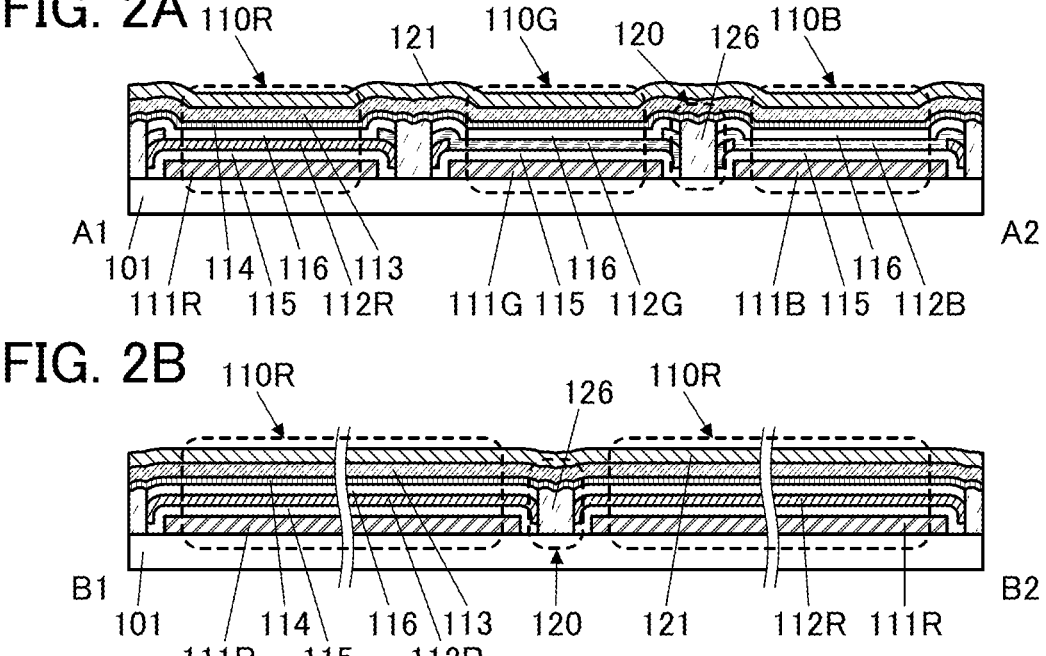
FIG. 2A to FIG. 2C are diagrams each illustrating a structure example of a display apparatus.

FIG. 2A, FIG. 2B, and FIG. 2C illustrate an example in which the insulating layer 125 is not provided.

As illustrated in FIG. 2A and FIG. 2B, the resin layer 126 is provided in contact with the side surfaces of the organic layer 115, the organic layer 112, and the organic layer 116. As illustrated in FIG. 2C, the resin layer 126 is provided in contact with the side surface of the connection electrode 111C.

Figure 3A:
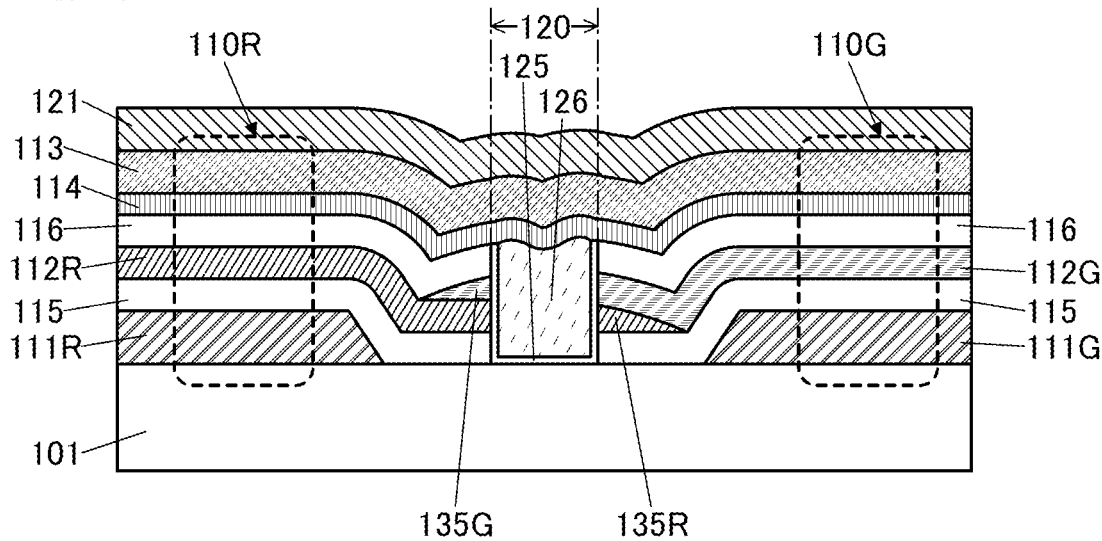
FIG. 3A and FIG. 3B are diagrams illustrating structure examples of a display apparatus.

Next, a preferred structure of the slit 120 and the vicinity thereof is described in detail. FIG. 3A is a schematic cross-sectional view including part of the light-emitting element 110R, part of the light-emitting element 110G, and the region between them in FIG. 1B.

As illustrated in FIG. 3A, an end portion of the pixel electrode 111 is preferably tapered. This can improve the step coverage with the organic layer 115 or the like. Note that in this specification and the like, an end portion of an object having a tapered shape indicates that the end portion has a cross-sectional shape in which the angle between a surface of the object and a formation surface of the object is greater than 0° and less than 90° in a region of the end portion, and the thickness continuously increases from the end portion. Although the case in which the pixel electrode 111R has a single-layer structure is shown here, a plurality of layers may be stacked.

The organic layer 115 is provided to cover the pixel electrode 111R. The organic layer 115 is provided to cover the pixel electrode 111G. A continuous film is divided by the slit 120, thereby forming these organic layers 115.

The organic layer 112R is provided to cover the organic layer 115 on the light-emitting element 110R side with respect to the slit 120. In addition, a layer 135R is provided over the organic layer 115 on the light-emitting element 110G side with respect to the slit 120. The layer 135R can be referred to as a scrap remaining on the light-emitting element 110G side after part of a film to be the organic layer 112R is divided by the slit 120.

The organic layer 112G is provided to cover the organic layer 115 on the light-emitting element 110G side with respect to the slit 120. In addition, a layer 135G is provided over the organic layer 112R on the light-emitting element 110R side with respect to the slit 120. The layer 135G can be referred to as a scrap remaining on the light-emitting element 110R side after part of a film to be the organic layer 112G is divided by the slit 120.

One or both of the layer 135R and the layer 135G are not formed in some cases depending on the position and width of the slit 120, the formation position of the organic layer 112R, the formation position of the organic layer 112G, and the like. Specifically, in the case where an end portion of the organic layer 112R before the formation of the slit 120 overlaps with the formation position of the slit 120, the layer 135R is not formed in some cases.

The organic layer 116 is provided to cover the organic layer 112R and the layer 135G. The organic layer 116 is provided to cover the organic layer 112G and the layer 135R.

A continuous film is divided by the slit 120, thereby forming these organic layers 116, in a manner similar to that of the organic layer 115.

The insulating layer 125 is provided on the inner side of the slit 120 and in contact with side surfaces of the pair of organic layers 115, a side surface of the organic layer 112R, a side surface of the organic layer 112G, a side surface of the layer 135R, a side surface of the layer 135G, and side surfaces of the pair of organic layers 116. In addition, the insulating layer 125 is provided to cover a top surface of the substrate 101.

The resin layer 126 is provided in contact with a top surface and a side surface of the insulating layer 125. The resin layer 126 has a planarization function for a depressed portion of the formation surface of the organic layer 114.

The organic layer 114, the common electrode 113, and the protective layer 121 are formed in this order to cover top surfaces of the organic layer 116, the insulating layer 125, and the resin layer 126. Note that the organic layer 114 is not necessarily provided when not needed.

Here, the layer 135R and the layer 135G are positioned at end portions of the films to be the organic layer 112R and the organic layer 112G. In a deposition method with the use of an FMM, an organic film tends to be gradually thinner towards its end portion, whereby the layer 135R and the layer 135G have portions thinner than the organic layer 112R and the organic layer 112G. The layer 135R and the layer 135G are thin enough not to be easily observed in cross-sectional observation in some cases. Even when the layer 135R or the layer 135G is present, the boundary between the layer 135R and the organic layer 112G or the boundary between the layer 135G and the organic layer 112R are not easily observed in cross-sectional observation in some cases.

Since the layer 135R and the layer 135G include a light-emitting compound (e.g., a fluorescent material, a phosphorescent material, or a quantum dot), light due to photoluminescence can be obtained by irradiation with light such as ultraviolet light or visible light in a plan view. When such light emission is observed with an optical microscope or the like, the presence of the layer 135R or the layer 135G can be confirmed. Specifically, the layer 135R and the organic layer 112G overlap with each other in the portion where the layer 135R is positioned; therefore, when the portion is irradiated with ultraviolet light or the like, both light from the layer 135R and light from the organic layer 112G are observed. From the emission spectra, wavelengths, emission colors, and the like of light emission from the layer 135R and the layer 135G, it is possible to confirm that the layer 135R or the layer 135G includes a material that is the same as the organic layer 112R or the organic layer 112G. In addition, the compound included in the layer 135R or the layer 135G can be estimated in some cases.

Although the organic layer 112R and the organic layer 112G are formed separately with the use of an FMM while other organic layers (the organic layer 115 and the organic layer 116) are each formed as a continuous film here, the present invention is not limited thereto. For example, one or both of the organic layer 115 and the organic layer 116 may be formed separately with the use of an FMM. In such a case, a scrap of the organic layer 115 or the organic layer 116 might remain in the vicinity of the slit 120, as in the case of the layer 135R or the like.

Figure 3B:
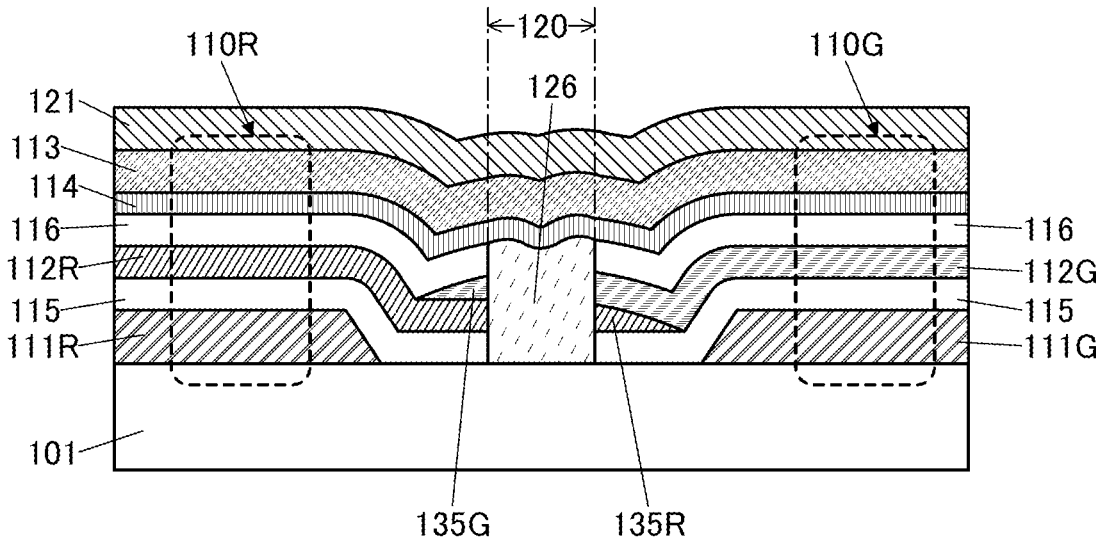

FIG. 3B is a schematic cross-sectional view of the case not including the insulating layer 125. The insulating layer 126 is provided in contact with the side surfaces of the pair of organic layers 115, the side surface of the organic layer

112R, the side surface of the organic layer 112G, the side surface of the layer 135R, the side surface of the layer 135G, and the side surfaces of the pair of organic layers 116.

In this case, part of the EL layer might be dissolved by a solvent used in the formation of a film to be the resin layer 126. For this reason, when the insulating layer 125 is not provided, water or an alcohol such as ethyl alcohol, methyl alcohol, isopropyl alcohol (IPA), or glycerin is preferably used as the solvent for the resin layer 126. Note that without limitation to this, a solvent in which the EL layer is not dissolved or unlikely to be dissolved is used.

Although the light-emitting element 110R, the light-emitting element 110G, and the region between these are described with reference to the enlarged views in FIG. 3A and FIG. 3B, regions between the light-emitting element 110R and the light-emitting element 110B and between the light-emitting element 110G and the light-emitting element 110B have a similar structure.

Structure Example 2

Figure 4A:
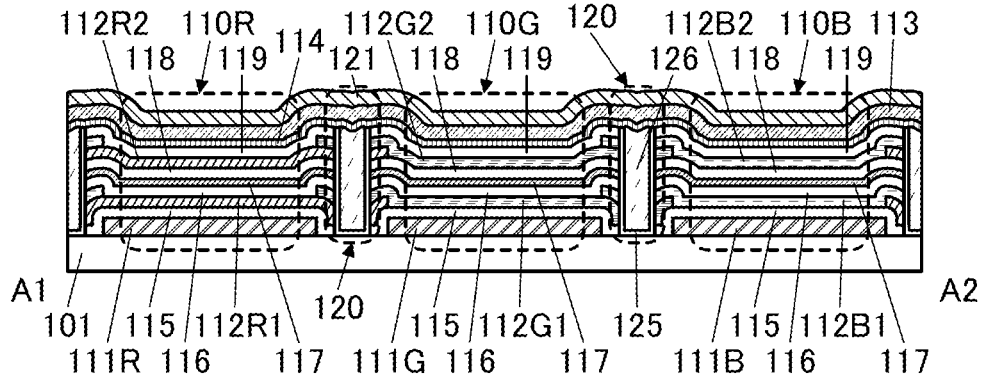
FIG. 4A and FIG. 4B are diagrams illustrating a structure example of a display apparatus.

With the same current flowing, light emission with higher luminance can be obtained in the case of stacked light-emitting layers than in the case of a single light-emitting layer. Furthermore, the current density required to obtain the same luminance can be reduced, which leads to higher reliability. An example of the case in which light-emitting layers are stacked is described below:

FIG. 4A illustrates a schematic cross-sectional view of a display apparatus described below as an example. The display apparatus includes the light-emitting element 110R, the light-emitting element 110G, and the light-emitting element 110B. The light-emitting element 110R, the light-emitting element 110G, and the light-emitting element 110B illustrated in FIG. 4A are light-emitting elements each employing what is called a tandem structure, in which two light-emitting layers are stacked with a charge-generation layer (also referred to as an intermediate layer) provided therebetween.

The light-emitting element 110R has a structure in which the organic layer 115, an organic layer 112R1, the organic layer 116, a charge-generation layer 117, an organic layer 118, an organic layer 112R2, an organic layer 119, the organic layer 114, and the common electrode 113 are stacked over the pixel electrode 111R. Similarly, the light-emitting element 110G includes the pixel electrode 111G, the organic layer 115, an organic layer 112G1, the organic layer 116, the charge-generation layer 117, the organic layer 118, an organic layer 112G2, the organic layer 119, the organic layer 114, and the common electrode 113. In addition, the light-emitting element 110B includes the pixel electrode 111B, the organic layer 115, an organic layer 112B1, the organic layer 116, the charge-generation layer 117, the organic layer 118, an organic layer 112B2, the organic layer 119, the organic layer 114, and the common electrode 113.

The slit 120 is provided between two adjacent light-emitting elements. The slit 120 is formed to divide a stacked-layer structure of the organic layer 115 to the organic layer 119 in a region between two pixel electrodes. Furthermore, in the slit 120, the insulating layer 125 and the resin layer 126 are provided. Note that a structure in which no insulating layer 125 is provided may be employed.

Figure 4B:
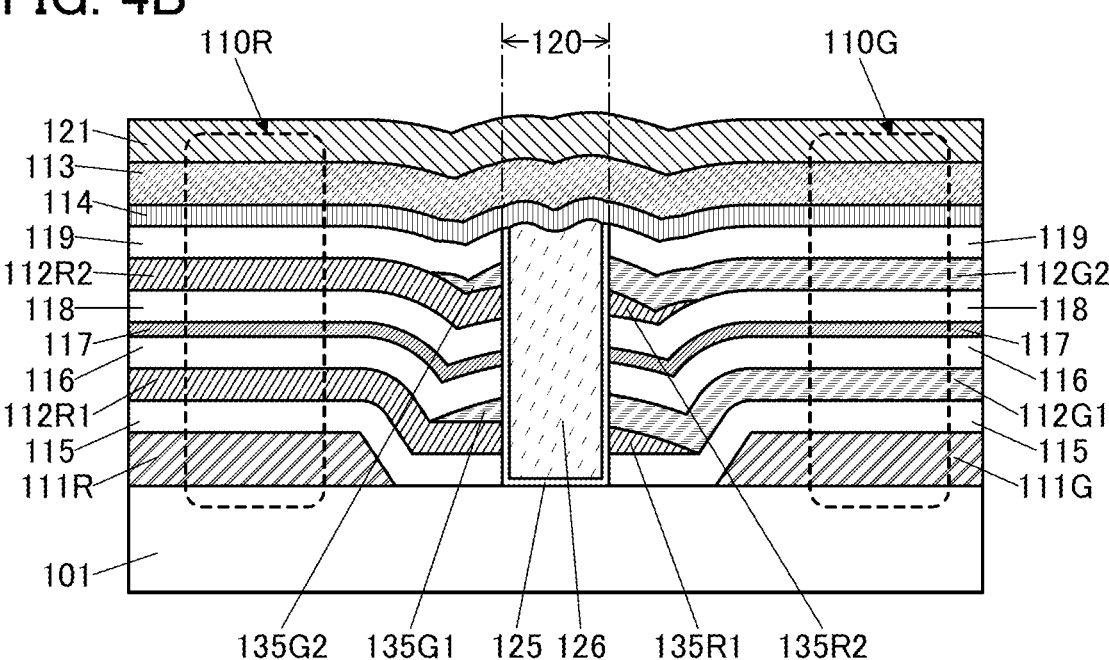

FIG. 4B is a schematic cross-sectional view including part of the light-emitting element 110R, part of the light-emitting element 110G, and the region between them in FIG. 4A.

A layer 135G1 is provided between the organic layer 115 and the organic layer 116 on the light-emitting element 110R side with respect to the slit 120. In addition, a layer 135G2 is provided between the organic layer 118 and the organic layer 119.

A layer 135R1 is provided between the organic layer 115 and the organic layer 116 on the light-emitting element 110G side with respect to the slit 120. In addition, a layer 135R2 is provided between the organic layer 118 and the organic layer 119.

The layer 135R1 and the layer 135R2 can be referred to as scraps remaining on the light-emitting element 110G side after part of films to be the organic layer 112R1 and the organic layer 112R2 is divided by the slit 120. Similarly, the layer 135G1 and the layer 135G2 can be referred to as scraps remaining on the light-emitting element 110R side after part of films to be the organic layer 112G1 and the organic layer 112G2 is divided by the slit 120.

A side surface of the layer 135R1 and a side surface of the organic layer 112R1 are provided to face each other with the resin layer 126 (and the insulating layer 125) provided therebetween. Similarly, the layer 135R2 and the organic layer 112R2, the layer 135G1 and the organic layer 112G1, and the layer 135G2 and the organic layer 112G2 are provided such that their side surfaces face each other with the resin layer 126 (and the insulating layer 125) therebetween.

One or more of the layer 135R1, the layer 135R2, the layer 135G1, and the layer 135G2 are not provided in some cases.

Note that the stacking order of the organic layer 112R1 and the layer 135G1, the stacking order of the organic layer 112R2 and the layer 135G2, the stacking order of the organic layer 112G1 and the layer 135R1, and the stacking order of the organic layer 112G2 and the layer 135R2 are each determined according to the stacking order of the organic layer 112R1 and the organic layer 112G1 or the stacking order of the organic layer 112R2 and the organic layer 112G2, and there is no limitation on the order.

The charge-generation layer 117 is provided between the two light-emitting layers (the organic layer 112R1 and the organic layer 112R2) included in the light-emitting elements. The organic layer 118 is provided between the charge-generation layer 117 and the organic layer 112R2. The organic layer 119 is provided between the organic layer 112R2 and the organic layer 114. The organic layer 118 and the organic layer 119 can each independently include one or more of an electron-injection layer, an electron-transport layer, a hole-injection layer, and a hole-transport layer.

A stacked-layer structure of the organic layer 115 to the organic layer 116 and a stacked-layer structure of the organic layer 118 to the organic layer 114 can each be referred to as one light-emitting unit. The light-emitting element 110 illustrated in FIG. 4A and the like can be referred to as a light-emitting element having a tandem structure in which two light-emitting units are stacked with the charge-generation layer 117 provided therebetween.

Modification Example

Figure 5A:
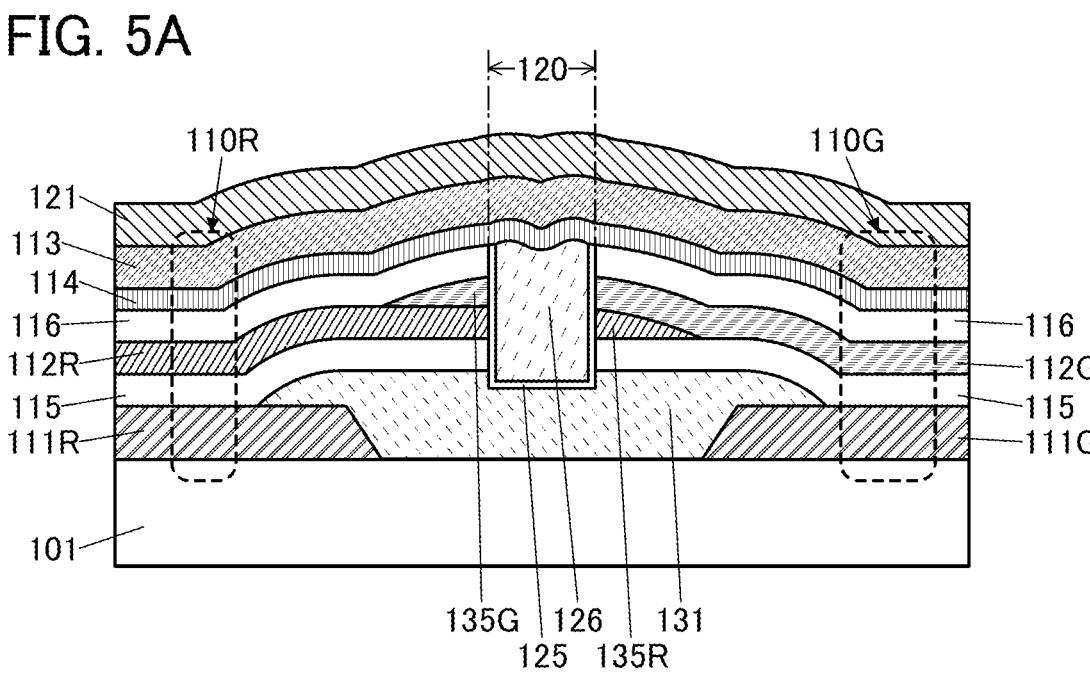
FIG. 5A and FIG. 5B are diagrams illustrating structure examples of a display apparatus.

FIG. 5A illustrates a modification example of FIG. 3A. FIG. 5A illustrates an example of the case in which an insulating layer 131 covering an end portion of the pixel electrode is provided.

The insulating layer 131 has a planarization function for a depressed portion of the formation surface of the organic layer 115. The end portions of the insulating layer 131 are preferably tapered. When an organic resin is used for the insulating layer 131, the surface can have a moderate curve. Thus, coverage with a film formed over the insulating layer 131 can be improved.

Examples of materials that can be used for the insulating layer 131 include an acrylic resin, a polyimide resin, an epoxy resin, a polyamide resin, a polyimide-amide resin, a siloxane resin, a benzocyclobutene-based resin, a phenol resin, and precursors and the like of these resins.

As illustrated in FIG. 5A, the insulating layer 131 may have a depressed portion in a region overlapping with the slit 120. This depressed portion can be formed when an upper portion of the insulating layer 131 is partly etched at the time of etching for forming the slit 120. Part of the insulating layer 125 is formed to be stuck in the depressed portion of the insulating layer 131, thereby enhancing adhesion between them.

The slit 120 is provided in a region overlapping with the insulating layer 131. In addition, the layer 135R and the layer 135G are provided in regions overlapping with the insulating layer 131.

Figure 5B:
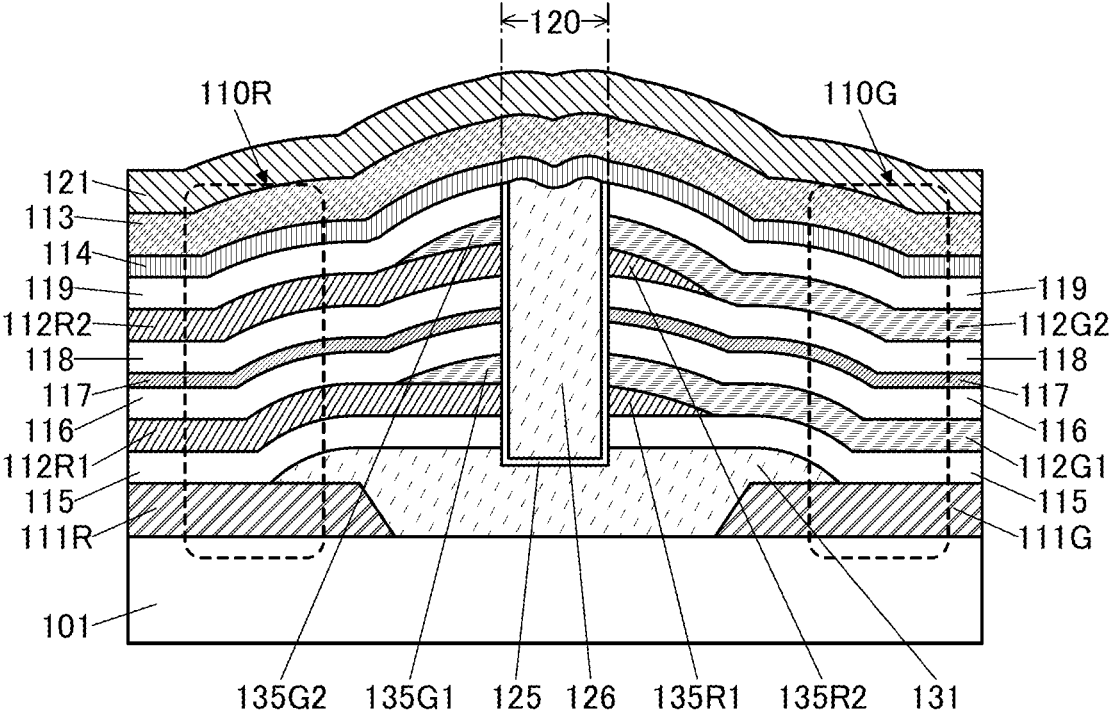

FIG. 5B illustrates an example of the case in which the insulating layer 131 is applied to FIG. 4B described above.

In FIG. 5B, the slit 120, the layer 135R1, the layer 135R2, the layer 135G1, and the layer 135G2 are each provided in a region overlapping with the insulating layer 131.

Figure 6A:
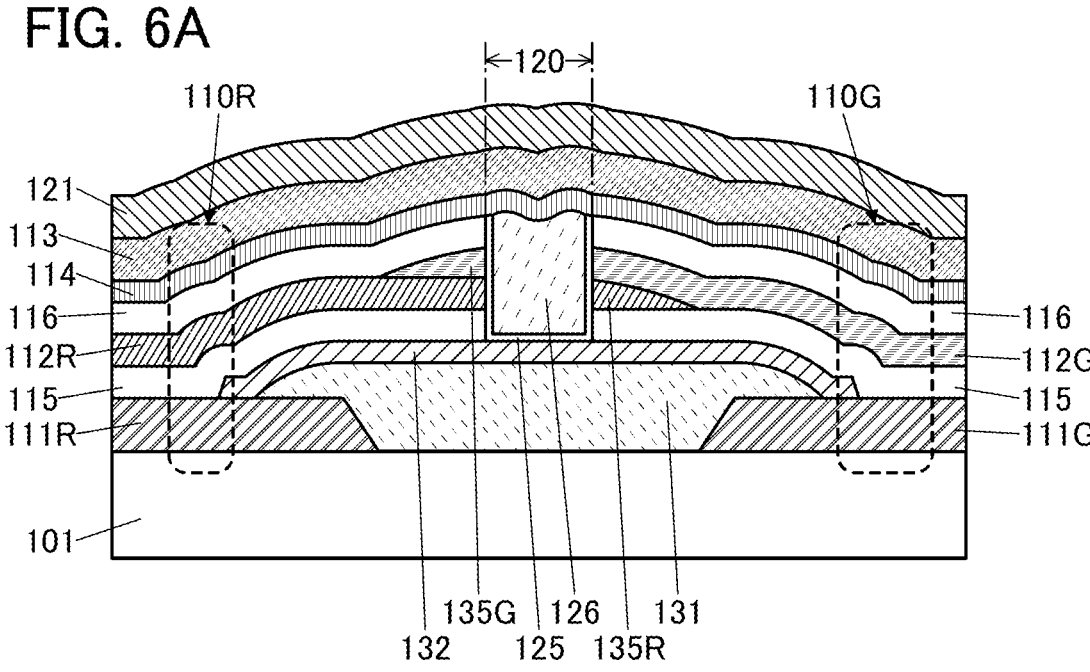
FIG. 6A and FIG. 6B are diagrams illustrating structure examples of a display apparatus.
Figure 6B:
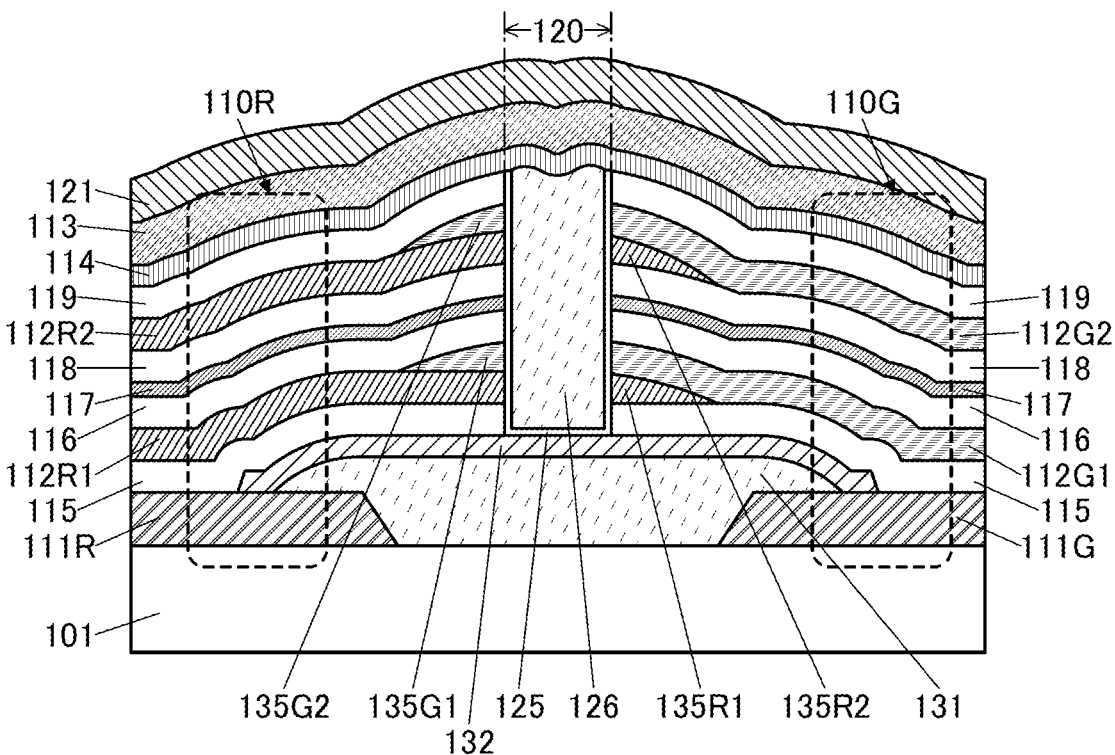

FIG. 6A and FIG. 6B each illustrate an example of the case in which an insulating layer 132 is provided over the insulating layer 131.

The insulating layer 132 overlaps with the end portion of the pixel electrode 111 with the insulating layer 131 provided therebetween. The insulating layer 132 is provided to cover the end portion of the insulating layer 131. Furthermore, the insulating layer 132 has a portion in contact with a top surface of the pixel electrode 111.

The end portions of the insulating layer 132 are preferably tapered. Thus, the step coverage with a film formed over the insulating layer 132, such as an EL layer provided to cover an end portion of the insulating layer 132, can be improved.

It is preferable that the thickness of the insulating layer 132 be smaller than that of the insulating layer 131. When the insulating layer 132 is formed to be thin, the step coverage with a film formed over the insulating film 132 can be improved.

Examples of inorganic insulating materials that can be used for the insulating layer 132 include oxide and nitride such as silicon oxide, silicon oxynitride, silicon nitride oxide, silicon nitride, aluminum oxide, aluminum oxynitride, and hafnium oxide. In addition, yttrium oxide, zirconium oxide, gallium oxide, tantalum oxide, magnesium oxide, lanthanum oxide, cerium oxide, neodymium oxide, or the like may be used.

Films containing the above inorganic materials may be stacked for the insulating layer 132. For example, a stacked-layer structure in which a silicon oxide film or a silicon oxynitride film is stacked over a silicon nitride film, or a stacked-layer structure in which a silicon oxide film or a silicon oxynitride film is stacked over an aluminum oxide film can be employed. The silicon oxide film and the silicon oxynitride film are films especially not easily etched; hence, it is preferable that the films be placed on the upper side. Furthermore, the silicon nitride film and the aluminum oxide film are films through which water, hydrogen, oxygen, and the like are not easily diffused; hence, the films function as barrier films inhibiting the gas released from the insulating layer 131 from diffusing into the light-emitting elements when the films are placed on the insulating layer 131 side.

The slit 120 is provided in a region overlapping with the insulating layer 132. In addition, the layer 135R and the layer 135G are provided in regions overlapping with the insulating layer 132.

Providing the insulating layer 132 can prevent a top surface of the insulating layer 131 from being etched when the slit 120 is formed.

FIG. 6B illustrates an example of the case in which the insulating layer 132 is applied to FIG. 5B described above. In FIG. 6B, the slit 120, the layer 135R1, the layer 135R2, the layer 135G1, and the layer 135G2 are each provided in a region overlapping with the insulating layer 132.

Structure Example 3

More specific structure examples are described below.

Figures 7A, 7B:
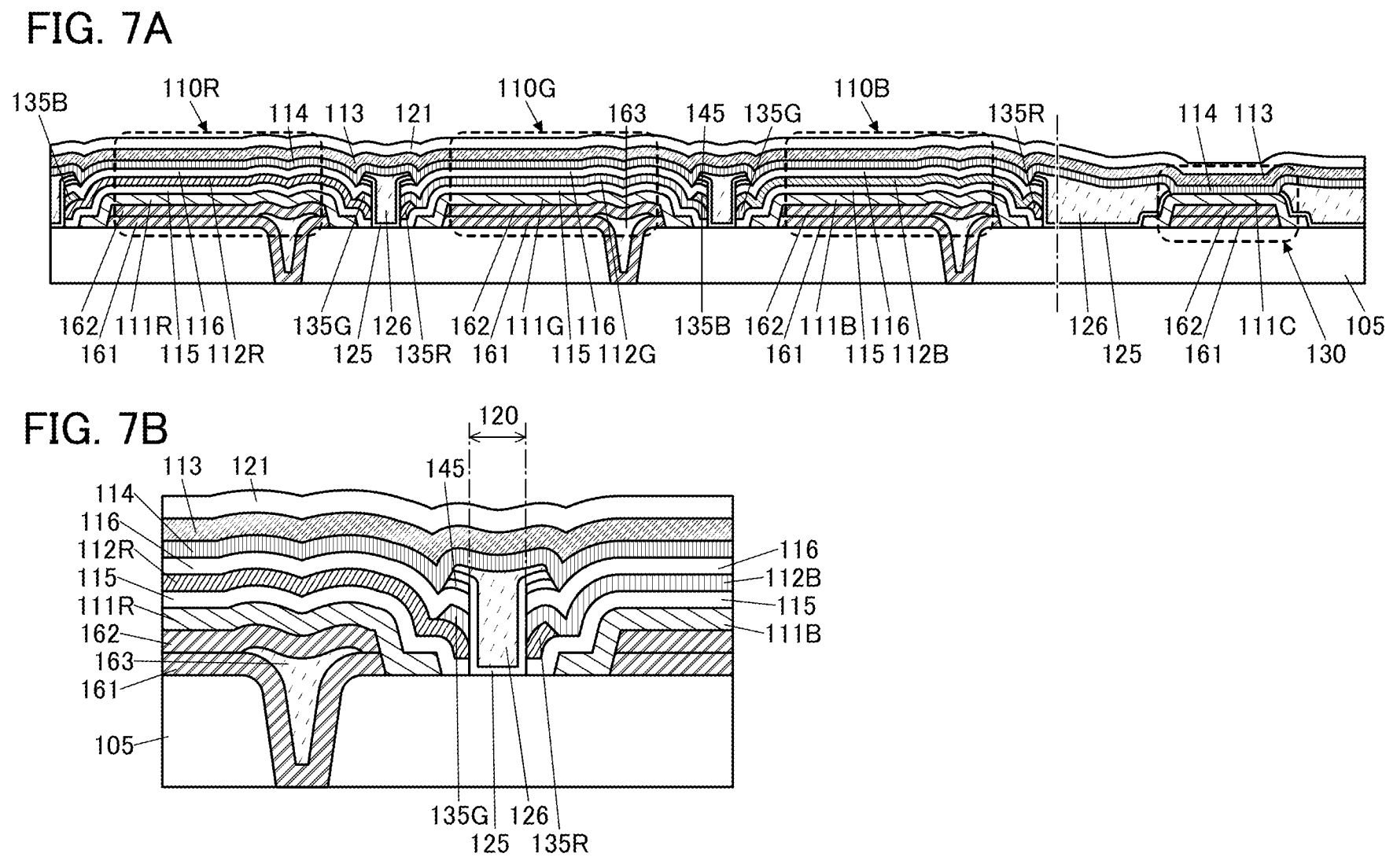

FIG. 7A is a schematic cross-sectional view of a display apparatus described as an example below. FIG. 7A illustrates a cross section of a region including the light-emitting element 110R, the light-emitting element 110G, the light-emitting element 110B, and the connection portion 130. In addition, FIG. 7B is an enlarged schematic cross-sectional view of the slit 120, which is positioned between the light-emitting element 110R and the light-emitting element 110G, and the vicinity thereof.

In the structure illustrated in FIG. 7A, layers 135B which are part (scraps) of the organic layer 112B divided by the slit 120 are provided in the vicinity of the light-emitting element 110R and the vicinity of the light-emitting element 110G.

A conductive layer 161, a conductive layer 162, and a resin layer 163 are provided below the pixel electrode 111.

The conductive layer 161 is provided over the insulating layer 105. The conductive layer 161 has a portion that penetrates the insulating layer 105 in an opening provided in the insulating layer 105. The conductive layer 161 functions as a wiring or an electrode that electrically connects a wiring, a transistor, an electrode, or the like (not illustrated) positioned below the insulating layer 105 to the pixel electrode 111.

In the conductive layer 161, a depressed portion is formed in a portion positioned in the opening of the insulating layer 105. The resin layer 163 is provided to fill the depressed portion and functions as a planarization film. A top surface of the resin layer 163 is preferably as flat as possible and is gently curved in some cases. Although FIG. 7A and the like show an example in which the top surface of the resin layer 163 has a wave shape with a depressed portion and a projected portion, the present invention is not limited thereto. The top surface of the resin layer 163 may be a convex surface, a concave surface, or a flat surface, for example.

The conductive layer 162 is provided over the conductive layer 161 and the resin layer 163. The conductive layer 162 has a function as an electrode that electrically connects the conductive layer 161 to the pixel electrode 111.

Here, when the display element 110 is a top-emission light-emitting element, a film having a property of reflecting visible light is used for the conductive layer 162 and a film having a property of transmitting visible light is used for the pixel electrode 111R, whereby the conductive layer 162 can function as a reflective electrode. Furthermore, the conductive layer 162 and the pixel electrode 111 can be provided also above the opening portion (also referred to as a contact portion) of the insulating layer 105 with the resin layer 163 provided therebetween, whereby a portion overlapping with the contact portion can be a light-emitting region. Accordingly, the aperture ratio can be increased.

FIG. 7A and FIG. 7B illustrate an example in which the shape of the resin layer 126 is different from the above.

As illustrated in FIG. 7B, an upper portion of the resin layer 126 has a shape having a larger width than the slit 120. As described later, the insulating layer 125 is processed with the use of the resin layer 126 as an etching mask, and consequently a portion of the insulating layer 125 that is covered with the upper portion of the resin layer 126 remains. For a similar reason, a sacrificial layer 145 used in the manufacturing process of the display apparatus partly remains. Specifically, the sacrificial layer 145 is provided over the organic layer 116 in the vicinity of the slit 120. Part of the insulating layer 125 is provided to cover a top surface of the sacrificial layer 145. Furthermore, the resin layer 126 is provided to cover the sacrificial layer 145 and the insulating layer 125.

In that case, the end portion of the insulating layer 125 and an end portion of the sacrificial layer 145 are preferably tapered. This can improve the step coverage with the organic layer 114 or the like.

As illustrated in FIG. 7A and FIG. 7B, each of the layer 135R, the layer 135G, and the layer 135B is in contact with the insulating layer 125 and has a region overlapping with the insulating layer 125, the sacrificial layer 145, and the resin layer 126.

[Manufacturing Method Example]

Figures 8A, 8B, 8C:
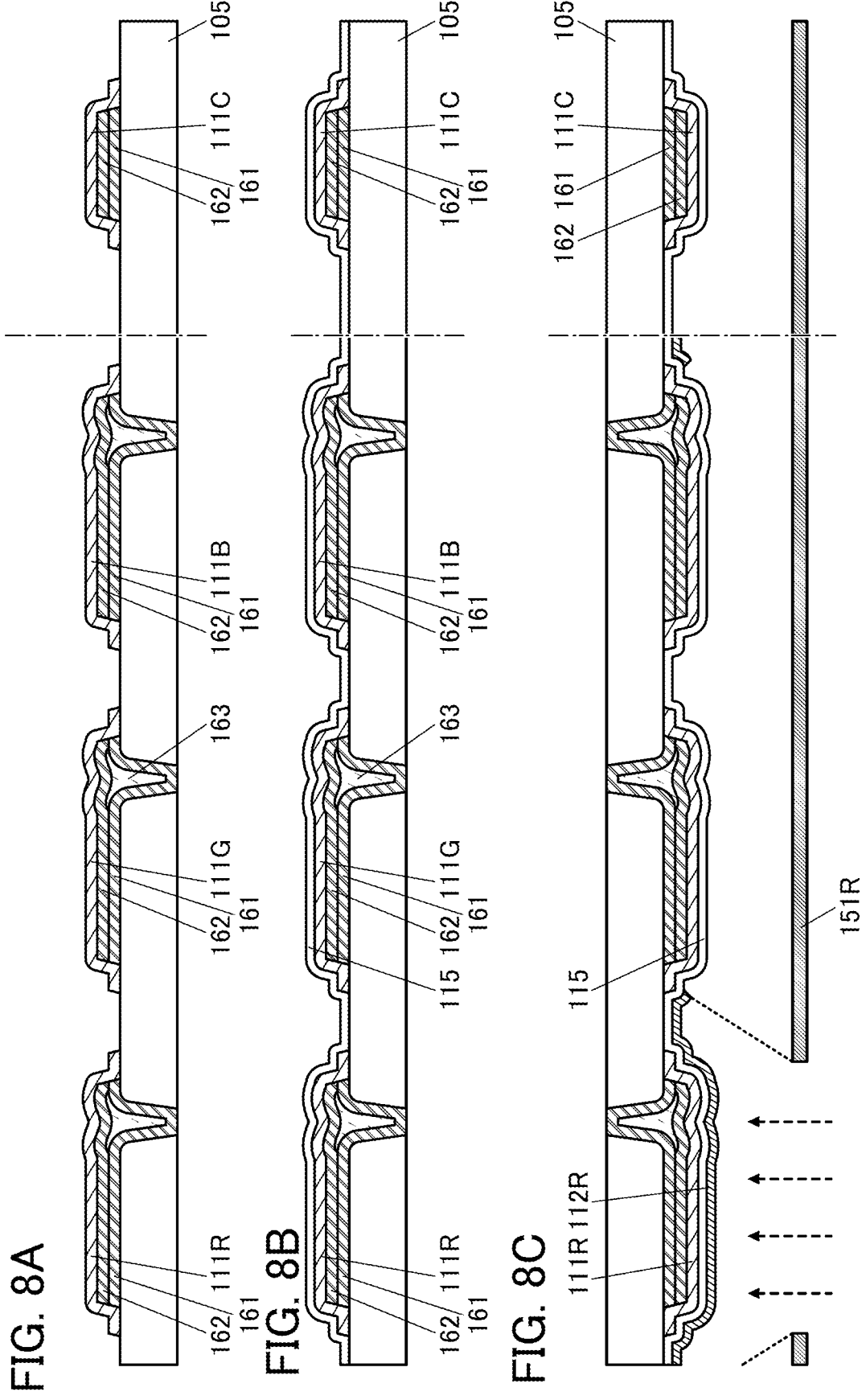
FIG. 8A to FIG. 8C are diagrams illustrating an example of a manufacturing method of a display apparatus.

An example of a manufacturing method of the display apparatus of one embodiment of the present invention will be described below with reference to drawings. Here, description is made using the above-described display apparatus illustrated in FIG. 7A as an example. FIG. 8A to FIG. 11C are schematic cross-sectional views of steps in the example of the manufacturing method of the display apparatus described below as an example. In FIG. 8A and the like, the schematic cross-sectional views of the connection portion 130 and the vicinity thereof are also illustrated on the right side.

Note that thin films included in the display apparatus (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. An example of the thermal CVD method is a metal organic chemical vapor deposition (MOCVD: Metal Organic CVD) method.

Thin films included in the display apparatus (insulating films, semiconductor films, conductive films, or the like) can be formed by a method such as spin coating, dipping, spray coating, ink-jetting, dispensing, screen printing, offset printing, a doctor knife method, a slit coater, a roll coater, a curtain coater, and a knife coater.

When the thin films that form the display apparatus are processed, a photolithography method or the like can be used for the processing. Alternatively, a nanoimprinting method, a sandblasting method, a lift-off method, or the like may be used for the processing of the thin films. Island-shaped thin films may be directly formed by a deposition method using a blocking mask such as a metal mask.

There are the following two typical examples of a photolithography method. In one of the methods, a resist mask is formed over a thin film that is to be processed, the thin film is processed by etching or the like, and the resist mask is removed. In the other method, after a photosensitive thin film is deposited, light exposure and development are performed, so that the thin film is processed into a desired shape.

As the light used for light exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Light exposure may be performed by liquid immersion light exposure technique. As the light used for the light exposure, extreme ultraviolet (EUV) light, X-rays, or the like may be used. Furthermore, instead of the light used for the light exposure, an electron beam can also be used. It is preferable to use extreme ultraviolet light, X-rays, or an electron beam because extremely minute processing can be performed. Note that in the case of performing light exposure by scanning of a beam such as an electron beam, a photomask is not needed.

For etching of the thin film, a dry etching method, a wet etching method, a sandblast method, or the like can be used.

[Preparation for Substrate 101]

For the substrate 101, a substrate having at least heat resistance high enough to withstand the following heat treatment can be used. In the case where an insulating substrate is used for the substrate 101, a glass substrate, a quartz substrate, a sapphire substrate, a ceramic substrate, an organic resin substrate, or the like can be used. Alternatively, a single crystal semiconductor substrate or a polycrystalline semiconductor substrate using silicon or silicon carbide as a material, a compound semiconductor substrate of silicon germanium or the like, or a semiconductor substrate such as an SOI substrate can be used.

For the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

The uppermost portion of the substrate 101 is provided with insulating layer 105. The insulating layer 105 is provided with a plurality of openings that reach the transistor, wiring, electrode, or the like provided for the substrate 101. The openings can be formed by a photolithography method.

For the insulating layer 105, an inorganic insulating material, an organic insulating material, or the like can be used.

[Formation of Conductive Layer 161, Resin Layer 163, Conductive Layer 162, and Pixel Electrode 111]

A conductive film to be the conductive layer 161 is deposited over the insulating layer 105. At this time, a depressed portion derived from the opening in the insulating layer 105 is formed in the conductive film.

Then, the resin layer 163 is formed in the depressed portion of the conductive film.

A photosensitive resin is preferably used for the resin layer 163. In this case, after a resin film is first deposited, the resin film is exposed to light through a photomask and then subjected to development treatment, whereby the resin layer 163 can be formed. After that, an upper portion of the resin layer 163 may be etched by ashing or the like in order that the top surface level of the resin layer 163 be adjusted.

In the case where a non-photosensitive resin is used for the resin layer 163, after a resin film is deposited, to optimize the thickness, an upper portion of the resin film is etched by ashing or the like until a surface of the conductive film to be the conductive layer 161 is exposed; thus, the resin layer 163 can be formed.

Then, a conductive film to be the conductive layer 162 is deposited over the conductive film to be the conductive layer 161 and the resin layer 163. After that, a resist mask is formed over the two-layer conductive films by a photolithography method, and unnecessary portions of the conductive films are removed by etching. After that, the resist mask is removed; thus, the conductive layer 161 and the conductive layer 162 can be formed in the same step.

Although the conductive layer 161 and the conductive layer 162 are formed with the use of the same photomask in the same step, the conductive layer 161 and the conductive layer 162 may be separately formed with the use of different photomasks in the same step.

Then, a conductive film is formed to cover the conductive layer 161 and the conductive layer 162 and part of the conductive film is removed by etching, whereby the pixel electrode 111 and the connection electrode 111C are formed (FIG. 8A). At this time, as illustrated in FIG. 8A, the pixel electrode 111 and the connection electrode 111C are preferably formed to entirely cover the conductive layer 161 and the conductive layer 162, in which case the conductive layer 161 and the conductive layer 162 are not exposed to an etching atmosphere during the formation of the pixel electrode 111 and the like.

[Formation of Organic Layer 115]

Then, the organic layer 115 is deposited over the pixel electrode 111 (FIG. 8B). The organic layer 115 is preferably deposited without using an FMM.

The organic layer 115 may be formed separately with the use of an FMM. In such a case, the later description of the organic layer 112R or the like can be referred to.

The organic layer 115 can be preferably formed by a vacuum evaporation method. Without limitation to this, a sputtering method, an inkjet method, or the like can be used for the formation. Without limitation to this, the above-described deposition method can be used as appropriate.

[Formation of Organic Layer 112R, Organic Layer 112G, and Organic Layer 112B]

Then, the island-shaped organic layer 112R is formed to entirely cover a region that is on the organic layer 115 and overlaps with the pixel electrode 111R.

The organic layer 112R is preferably formed by a method of vacuum evaporation through an FMM. Note that a sputtering method using an FMM or an inkjet method may be used to form the island-shaped organic layer 112R.

FIG. 8C illustrates a state in which the organic layer 112R is deposited through an FMM 151R. FIG. 8C illustrates a state of deposition by a so-called face-down method, in which deposition is performed with the substrate turned upside down so that the film formation surface faces downward.

In an evaporation method or the like using a FMM, an area wider than an opening pattern of the FMM is subjected to evaporation in many cases. For this reason, the organic layer 112R can be deposited also to a region between the pixel electrode 111R and an adjacent pixel electrode, as indicated by a broken line in FIG. 8C, even in the case where the FMM 151R having the same opening pattern as the pattern of the pixel electrode 111R is used.

Figures 9A, 9B, 9C:
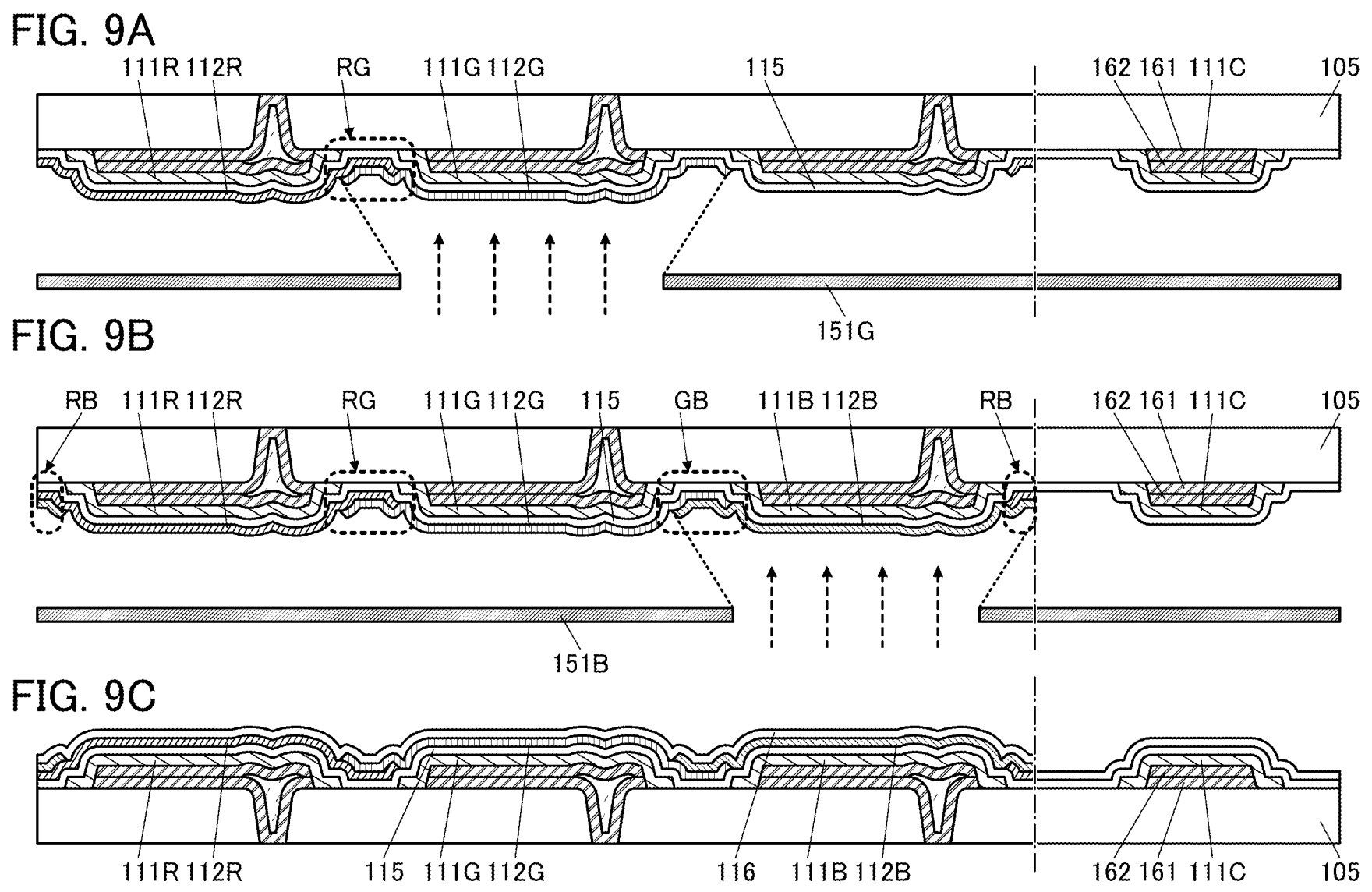

Then, with the use of an FMM 151G, the organic layer 112G is formed on the pixel electrode 111G (FIG. 9A).

For the organic layer 112G, a pattern extending beyond the pixel electrode 111G can be formed as in the case of the organic layer 112R. As a result, a portion in which the organic layer 112G is stacked on the organic layer 112R can be formed, as indicated by a region RG in FIG. 9A.

Then, with the use of an FMM 151B, the organic layer 112B is formed on the pixel electrode 111B (FIG. 9B).

For the organic layer 112B as well, a pattern extending beyond the pixel electrode 111B can be formed as in the cases of the organic layer 112R and the organic layer 112G. As a result, a region RB in which the organic layer 112B is stacked on the organic layer 112R and a region GB in which the organic layer 112B is stacked on the organic layer 112G can be formed, as illustrated in FIG. 9B.

Preferably, the connection electrode 111C is not provided with the organic layer 112R, the organic layer 112G, and the organic layer 112B.

Although the organic layer 112R, the organic layer 112G, and the organic layer 112B are formed in this order here, the formation order is not limited thereto.

[Formation of Organic Layer 116]

Then, the organic layer 116 is formed to cover the organic layer 112R, the organic layer 112G, and the organic layer 112B (FIG. 9C). The organic layer 116 can be formed in a manner similar to that of the organic layer 115.

[Formation of Sacrificial Film 144]

Next, a sacrificial film 144 is formed to cover the organic layer 116.

As the sacrificial film 144, it is possible to use a film highly resistant to etching treatment performed on the organic layer 115, the organic layer 112, and the organic layer 116, i.e., a film having a high etching selectivity with respect to the films. Furthermore, for the sacrificial film 144, it is possible to use a film having high etching selectivity with respect to a sacrificial film such as a sacrificial film 146 described later. Moreover, for the sacrificial film 144, it is particularly preferable to use a film that can be removed by a wet etching method less likely to cause damage to the organic layer 115, the organic layer 112, and the organic layer 116.

As the sacrificial film 144, an inorganic film such as a metal film, an alloy film, a metal oxide film, a semiconductor film, or an inorganic insulating film can be suitably used, for example. The sacrificial film 144 can be formed by any of a variety of deposition methods such as a sputtering method, an evaporation method, a CVD method, and an ALD method.

Specifically, the sacrificial film 144, which is directly formed on the organic layer 116, is preferably formed by an ALD method that gives less deposition damage to a formation layer.

For the sacrificial film 144, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used, for example. It is particularly preferable to use a low-melting-point material such as aluminum or silver.

Alternatively, for the sacrificial film 144, a metal oxide such as an indium gallium zinc oxide (an In—Ga—Zn oxide, also referred to as IGZO) can be used. It is also possible to use indium oxide, an indium zinc oxide (an In—Zn oxide), an indium tin oxide (an In—Sn oxide), an indium titanium oxide (an In—Ti oxide), an indium tin zinc oxide (an In—Sn—Zn oxide), an indium titanium zinc oxide (an In—Ti—Zn oxide), an indium gallium tin zinc oxide (an In—Ga—Sn—Zn oxide), or the like. Alternatively, an indium tin oxide containing silicon can also be used.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) can be employed instead of gallium. In particular, M is preferably one or more selected from gallium, aluminum, and yttrium.

For the sacrificial film 144, oxide such as aluminum oxide, hafnium oxide, or silicon oxide, nitride such as silicon nitride or aluminum nitride, or oxynitride such as silicon oxynitride can be used. Such an inorganic insulating material can be formed by a deposition method such as a sputtering method, a CVD method, or an ALD method.

For the sacrificial film 144, a material that can be dissolved in a solvent chemically stable with respect to at least the organic layer 116 positioned in the uppermost portion of the EL layer may be used. Specifically, a material that can be dissolved in water or alcohol can be suitably used for the sacrificial film 144. In deposition of the sacrificial film 144, it is preferable that application of such a material dissolved in a solvent such as water or alcohol be performed by a wet deposition process and then heat treatment for evaporating the solvent be performed. At this time, the heat treatment is preferably performed in a reduced-pressure atmosphere, in which case the solvent can be removed at a low temperature in a short time and thermal damage to the EL layer can be reduced accordingly.

Examples of the wet film formation method that can be used for forming the sacrificial film 144 include spin coating, dipping, spray coating, ink-jetting, dispensing, screen printing, offset printing, a doctor knife method, slit coating, roll coating, curtain coating, knife coating, and the like.

For the sacrificial film 144, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

[Formation of Sacrificial Film 146]

Next, the sacrificial film 146 is formed over the sacrificial film 144.

The sacrificial film 146 is a film used for a hard mask when the sacrificial film 144 is etched later. In a later step of processing the sacrificial film 146, the sacrificial film 144 is exposed. Thus, the combination of films having high etching selectivity therebetween is selected for the sacrificial film 144 and the sacrificial film 146. It is thus possible to select a film that can be used for the sacrificial film 146 depending on an etching condition of the sacrificial film 144 and an etching condition of the sacrificial film 146.

Without being limited to the above, a material of the sacrificial film 146 can be selected from a variety of materials depending on an etching condition of the sacrificial film 144 and an etching condition of the sacrificial film 146. For example, any of the films that can be used for the sacrificial film 144 can be used.

For example, for the sacrificial film 146, an oxide film can be used. Typically, film of oxide or oxynitride such as silicon oxide, silicon oxynitride, aluminum oxide, aluminum oxynitride, hafnium oxide, or hafnium oxynitride can also be used.

For the sacrificial film 146, a nitride film can be used, for example. Specifically, it is also possible to use a nitride such as silicon nitride, aluminum nitride, hafnium nitride, titanium nitride, tantalum nitride, tungsten nitride, gallium nitride, or germanium nitride.

For example, it is preferable that an inorganic insulating material such as aluminum oxide, hafnium oxide, or silicon oxide formed by an ALD method be used for the sacrificial film 144, and a metal oxide containing indium such as an indium gallium zinc oxide (an In—Ga—Zn oxide, also referred to as IGZO) formed by a sputtering method be used for the sacrificial film 146. Alternatively, for the sacrificial film 146, a metal such as tungsten, molybdenum, copper, aluminum, titanium, or tantalum or an alloy containing the metal is preferably used.

As the sacrificial film 146, an organic film that can be used as the organic layer 115, the organic layer 112, the organic layer 116, or the like may be used. For example, the film that is the same as the organic film used for the organic layer 115, the organic layer 112, or the organic layer 116 can be used as the sacrificial film 146. The use of such an organic film is preferable, in which case the deposition apparatus for the organic layer 115, the organic layer 112, the organic layer 116, and the like can be used in common. Furthermore, the sacrificial film can be removed at the same time in later etching of the organic layer 115, the organic layer 112, the organic layer 116, and the like with the use of a sacrificial layer 147 as a mask; thus, the process can be simplified.

[Formation of Resist Mask 143]

Figures 10A, 10B, 10C:
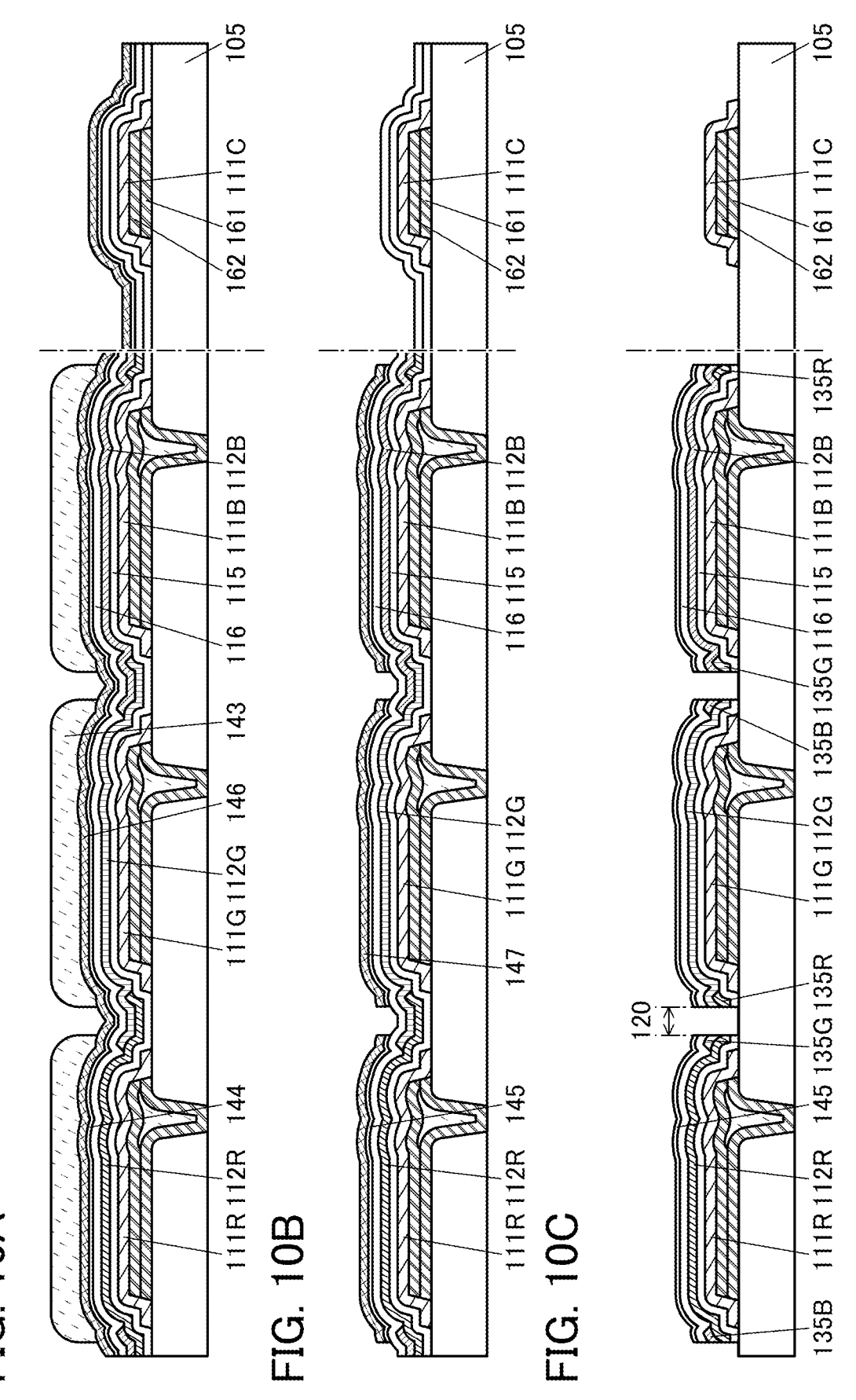
FIG. 10A to FIG. 10C are diagrams illustrating an example of a manufacturing method of a display apparatus.

Then, over the sacrificial film 146, a resist mask 143 is formed in positions overlapping with the pixel electrode 111R, the pixel electrode 111G, and the pixel electrode 111B (FIG. 10A).

For the resist mask 143, a resist material containing a photosensitive resin, such as a positive type resist material or a negative type resist material can be used.

Here, in the case where the sacrificial film 146 is not provided and the resist mask 143 is formed over the sacrificial film 144, if a defect such as a pinhole exists in the sacrificial film 144, there is a risk of dissolving the organic layer 115, the organic layer 112, the organic layer 116, and the like due to a solvent of the resist material. Such a defect can be prevented by using the sacrificial film 146.

In the case where a material that does not dissolve the organic layer 115, the organic layer 112, and the organic layer 116 is used as the solvent of the resist material, for example, the resist mask 143 may be formed directly on the sacrificial film 144 without using the sacrificial film 146 in some cases.

[Etching of Sacrificial Film 146]

Next, part of the sacrificial film 146 that is not covered with the resist mask 143 is removed by etching, so that a sacrificial layer 147 is formed.

In the etching of the sacrificial film 146, an etching condition with high selectively is preferably employed so that the sacrificial film 144 is not removed by the etching. Either wet etching or dry etching can be performed for the etching of the sacrificial film 146; with use of dry etching, a reduction in a pattern of the sacrificial layer 147 can be inhibited.

[Removal of Resist Mask 143]

Next, the resist mask 143 is removed.

The resist mask 143 can be removed by wet etching or dry etching. It is particularly preferable to perform dry etching (also referred to as plasma ashing) using an oxygen gas as an etching gas to remove the resist mask 143.

At this time, the removal of the resist mask 143 is performed in a state where the organic layer 116 is covered with the sacrificial film 144; thus, the organic layer 115, the organic layer 112, and the organic layer 116 are less likely to be affected by the removal. This is suitable particularly for etching using an oxygen gas, such as plasma ashing, because exposure of the organic layer 115, the organic layer 112, and the organic layer 116 to oxygen might adversely affect the electrical characteristics. Furthermore, even in the case where the resist mask 143 is removed by wet etching, contact of the organic layer 116 and the like with a chemical solution can be avoided to prevent dissolution of the organic layer 116 and the like.

[Etching of Sacrificial Film 144]

Next, part of the sacrificial film 144 is removed by etching with use of the sacrificial layer 147 as a mask, so that a sacrificial layer 145 is formed (FIG. 10B).

Either wet etching or dry etching can be performed for the etching of the sacrificial film 144; the use of dry etching is preferable, in which case a reduction in a pattern can be inhibited.

[Etching of Organic Layer 116, Organic Layer 112, and Organic Layer 115]

Then, part of the organic layer 116, the organic layer 112, and the organic layer 115 that is not covered with the sacrificial layer 145 is removed by etching, whereby the slit 120 is formed. At the same time, the top surface of the connection electrode 111C is also exposed.

At this time, the organic layer 112R, the organic layer 112G, and the organic layer 112B are partly divided by etching, thereby forming the layer 135R which is a scrap of the organic layer 112R, the layer 135G which is a scrap of the organic layer 112G, and the layer 135B which is a scrap of the organic layer 112B.

Specifically, for the etching of the organic layer 116, the organic layer 112, and the organic layer 115, it is preferable to perform dry etching using an etching gas that does not contain oxygen as its main component. This can inhibit the alteration of the organic layer 116, the organic layer 112, and the organic layer 115 to achieve a highly reliable display apparatus. Examples of the etching gas that does not contain oxygen as its main component include $CF_4$, $C_4F_8$, $SF_6$, $CHF_3$, $Cl_2$, $H_2O$, $BCl_3$, $H_2$, and a noble gas (such as He). A mixed gas of the above gas and a dilute gas that does not contain oxygen can be used for the etching gas.

Note that etching of the organic layer 116, the organic layer 112, and the organic layer 115 is not limited to the above and may be performed by dry etching using another gas or wet etching.

In addition, when dry etching using an oxygen gas or an etching gas containing an oxygen gas is used for the etching of the organic layer 116, the organic layer 112, and the organic layer 115, the etching rate can be increased. Thus, etching under a low-power condition can be performed while the etching rate is kept adequately high: hence, damage due to the etching can be reduced. Furthermore, a defect such as attachment of a reaction product generated at the etching can be inhibited. For example, an etching gas obtained by adding an oxygen gas to the etching gas not containing oxygen as its main component can be used.

The insulating layer 105 is exposed when the organic layer 116, the organic layer 112, and the organic layer 115 are etched. Thus, for the insulating layer 105, it is preferable to use a film highly resistant to etching of the organic layer 115. Note that at the time of etching of the organic layer 115, an upper portion of the insulating layer 105 is etched and a portion not covered by the organic layer 115 is thinned in some cases.

Note that at the time of etching of the organic layer 116, the organic layer 112, and the organic layer 115, the sacrificial layer 147 may also be etched. The organic layer 116, the organic layer 112, the organic layer 115, and the sacrificial layer 147 are preferably etched by the same treatment because the process can be simplified to reduce the manufacturing cost of the display apparatus.

[Removal of Sacrificial Layer]

Then, the sacrificial layer 147 is removed to expose the top surface of the sacrificial layer 145 (FIG. 10C). At this time, the sacrificial layer 145 preferably remains. Note that the sacrificial layer 147 is not necessarily removed at this timing.

[Formation of Insulating Film 125f]

Then, an insulating film 125f is deposited to cover the sacrificial layer 145 and the slit 120.

The insulating film 125f functions as a barrier layer that prevents diffusion of impurities such as water into the EL layer. The insulating film 125f is preferably formed by an ALD method that enables good step coverage, in which case a side surface of the EL layer can be covered suitably.

Films of the same material are preferably used for the insulating film 125f and the sacrificial layer 145, in which case they can be etched at the same time in a later step. For example, an inorganic insulating material such as aluminum oxide, hafnium oxide, or silicon oxide formed by an ALD method is preferably used for the insulating film 125f and the sacrificial layer 145.

The material that can be used for the insulating film 125f is not limited to the above, and a material that can be used for the sacrificial film 144 described above can be used as appropriate.

[Formation of Resin Layer 126]

Figures 11A, 11B, 11C:
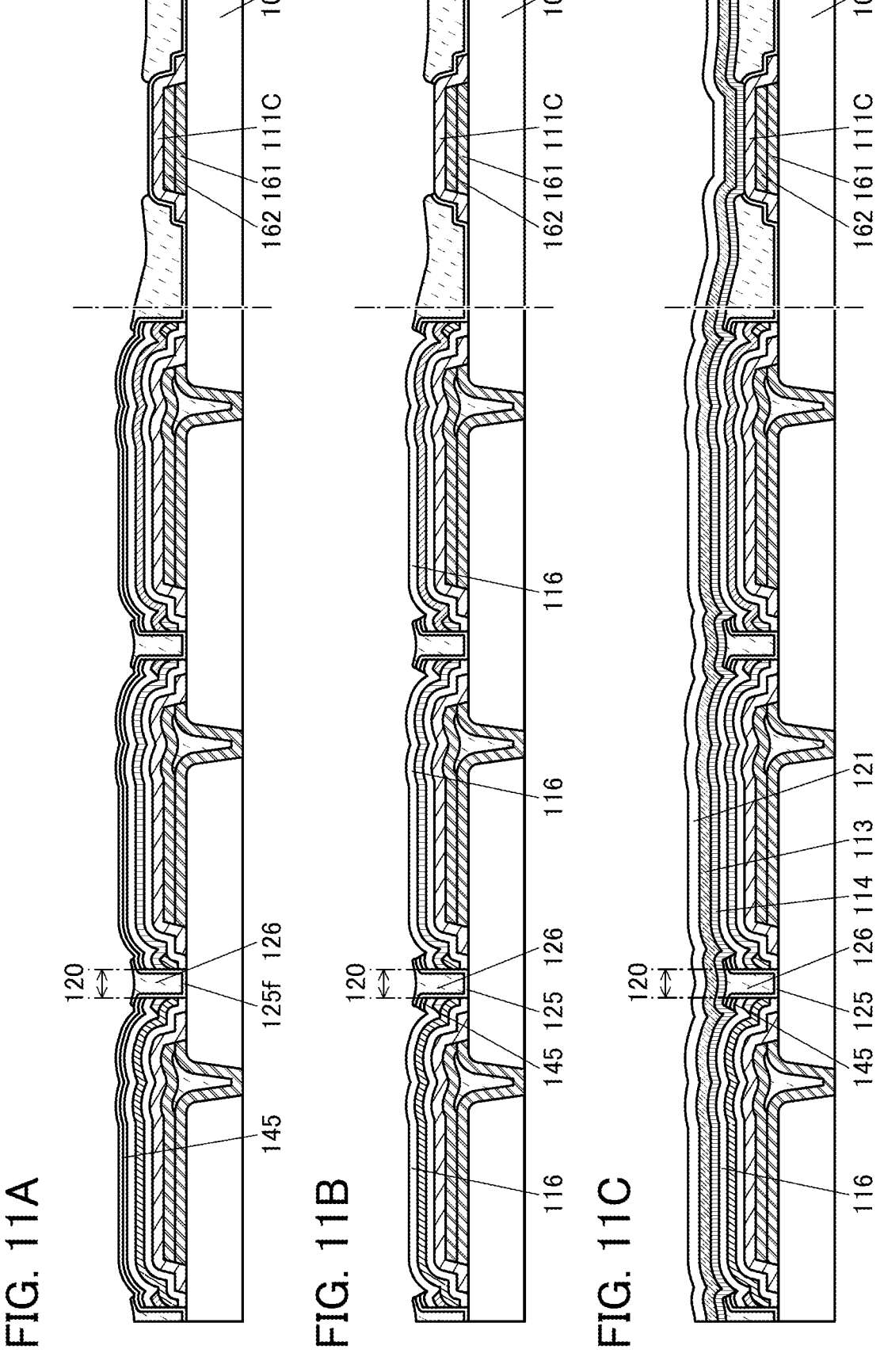
FIG. 11A to FIG. 11C are diagrams illustrating an example of a manufacturing method of a display apparatus.

Then, the resin layer 126 is formed in the region overlapping with the slit 120 (FIG. 11A). The resin layer 126 can be formed by a method similar to that of the resin layer 163.

Here, an example of the case in which the resin layer 126 is formed to have a larger width than the width of the slit 120.

[Etching of Insulating Film 125f and Sacrificial Layer 145]

Then, portions of the insulating film 125f and the sacrificial layer 145 that are not covered with the resin layer 126 are removed by etching to expose the top surface of the organic layer 116. At the same time, the insulating layer 125 and the sacrificial layer 145 are formed in a region covered with the resin layer 126 (FIG. 11B).

The insulating film 125f and the sacrificial layer 145 are preferably etched in the same step. In particular, the sacrificial layer 145 is preferably etched by wet etching, which causes less damage to the organic layer 116. For example, wet etching using a tetramethyl ammonium hydroxide (TMAH) aqueous solution, diluted hydrofluoric acid, oxalic acid, phosphoric acid, acetic acid, nitric acid, or a mixed solution thereof is preferably employed.

Alternatively, one or both of the insulating film 125f and the sacrificial layer 145 are preferably removed by being dissolved in a solvent such as water or alcohol. For the alcohol in which the insulating film 125f and the sacrificial layer 145 can be dissolved, any of various alcohols such as ethyl alcohol, methyl alcohol, isopropyl alcohol (IPA), and glycerin can be used.

After the insulating film 125f and the sacrificial layer 145 are removed, drying treatment is preferably performed to remove water contained in the organic layer 115, the organic layer 112, and the organic layer 116 and water adsorbed on the surfaces thereof. For example, heat treatment is preferably performed in an inert gas atmosphere or a reduced-pressure atmosphere. The heat treatment can be performed at a substrate temperature of higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

[Formation of Organic Layer 114]

Next, the organic layer 114 is formed to cover the organic layer 116, the insulating layer 125, the sacrificial layer 145, the resin layer 126, and the like.

The organic layer 114 can be deposited in a manner similar to that for the organic layer 115 and the like. In the case where the organic layer 114 is deposited by an evaporation method, the organic layer 114 is preferably deposited using a shielding mask so as not to be deposited over the connection electrode 111C.

[Formation of Common Electrode 113]

Next, the common electrode 113 is formed to cover the organic layer 114.

The common electrode 113 can be formed by a deposition method such as an evaporation method or a sputtering method. Alternatively, a film formed by an evaporation method and a film formed by a sputtering method may be stacked.

The common electrode 113 is preferably formed to entirely cover a region where the organic layer 114 is formed. That is, a structure in which end portions of the organic layer 114 overlap with the common electrode 113 can be obtained. The common electrode 113 may be formed using a shielding mask.

In the connection portion 130, the organic layer 114 is interposed between the connection electrode 111C and the common electrode 113. In this case, for the organic layer 114, a material with as low electric resistance as possible is preferably used. Alternatively, it is preferable to form the organic layer 114 as thin as possible, in which case the electric resistance of the organic layer 114 in the thickness direction can be reduced. For example, the organic layer 114 can be formed using a material having an electron-injection property or a hole-injection property having a thickness greater than or equal to 1 nm and less than or equal to 5 nm, preferably greater than or equal to 1 nm and less than or equal to 3 nm, whereby the electric resistance between the connection electrode 111C and the common electrode 113 can be made negligible in some cases.

[Formation of Protective Layer]

Next, the protective layer 121 is formed over the common electrode 113 (FIG. 11C). An inorganic insulating film used for the protective layer 121 is preferably deposited by a sputtering method, a PECVD method, or an ALD method. Specifically, an ALD method is preferable because it provides excellent step coverage and is less likely to cause a defect such as a pinhole. An organic insulating film is preferably deposited by an inkjet method because a uniform film can be formed in a desired area.

Through the above-described steps, the display apparatus illustrated in FIG. 7A can be manufactured.

Although the example of the case in which the resin layer 126 is formed to have a larger width than the slit 120 is described above, the resin layer 126 may be formed to have a width equal to the width of the slit 120.

Figures 12A, 12B, 12C:
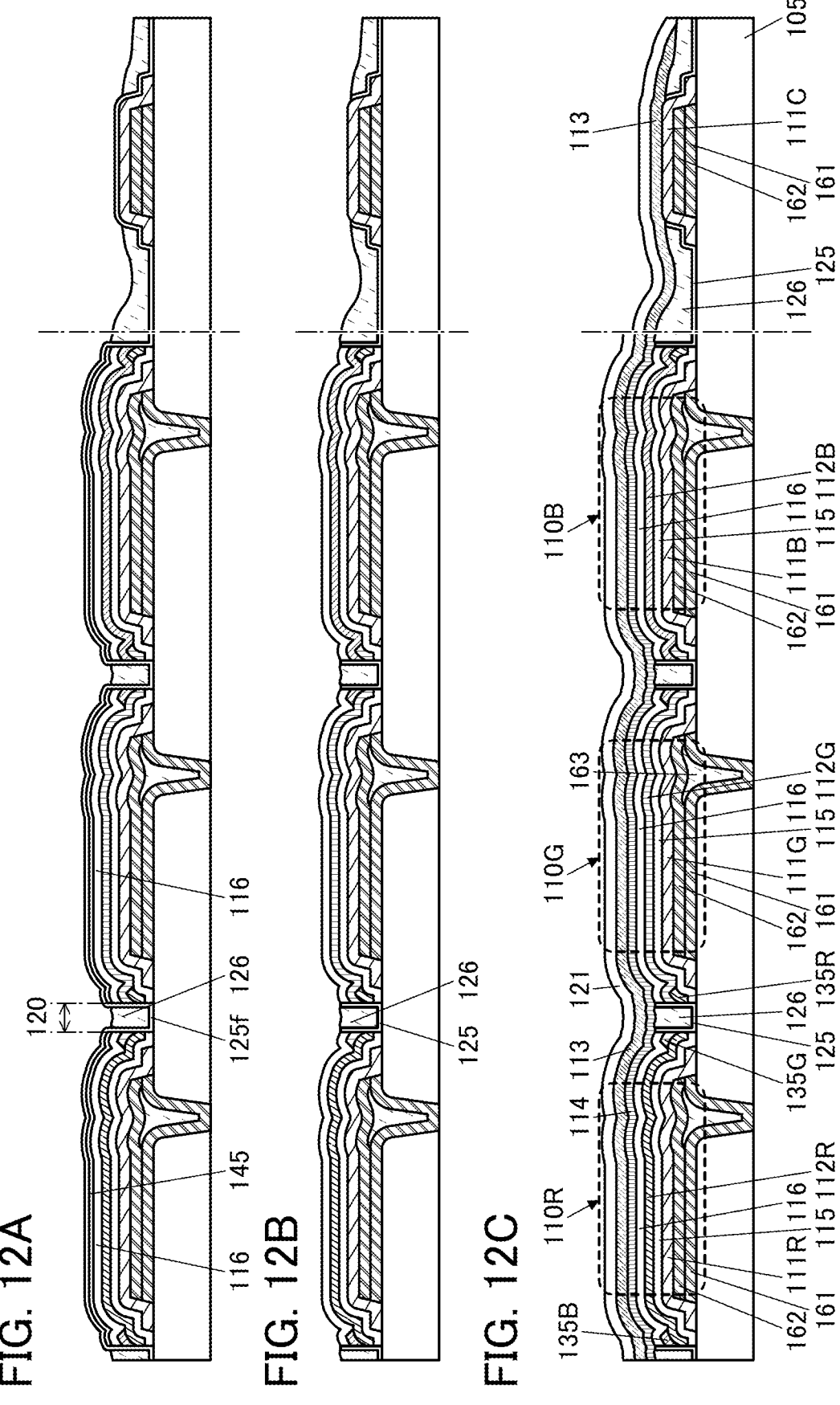
FIG. 12A to FIG. 12C are diagrams illustrating an example of a manufacturing method of a display apparatus.

FIG. 12A is a schematic cross-sectional view at the time when the resin layer 126 is formed after the insulating film 125f is formed.

For example, after the resin layer 126 having a larger width than the slit 120 is formed, the upper portion of the resin layer 126 is etched by ashing or the like, whereby the resin layer 126 can be formed only in the slit 120 as illustrated in FIG. 12A. At this time, the top surface level of the resin layer 126 is preferably as close as possible as that of the adjacent organic layer 116. Thus, the step difference due to the slit 120 can be reduced, so that the step coverage with the organic layer 114 and the like can be improved.

Then, the insulating film 125*f* and the sacrificial layer 145 are etched as described above (FIG. 12B). At this time, no portion of the sacrificial layer 145 is covered with the resin layer 126, so that the sacrificial layer 145 is removed without leaving a scrap.

Then, the organic layer 114, the common electrode 113, and the protective layer 121 are formed by a method similar to the above, whereby the display apparatus illustrated in FIG. 12C can be manufactured.

FIG. 12C illustrates the example of the case in which the organic layer 114 is not provided between the connection electrode 111C and the common electrode 113. Due to the contact between the connection electrode 111C and the common electrode 113, the contact resistance of them can be extremely low and power consumption can be reduced.

The above is the description of the example of the manufacturing method of the display apparatus.

At least part of this embodiment can be implemented in combination with the other embodiments described in this specification as appropriate.

Embodiment 2

In this embodiment, structure examples of a display apparatus of one embodiment of the present invention are described.

The display apparatus of this embodiment can be a high-definition display apparatus or a large-sized display apparatus. Accordingly, the display apparatus of this embodiment can be used for display portions of electronic devices such as a digital camera, a digital video camera, a digital photo frame, a mobile phone, a portable game console, a smart phone, a wristwatch terminal, a tablet terminal, a portable information terminal, and an audio reproducing device, in addition to display portions of electronic devices with a relatively large screen, such as a television device, a desktop or notebook personal computer, a monitor of a computer or the like, digital signage, and a large game machine such as a pachinko machine.

[Display Apparatus 400]

Figure 13:
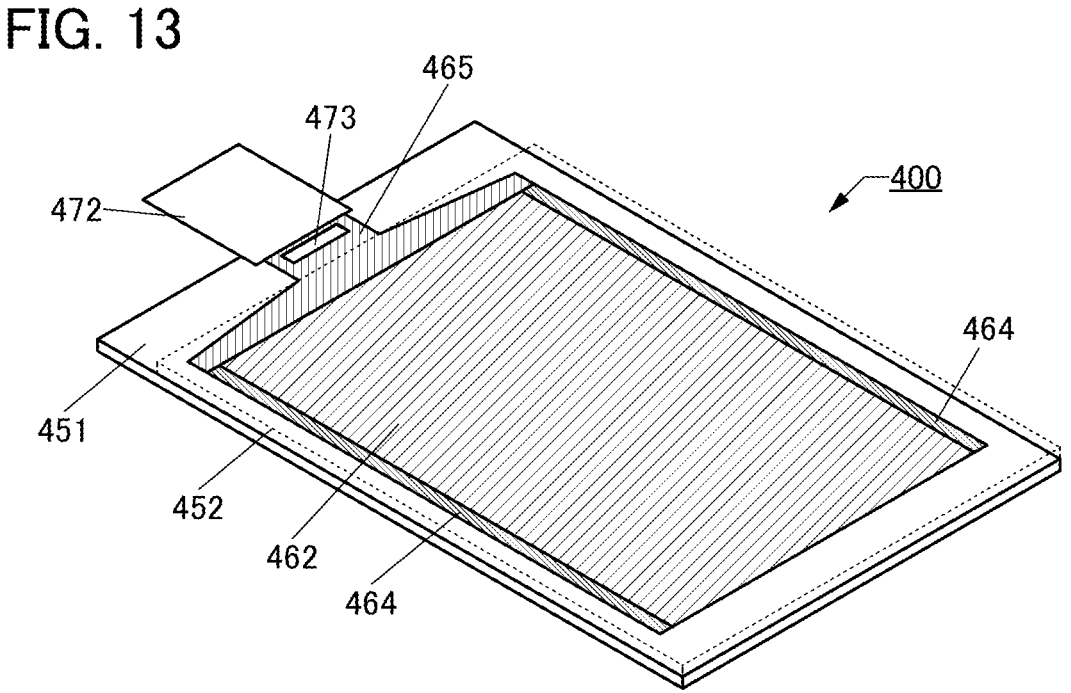
FIG. 13 is a perspective view illustrating an example of a display apparatus.
Figures 14A, 14B:
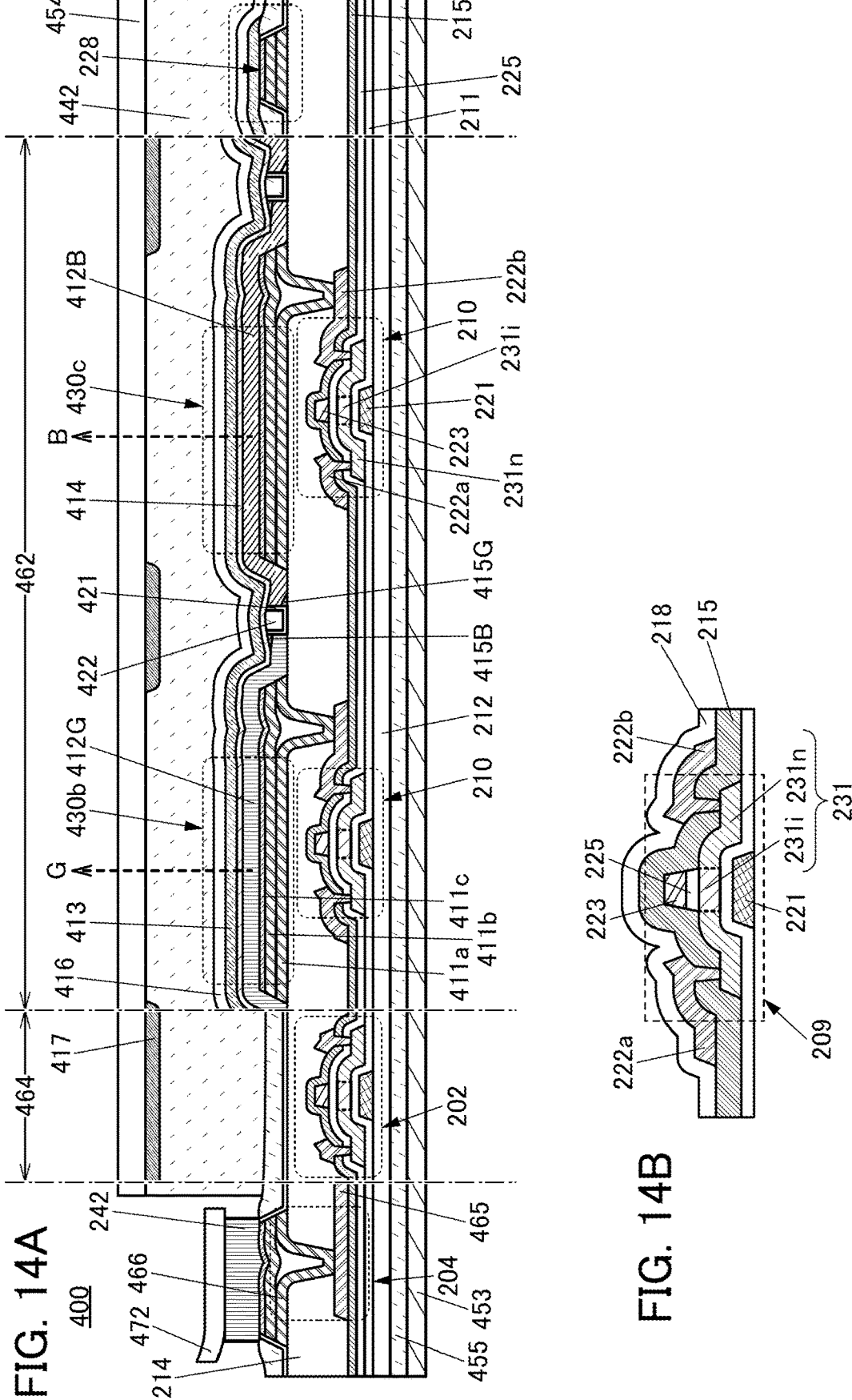
FIG. 14A is a cross-sectional view illustrating an example of a display apparatus.
FIG. 14B is a cross-sectional view illustrating an example of a transistor.

FIG. 13 is a perspective view of a display apparatus 400, and FIG. 14A is a cross-sectional view of the display apparatus 400.

The display apparatus 400 has a structure in which a substrate 452 and a substrate 451 are bonded to each other. In FIG. 13, the substrate 452 is denoted by a dashed line.

The display apparatus 400 includes a display portion 462, a circuit 464, a wiring 465, and the like. FIG. 13 illustrates an example in which an IC 473 and an FPC 472 are integrated on the display apparatus 400. Thus, the structure illustrated in FIG. 13 can be regarded as a display module including the display apparatus 400, the IC (integrated circuit), and the FPC.

As the circuit 464, for example, a scan line driver circuit can be used.

The wiring 465 has a function of supplying a signal and power to the display portion 462 and the circuit 464. The signal and power are input to the wiring 465 from the outside through the FPC 472 or input to the wiring 465 from the IC 473.

FIG. 13 illustrates an example in which the IC 473 is provided over the substrate 451 by a COG (Chip On Glass) method, a COF (Chip on Film) method, or the like. An IC including a scan line driver circuit, a signal line driver circuit, or the like can be used as the IC 473, for example.

Note that the display apparatus 400 and the display module are not necessarily provided with an IC. The IC may be mounted on the FPC by a COF method or the like.

FIG. 14A illustrates an example of cross sections of part of a region including the FPC 472, part of the circuit 464, part of the display portion 462, and part of a region including a connection portion in the display apparatus 400. FIG. 14A specifically illustrates an example of a cross section of a region including the light-emitting element 430*b* that emits green light and the light-emitting element 430*c* that emits blue light in the display portion 462.

The display apparatus 400 illustrated in FIG. 14A includes a transistor 202, a transistor 210, the light-emitting element 430*b*, the light-emitting element 430*c*, and the like between a substrate 453 and a substrate 454.

The light-emitting element described in Embodiment 1 can be employed for the light-emitting element 430*b* and the light-emitting element 430*c*.

Here, in the case where the pixel of the display apparatus includes three kinds of subpixels including light-emitting elements that emit light of different colors, as the three subpixels, subpixels of three colors of red (R), green (G), and blue (B), subpixels of three colors of yellow (Y), cyan (C), and magenta (M), and the like can be given. In the case where the pixel includes four subpixels each including a light-emitting element, as the four subpixels, subpixels of four colors of R, G, B, and white (W), subpixels of four colors of R, G, B, and Y, and the like can be given.

The substrate 454 and the protective layer 416 are bonded to each other with the adhesive layer 442. The adhesive layer 442 is provided to overlap with the light-emitting element 430*b* and the light-emitting element 430*c*; that is, the display apparatus 400 employs a solid sealing structure.

The light-emitting element 430*b* and the light-emitting element 430*c* each include a conductive layer 411*a*, a conductive layer 411*b*, and a conductive layer 411*c* as a pixel electrode. The conductive layer 411*b* has a property of reflecting visible light and functions as a reflective electrode. The conductive layer 411*c* has a property of transmitting visible light and functions as an optical adjustment layer.

The conductive layer 411*a* is connected to the conductive layer 222*b* included in the transistor 210 through the opening provided in the insulating layer 214. The transistor 210 has a function of controlling driving of the light-emitting element.

An EL layer 412G or an EL layer 412B is provided to cover the pixel electrode. An insulating layer 421 is provided in contact with a side surface of the EL layer 412G and a side surface of the EL layer 412B, and a resin layer 422 is provided to fill a depressed portion of the insulating layer 421. An organic layer 414, a common electrode 413, and the protective layer 416 are provided to cover the EL layer 412G and the EL layer 412B. A layer 415B and a layer 415G are provided in contact with the insulating layer 421. The layer 415B includes the same material as the EL layer 412B, and the layer 415G includes the same material as the EL layer 412G.

Light emitted from the light-emitting element is emitted toward the substrate 452 side. For the substrate 452, a material having a high visible-light-transmitting property is preferably used.

The transistor 202 and the transistor 210 are formed over the substrate 451. These transistors can be fabricated using the same material in the same step.

The substrate 453 and an insulating layer 212 are bonded to each other with an adhesive layer 455.

In a manufacturing method of the display apparatus 400, first, a formation substrate provided with the insulating layer 212, the transistors, the light-emitting elements, and the like is bonded to the substrate 454 provided with a light-blocking layer 417 with the adhesive layer 442. Then, the substrate 453 is attached to a surface exposed by separation of the formation substrate, whereby the components formed over the formation substrate are transferred onto the substrate 453. The substrate 453 and the substrate 454 preferably have flexibility. This can increase the flexibility of the display apparatus 400.

The inorganic insulating film that can be used as the insulating layer 211 and the insulating layer 215 can be used as the insulating layer 212.

The connection portion 204 is provided in a region of the substrate 453 that does not overlap with the substrate 454. In the connection portion 204, the wiring 465 is electrically connected to the FPC 472 through a conductive layer 466 and a connection layer 242. The conductive layer 466 can be obtained by processing the same conductive film as the pixel electrode. Thus, the connection portion 204 and the FPC 472 can be electrically connected to each other through the connection layer 242.

Each of the transistor 202 and the transistors 210 includes the conductive layer 221 functioning as a gate, the insulating layer 211 functioning as a gate insulating layer, a semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the corresponding low-resistance regions 231*n* through openings provided in the insulating layer 215. One of the conductive layer 222*a* and the conductive layer 222*b* functions as a source, and the other functions as a drain.

FIG. 14A illustrates an example in which the insulating layer 225 covers a top surface and a side surface of the semiconductor layer. The conductive layer 222*a* and the conductive layer 222*b* are connected to the corresponding low-resistance regions 231*n* through openings provided in the insulating layer 225 and the insulating layer 215.

Meanwhile, in a transistor 209 illustrated in FIG. 14B, the insulating layer 225 overlaps with the channel formation region 231*i* of the semiconductor layer 231 and does not overlap with the low-resistance regions 231*n*. The structure illustrated in FIG. 14B can be fabricated by processing the insulating layer 225 using the conductive layer 223 as a mask, for example. In FIG. 14B, the insulating layer 215 is provided to cover the insulating layer 225 and the conductive layer 223, and the conductive layer 222*a* and the conductive layer 222*b* are connected to the low-resistance regions 231*n* through the openings in the insulating layer 215. Furthermore, an insulating layer 218 covering the transistor may be provided.

There is no particular limitation on the structure of the transistors included in the display apparatus of this embodiment. For example, a planar transistor, a staggered transistor, an inverted staggered transistor, or the like can be used. A top-gate or a bottom-gate transistor structure may be employed. Alternatively, gates may be provided above and below the semiconductor layer in which a channel is formed.

The structure in which the semiconductor layer where a channel is formed is interposed between two gates is used for the transistor 202 and the transistors 210. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the semiconductor layer of the transistor, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display apparatus of this embodiment.

The band gap of a metal oxide used for the semiconductor layer of the transistor is preferably 2 eV or more, further preferably 2.5 eV or more. With the use of a metal oxide having a wide bandgap, the off-state current of the OS transistor can be reduced.

A metal oxide contains preferably at least indium or zinc and further preferably indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and M is further preferably gallium. Hereinafter, a metal oxide containing indium, M, and zinc is referred to as In-M-Zn oxide in some cases.

When a metal oxide is an In-M-Zn oxide, the atomic ratio of In is preferably higher than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio. By increasing the proportion of the number of indium atoms in the metal oxide, the on-state current, field-effect mobility, or the like of the transistor can be improved.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The atomic ratio of In may be less than the atomic ratio of M in the In-M-Zn oxide. Examples of the atomic ratio of the metal elements in such an In-M-Zn oxide include In:M:Zn=1:3:2 or a composition in the neighborhood thereof, In:M:Zn=1:3:3 or a composition in the neighborhood thereof, In:M:Zn=1:3:4 or a composition in the neighborhood thereof. By increasing the proportion of the number of M atoms in the metal oxide, the band gap of the In-M-Zn oxide is further increased; thus, the resistance to a negative bias stress test with light irradiation can be improved. Specifically, the amount of change in the threshold voltage or the amount of change in the shift voltage (Vsh) measured in a NBTIS (Negative Bias Temperature Illumination Stress) test of the transistor can be decreased. Note that the shift voltage (Vsh) is defined as Vg at which, in a drain current (Id)-gate voltage (Vg) curve of a transistor, the tangent at a point where the slope of the curve is the steepest intersects the straight line of Id=1 pA.

Alternatively, the semiconductor layer of the transistor may include silicon. Examples of silicon include amorphous silicon and crystalline silicon (e.g., low-temperature poly-silicon or single crystal silicon).

Alternatively, a semiconductor layer of a transistor may include a layered material that functions as a semiconductor. The layered substance is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered materials include graphene, silicene, and chalcogenide. Chalcogenide is a compound containing chalcogen (an element belonging to Group 16). Examples of chalcogenide include transition metal chalcogenide and chalcogenide of Group 13 elements. Specific examples of the transition metal chalcogenide which can be used for a semiconductor layer of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of a display apparatus.

An inorganic insulating film is preferably used as each of the insulating layer 211, the insulating layer 212, the insulating layer 215, the insulating layer 218, and the insulating layer 225. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above inorganic insulating films may also be used.

Here, an organic insulating film often has a lower barrier property than an inorganic insulating film. Therefore, the organic insulating film preferably has an opening in the vicinity of an end portion of the display apparatus 400. This can inhibit entry of impurities from the end portion of the display apparatus 400 through the organic insulating film. Alternatively, the organic insulating film may be formed so that its end portion is positioned on the inner side compared to the end portion of the display apparatus 400, to prevent the organic insulating film from being exposed at the end portion of the display apparatus 400.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

The light-blocking layer 417 is preferably provided on a surface of the substrate 454 on the substrate 453 side. A variety of optical members can be arranged on the outer side of the substrate 454. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 454.

With provision of the protective layer 416 that covers the light-emitting element, entry of impurities such as water into the light-emitting element can be inhibited, leading to an increase in the reliability of the light-emitting element.

FIG. 14A illustrates a connection portion 228. In the connection portion 228, the common electrode 413 is electrically connected to a wiring. FIG. 14A illustrates an example of the case in which the wiring has the same stacked-layer structure as the pixel electrode.

For each of the substrate 453 and the substrate 454, glass, quartz, ceramics, sapphire, a resin, a metal, an alloy, a semiconductor, or the like can be used. The substrate on the side from which light from the light-emitting element is extracted is formed using a material which transmits the light. When the substrate 453 and the substrate 454 are formed using a flexible material, the flexibility of the display apparatus can be increased. Furthermore, a polarizing plate may be used as the substrate 453 or the substrate 454.

For each of the substrate 453 and the substrate 454, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 453 and the substrate 454.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the films having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of a display panel might be changed, e.g., creases are generated. Thus, for the substrate, a film with a low water absorption rate is preferably used. For example, the water absorption rate of the film is preferably lower than or equal to 1%, further preferably lower than or equal to 0.1%, still further preferably lower than or equal to 0.01%.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

Examples of materials that can be used for a gate, a source, and a drain of a transistor and conductive layers such as a variety of wirings and electrodes included in a display apparatus include metals such as aluminum, titanium, chromium, nickel, copper, yttrium, zirconium, molybdenum, silver, tantalum, or tungsten, and an alloy containing any of these metals as its main component. A film containing any of these materials can be used in a single layer or as a stacked-layer structure.

For a conductive material having a light-transmitting property, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked film of any of the above materials can be used as a conductive layer. For example, a stacked film of indium tin oxide and an alloy of silver and magnesium, or the like is preferably used for increased conductivity. These materials can also be used, for example, for the conductive layers such as a variety of wirings and electrodes included in a display apparatus, and conductive layers (conductive layers functioning as a pixel electrode or a common electrode) included in the light-emitting element.

For an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 3

A structure example of the pixels in the display portion of the display apparatus is described below.

The display apparatus 100 illustrated in FIG. 1A is an example employing a stripe arrangement. In FIG. 1A, three subpixels R, G, and B are formed. The subpixels R, G, and B include light-emitting devices for different emission colors. For example, the subpixels R, G, and B can be, respectively, red, green, and blue subpixels.

Figures 15A, 15B, 15C:
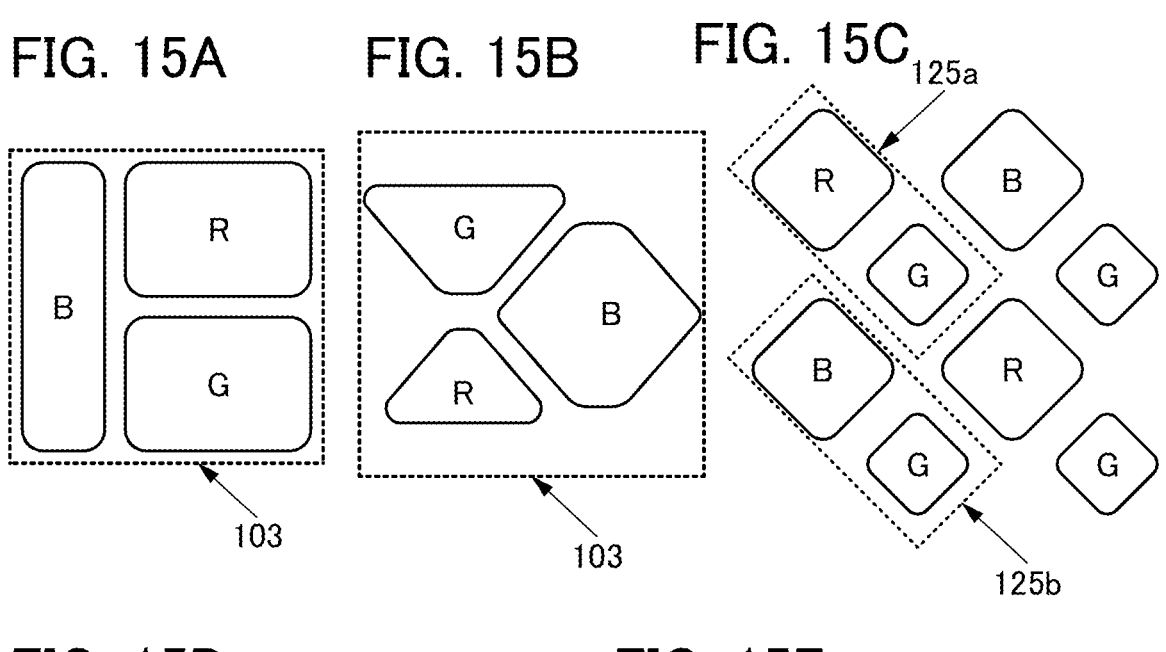
FIG. 15A to FIG. 15E are diagrams each illustrating an example of a pixel of a display apparatus.

A pixel 103 illustrated in FIG. 15A employs an S-stripe arrangement. The pixel 103 illustrated in FIG. 15A consists of three subpixels R, G, and B.

The pixel 103 illustrated in FIG. 15B includes the subpixel G whose top surface shape is a rough trapezoid with rounded corners, the subpixel R whose top surface shape is a rough triangle with rounded corners, and the subpixel B whose top surface shape is a rough tetragon or rough hexagon with rounded corners. The subpixel G has a larger light-emitting area than the subpixel R. In this manner, the shapes and sizes of the subpixels can be determined independently. For example, the size of a subpixel including a light-emitting device with higher reliability can be smaller. The subpixel R may be a red subpixel, the subpixel G may be a green subpixel, and the subpixel B may be a blue subpixel, for example.

Pixels 125a and 125b illustrated in FIG. 15C employ a PenTile arrangement. FIG. 15C illustrates an example where the pixels 125a including the subpixel R and the subpixel G and the pixels 125b including the subpixel G and the subpixel B are alternately arranged. The subpixel R may be a red subpixel, the subpixel G may be a green subpixel, and the subpixel B may be a blue subpixel, for example.

Figures 15D, 15E:
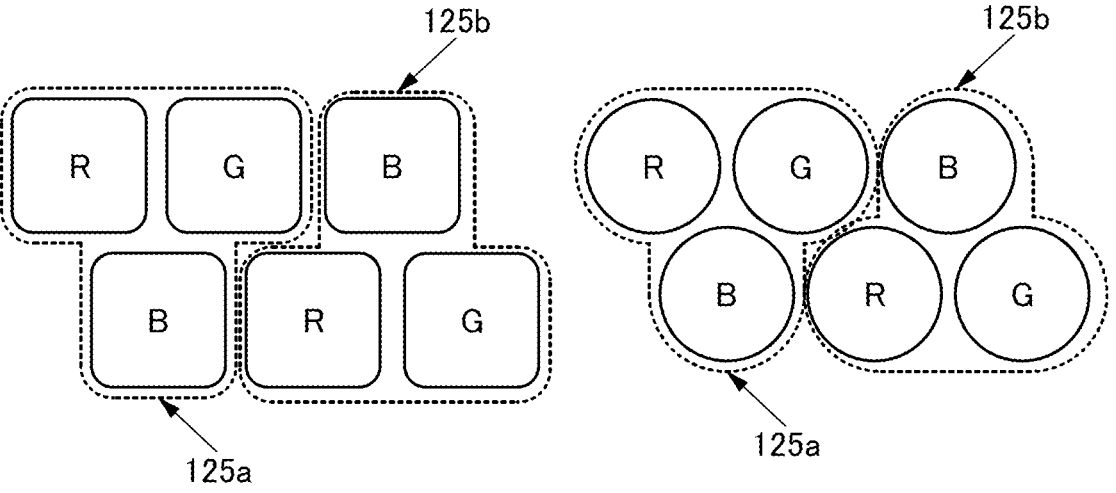

The pixels 125*a* and 125*b* illustrated in FIG. 15D and FIG. 15E employ a delta arrangement. The pixel 125*a* includes two subpixels (subpixels R and G) in the upper row (first row) and one subpixel (subpixel B) in the lower row (second row). The pixel 125*b* includes one subpixel (subpixel B) in the upper row (first row) and two subpixels (subpixels R and G) in the lower row (second row).

FIG. 15D illustrates an example where a top surface shape of each subpixel is a rough tetragon with rounded corners, and FIG. 15E illustrates an example where a top surface shape of each subpixel is a circle.

In a photolithography method, as a pattern to be formed by processing becomes finer, the influence of light diffraction becomes more difficult to ignore: therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, a top surface shape of a subpixel becomes a polygon with rounded corners, an ellipse, a circle, or the like, in some cases.

Furthermore, according to the manufacturing method of a display apparatus of one embodiment of the present invention, the EL layer is processed into an island shape with the use of a resist mask. A resist film formed over the EL layer needs to be cured at a temperature lower than the upper temperature limit of the EL layer. Thus, the resist film is insufficiently cured in some cases depending on the upper temperature limit of the material of the EL layer and the curing temperature of the resist material. An insufficiently cured resist film may have a shape different from a desired shape at the time of processing. As a result, the top surface shapes of the EL layer each become a polygon with rounded corners, an ellipse, a circle, or the like, in some cases. For example, when a resist mask whose top surface shape is a square is intended to be formed, a resist mask whose top surface shape is a circle may be formed, and the top surface shapes of the EL layer may each become a circle in some cases.

To obtain desired top surface shape of the EL layer, a technique of correcting a mask pattern in advance so that a transferred pattern agrees with a design pattern (an OPC (Optical Proximity Correction) technique) may be used. Specifically, with the OPC technique, a pattern for correction is added to a corner portion or the like of a figure on a mask pattern.

Figure 16A:
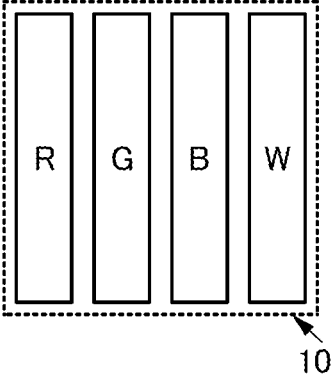
FIG. 16A to FIG. 16G are diagrams each illustrating an example of a pixel of a display apparatus.
Figure 16B:
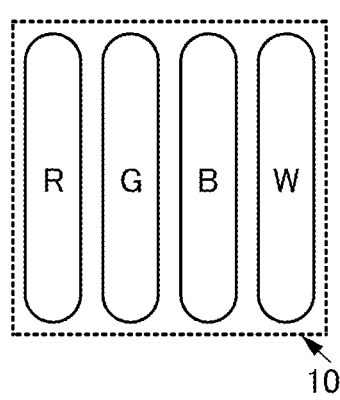
Figure 16C:
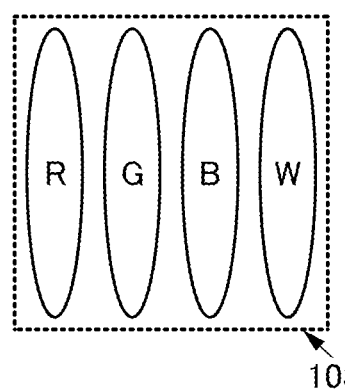

The pixel 103 illustrated in FIG. 16A to FIG. 16C employs a stripe arrangement. The pixel 103 illustrated in FIG. 16A to FIG. 16C consists of the four subpixels R, G, B, and W. The subpixels R, G, B, and W include light-emitting devices for different emission colors. For example, the subpixels R, G, B, and W can be, respectively, red, green, blue, and white subpixels.

FIG. 16A illustrates an example in which each subpixel has a rectangular top surface shape, FIG. 16B illustrates an example in which each subpixel has a top surface shape formed by combining two half circles and a rectangle, and FIG. 16C illustrates an example in which each subpixel has an elliptical top surface shape.

Figure 16D:
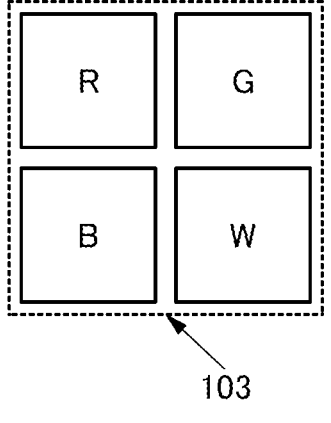
Figure 16E:
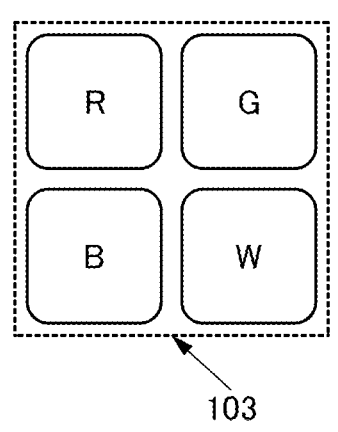
Figure 16F:
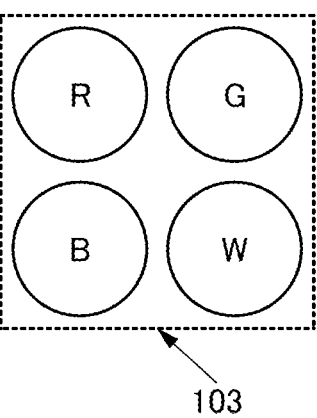

The pixels 103 illustrated in FIG. 16D to FIG. 16F employ a matrix arrangement. The pixel 103 illustrated in FIG. 16D to FIG. 16F consists of the four subpixels R, G, B, and W.

Figure 16G:
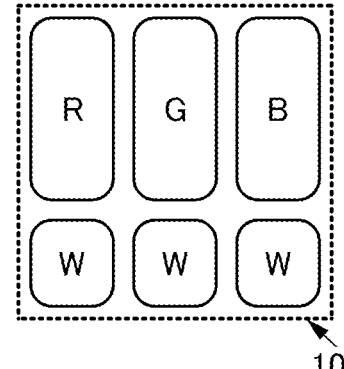

FIG. 16D illustrates an example in which each subpixel has a square top surface shape, FIG. 16E illustrates an example in which each subpixel has a substantially square top surface shape with rounded corners, and FIG. 16F illustrates an example in which each subpixel has a circular top surface shape. FIG. 16G illustrates an example in which a pixel includes the subpixels R, G, and B employing a stripe arrangement and three subpixels W.

Embodiment 4

In this embodiment, light-emitting elements (also referred to as light-emitting devices) that can be used in a display apparatus that is one embodiment of the present invention will be described.

In this specification and the like, a device fabricated using a metal mask or an FMM (fine metal mask) may be referred to as a device having an MM (metal mask) structure. In this specification and the like, a device fabricated without using a metal mask or an FMM may be referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Structures of light-emitting devices can be classified roughly into a single structure and a tandem structure. A device with a single structure includes one light-emitting unit between a pair of electrodes, and the light-emitting unit preferably includes one or more light-emitting layers. To obtain white light emission in a single structure, two or more light-emitting layers are selected such that emission colors of the light-emitting layers are complementary colors. For example, when emission colors of a first light-emitting layer and a second light-emitting layer are complementary colors, the light-emitting device can be configured to emit white light as a whole. The same applies to a light-emitting device including three or more light-emitting layers.

A device with a tandem structure includes two or more light-emitting units between a pair of electrodes, and each light-emitting unit preferably includes one or more light-emitting layers. When light-emitting layers that emit light of the same color are used in each light-emitting unit, luminance per predetermined current can be increased, and the light-emitting device can have higher reliability than that with a single structure. To obtain white light emission in a tandem structure, the structure is made so that light from light-emitting layers of the plurality of light-emitting units can be combined to be white light. Note that a combination of emission colors for obtaining white light emission is similar to a structure in the case of a single structure. In the device with a tandem structure, an intermediate layer such as a charge-generation layer is suitably provided between the plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

<Structure Example of Light-Emitting Device>

As illustrated in FIG. 17A, the light-emitting device includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can function as a single light-emitting unit, and the structure in FIG. 17A is referred to as a single structure in this specification.

FIG. 17B is a modification example of the EL layer 786 included in the light-emitting device illustrated in FIG. 17A. Specifically, the light-emitting device illustrated in FIG. 17B includes a layer 4430-1 over the lower electrode 772, a layer 4430-2 over the layer 4430-1, a light-emitting layer 4411 over the layer 4430-2, a layer 4420-1 over the light-emitting layer 4411, a layer 4420-2 over the layer 4420-1, and the upper electrode 788 over the layer 4420-2. For example, when the lower electrode 772 functions as an anode and the upper electrode 788 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 772 functions as a cathode and the upper electrode 788 functions as an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layered structure, carriers can be efficiently injected to the light-emitting layer 4411, and the efficiency of the recombination of carriers in the light-emitting layer 4411 can be enhanced.

Note that the structure in which a plurality of light-emitting layers (light-emitting layers 4411, 4412, and 4413) are provided between the layer 4420 and the layer 4430 as illustrated in FIG. 17C and FIG. 17D is a variation of the single structure.

The structure in which a plurality of light-emitting units (an EL layer 786a and an EL layer 786b) are connected in series with an intermediate layer (a charge-generation layer) 4440 therebetween as illustrated in FIG. 17E and FIG. 17F is referred to as a tandem structure in this specification. In this specification and the like, the structure illustrated in FIG. 17E and FIG. 17F is referred to as a tandem structure: however, without being limited to this, a tandem structure may be referred to as a stack structure, for example. The tandem structure enables a light-emitting device capable of high luminance light emission.

In FIG. 17C, light-emitting materials that emit light of the same color may be used for the light-emitting layer 4411, the light-emitting layer 4412, and the light-emitting layer 4413.

Different light-emitting materials may be used for the light-emitting layer 4411, the light-emitting layer 4412, and the light-emitting layer 4413. White light emission can be obtained when the light-emitting layer 4411, the light-emitting layer 4412, and the light-emitting layer 4413 emit light of complementary colors. FIG. 17D illustrates an example in which a coloring layer 785 functioning as a color filter is provided. When white light passes through the color filter, light of a desired color can be obtained.

In FIG. 17E, the same light-emitting material may be used for the light-emitting layer 4411 and the light-emitting layer 4412. Alternatively, light-emitting materials that emit light of different colors may be used for the light-emitting layer 4411 and the light-emitting layer 4412. White light emission can be obtained when the light-emitting layer 4411 and the light-emitting layer 4412 emit light of complementary colors. FIG. 17F illustrates an example in which the coloring layer 785 is further provided.

Also in the structures illustrated in FIG. 17C, FIG. 17D, FIG. 17E, and FIG. 17F, the layer 4420 and the layer 4430 may each have a stacked-layer structure of two or more layers as illustrated in FIG. 17B.

A structure in which light-emitting layers (here, blue (B), green (G), and red (R)) are separately formed for light-emitting devices is referred to as an SBS (Side By Side) structure in some cases.

The emission color of the light-emitting device can be red, green, blue, cyan, magenta, yellow, white, or the like depending on the material that constitutes the EL layer 786. Furthermore, the color purity can be further increased when the light-emitting device has a microcavity structure.

The light-emitting device that emits white light preferably contains two or more kinds of light-emitting substances in the light-emitting layer. To obtain white light emission, two or more kinds of light-emitting substances are selected such that their emission colors are complementary. For example, when the emission color of a first light-emitting layer and the emission color of a second light-emitting layer are complementary colors, it is possible to obtain a light-emitting device which emits white light as a whole. The same can be applied to a light-emitting device including three or more light-emitting layers.

The light-emitting layer preferably contains two or more light-emitting substances that emit light of R (red), G (green), B (blue), Y (yellow), O (orange), and the like. Alternatively, the light-emitting layer preferably contains two or more light-emitting substances that emit light containing two or more of spectral components of R, G, and B.

A specific structure example of the light-emitting device will be described here.

The light-emitting devices include at least the light-emitting layer. The light-emitting device may further include, as a layer other than the light-emitting layer, a layer including a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like.

Either a low molecular compound or a high molecular compound can be used for the light-emitting device, and an inorganic compound may also be included. Each layer included in the light-emitting device can be formed by an evaporation method (including a vacuum evaporation method), a transfer method, a printing method, an inkjet method, a coating method, or the like.

For example, the light-emitting device can include one or more of a hole-injection layer, a hole-transport layer, a hole-blocking layer, an electron-blocking layer, an electron-transport layer, and an electron-injection layer in addition to the light-emitting layer.

The hole-injection layer is a layer injecting holes from an anode to the hole-transport layer, and a layer containing a material with a high hole-injection property. For the material with a high hole-injection property, an aromatic amine compound and a composite material containing a hole-transport material and an acceptor material (an electron-accepting material), and the like can be given.

The hole-transport layer is a layer transporting holes, which are injected from the anode by the hole-injection layer, to the light-emitting layer. The hole-transport layer is a layer containing a hole-transport material. As the hole-transport material, a substance having a hole mobility higher than or equal to $1 \times 10^{-6}$ cm$^2$/Vs is preferable. Note that other substances can also be used as long as they have a property of transporting more holes than electrons. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-transport layer is a layer transporting electrons, which are injected from a cathode by the electron-injection layer, to the light-emitting layer. The electron-transport layer is a layer containing an electron-transport material. As the electron-transport material, a substance having an electron mobility higher than or equal to $1 \times 10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzo-quinoline derivative, a quinoxaline derivative, a dibenzo-quinoxaline derivative, a pyridine derivative, a bipyridine derivative, a pyrimidine derivative, or a π-electron deficient heteroaromatic compound including a nitrogen-containing heteroaromatic compound.

The electron-injection layer is a layer injecting electrons from the cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (an electron-donating material) can also be used.

For the electron-injection layer, for example, an alkali metal, an alkaline earth metal, or a compound thereof, such as lithium, cesium, lithium fluoride (LiF), cesium fluoride (CsF), calcium fluoride (CaF$_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide (LiOx), or cesium carbonate can be used.

Alternatively, for the electron-injection layer, an electron-transport material may be used. For example, a compound having an unshared electron pair and having an electron deficient heteroaromatic ring can be used as the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to –3.6 eV and less than or equal to –2.3 eV. In addition, in general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1, 10-phenanthroline (abbreviation: NBPhen), diquinoxalino [2,3-a:2',3'-c]phenazine (abbreviation: HATNA), 2,4,6-tris [3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. For the light-emitting substance, a substance that exhibits an emission color of blue, violet, bluish violet, green, yellowish green, yellow, orange, red, or the like is appropriately used. For the light-emitting substance, a substance that emits near-infra-red light can also be used.

Examples of the light-emitting substances include a fluorescent material, a phosphorescent material, a TADF material, and a quantum dot material.

Examples of the fluorescent materials include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton: an organometallic complex (particularly an iridium complex) having a phenylpyridine derivative including an electron-withdrawing group as a ligand: a platinum complex: and a rare earth metal complex.

The light-emitting layer may contain one or more kinds of organic compounds (e.g., a host material and an assist material) in addition to the light-emitting substance (a guest material). For one or more kinds of organic compounds, one or both of the hole-transport material and the electron-transport material can be used. Alternatively, as one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 5

In this embodiment, examples where a display apparatus of one embodiment of the present invention includes a light-receiving device or the like will be described.

In the display apparatus of this embodiment, a pixel can include a plurality of types of subpixels including light-emitting devices that emit light of different colors. For example, a pixel can include three types of subpixels. As the three subpixels, subpixels of three colors of red (R), green (G), and blue (B) and subpixels of three colors of yellow (Y), cyan (C), and magenta (M) can be given. Alternatively, a pixel can include four types of subpixels. As the four subpixels, subpixels of four colors of R, G, B, and white (W) and subpixels of four colors of R, G, B, and Y can be given.

There is no particular limitation on the arrangement of subpixels, and a variety of methods can be employed. Examples of the arrangement of subpixels include a stripe arrangement, an S stripe arrangement, a matrix arrangement, a delta arrangement, a Bayer arrangement, and a pentile arrangement.

The top surfaces of the subpixels may have a triangular shape, a quadrangular shape (including a rectangular shape and a square shape), a polygonal shape such as a pentagonal shape, a polygonal shape with rounded corners, an elliptical shape, or a circular shape, for example. Here, the top surface shape of the subpixel corresponds to the top surface shape of a light-emitting region of the light-emitting device.

The display apparatus of one embodiment of the present invention may include a light-receiving device in the pixel.

In the display apparatus including the light-emitting device and the light-receiving device in the pixel, the pixel has a light-receiving function, which enables detection of a touch or approach of an object while an image is displayed. For example, all the subpixels included in the display apparatus can display an image: alternatively, some subpixels can emit light as a light source and the other subpixels can display an image.

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by detecting light with the display portion, an image can be captured or an approach or touch of an object (e.g., a finger, a hand, or a pen) can be detected. Furthermore, in the display apparatus of one embodiment of the present invention, the light-emitting devices can be used as a light source of the sensor. Accordingly, a light-receiving portion and a light source do not need to be provided separately from the display apparatus: hence, the number of components of an electronic device can be reduced.

In the display apparatus of one embodiment of the present invention, when an object reflects (or scatters) light emitted from the light-emitting device included in the display portion, the light-receiving device can sense reflected light (or scattered light): thus, image capturing or touch sensing is possible even in a dark place.

In the case where the light-receiving devices are used as the image sensor, the display apparatus can capture an image with the use of the light-receiving devices. For example, the display apparatus of this embodiment can be used as a scanner.

For example, data on biological information such as a fingerprint or a palm print can be obtained with the use of the image sensor. That is, a biometric authentication sensor can be incorporated in the display apparatus. When the display apparatus incorporates a biometric authentication sensor, the number of components of an electronic device can be reduced as compared to the case where a biometric authentication sensor is provided separately from the display apparatus: thus, the size and weight of the electronic device can be reduced.

In the case where the light-receiving devices are used as the touch sensor, the display apparatus can sense an approach or touch of an object with the use of the light-receiving devices.

For example, a pn or pin photodiode can be used as the light-receiving device. The light-receiving devices function as photoelectric conversion devices (also referred to as photoelectric conversion elements) that sense light entering the light-receiving devices and generate electric charge. The amount of electric charge generated from the light-receiving devices depends on the amount of light entering the light-receiving devices.

It is particularly preferable to use an organic photodiode including a layer containing an organic compound, as the light-receiving device. An organic photodiode, which is easily made thin, lightweight, and large in area and has a high degree of freedom for shape and design, can be used in a variety of display apparatuses.

In one embodiment of the present invention, organic EL devices are used as the light-emitting devices, and organic photodiodes are used as the light-receiving devices. The organic EL device and the organic photodiode can be formed over the same substrate. Thus, the organic photodiode can be incorporated in the display apparatus including the organic EL device.

Figure 18A:
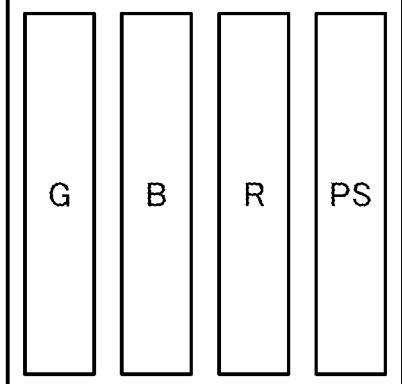
FIG. 18A to FIG. 18D are diagrams each illustrating an example of a pixel of a display apparatus.
Figure 18B:
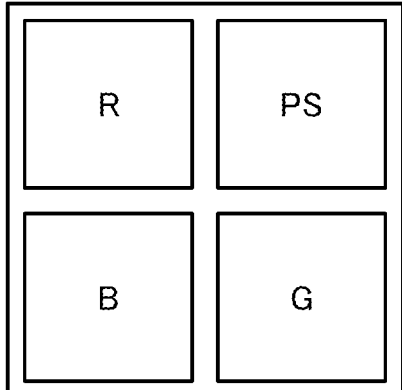

Pixels illustrated in FIG. 18A and FIG. 18B each include the subpixel G, the subpixel B, the subpixel R, and a subpixel PS.

The pixel illustrated in FIG. 18A employs a stripe arrangement. The pixel illustrated in FIG. 18B employs matrix arrangement.

Figure 18C:
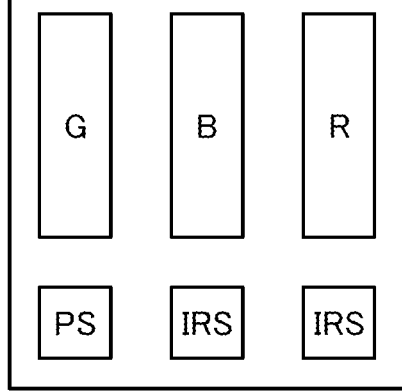
Figure 18D:
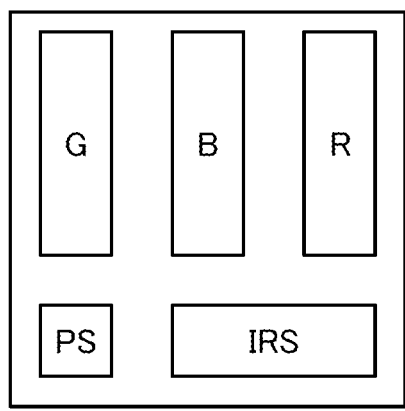

Pixels illustrated in FIG. 18C and FIG. 18D each include the subpixel G, the subpixel B, the subpixel R, the subpixel PS, and a subpixel IRS.

FIG. 18C and FIG. 18D illustrate an example in which one pixel is provided in two rows and three columns. Three subpixels (the subpixel G, the subpixel B, and the subpixel R) are provided in the upper row (first row). In FIG. 18C, three subpixels (one subpixel PS and two subpixels IRS) are provided in the lower row (second row). In FIG. 18D, two subpixels (one subpixel PS and one subpixel IRS) are provided in the lower row (second row). Note that the layout of the subpixels is not limited to the structures illustrated in FIG. 18A to FIG. 18D.

The subpixel R includes a light-emitting device that emits red light. The subpixel G includes a light-emitting device that emits green light. The subpixel B includes a light-emitting device that emits blue light.

The subpixel PS and the subpixel IRS each include the light-receiving device. There is no particular limitation on the wavelength of light detected by the subpixel PS and the subpixel IRS.

The light-receiving area of the subpixel PS is smaller than the light-receiving area of the subpixel IRS. A smaller light-receiving area leads to a narrower image-capturing range, inhibits a blur in a captured image, and improves the resolution. Thus, the use of the subpixel PS enables higher-definition or higher-resolution image capturing than the use of the subpixel IRS. For example, image capturing for personal authentication with the use of a fingerprint, a palm print, the iris, the shape of a blood vessel (including the shape of a vein and the shape of an artery), a face, or the like is possible by using the subpixel PS.

The light-receiving device included in the subpixel PS preferably senses visible light, and preferably senses one or more of blue light, violet light, bluish violet light, green light, yellowish green light, yellow light, orange light, red light, and the like. The light-receiving device included in the subpixel PS may sense infrared light.

The subpixel IRS can be used in a touch sensor (also referred to as a direct touch sensor), a near touch sensor (also referred to as a hover sensor, a hover touch sensor, a contactless sensor, or a touchless sensor), or the like. The wavelength of light sensed by the subpixel IRS can be determined depending on the application purpose. For example, the subpixel IRS preferably senses infrared light. Thus, a touch can be sensed even in a dark place.

Here, the touch sensor or the near touch sensor can sense an approach or contact of an object (e.g., a finger, a hand, or a pen). The touch sensor can sense the object when the display apparatus and the object come in direct contact with each other. Furthermore, even when an object is not in contact with the display apparatus, the near touch sensor can sense the object. For example, the display apparatus is preferably capable of sensing an object positioned in the range of 0.1 mm to 300 mm inclusive, further preferably 3 mm to 50 mm inclusive from the display apparatus. This structure enables the display apparatus to be operated without direct contact of an object, that is, enables the display apparatus to be operated in a contactless (touchless) manner. With the above-described structure, the display apparatus can have a reduced risk of being dirty or damaged, or can be operated without the object directly touching a dirt (e.g., dust or a virus) attached to the display apparatus.

When one pixel includes two kinds of light-receiving devices, the display apparatus can have two additional functions as well as a display function, enabling a multifunctional display apparatus.

For high-definition image capturing, the subpixel PS is preferably provided in all pixels included in the display apparatus. Meanwhile, the subpixel IRS used for a touch sensor, a near touch sensor, or the like only needs to be provided in some pixels included in the display apparatus because sensing with the subpixel IRS is not required to have high accuracy as compared to sensing with the subpixel PS. When the number of subpixels IRS included in the display apparatus is smaller than the number of subpixels PS, higher sensing speed can be achieved.

Here, a structure of the light-receiving device that can be used for the subpixel PS and the subpixel IRS is described.

The light-receiving device includes at least an active layer that functions as a photoelectric conversion layer between a pair of electrodes. In this specification and the like, one of the pair of electrodes may be referred to as a pixel electrode and the other may be referred to as a common electrode.

One of the pair of electrodes of the light-receiving device functions as an anode, and the other electrode functions as a cathode. The case where the pixel electrode functions as an anode and the common electrode functions as a cathode is described below as an example. In other words, when the light-receiving device is driven by application of reverse bias between the pixel electrode and the common electrode, light entering the light-receiving device can be sensed and charge can be generated and extracted as current.

A manufacturing method similar to that of the light-emitting device can be employed for the light-receiving device. An island-shaped active layer (also referred to as a photoelectric conversion layer) included in the light-receiving layer is formed by processing a film that is to be the active layer and formed on the entire surface, not by using a pattern of a metal mask: thus, the island-shaped active layer can have a uniform thickness. In addition, a sacrifice layer provided over the active layer can reduce damage to the active layer in the manufacturing process of the display apparatus, increasing the reliability of the light-receiving device.

Here, a layer shared by the light-receiving device and the light-emitting device might have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device might have the same function in both the light-emitting device and the light-receiving device. For example, the hole-transport layer functions as a hole-transport layer in both the light-emitting device and the light-receiving device, and the electron-transport layer functions as an electron-transport layer in both the light-emitting device and the light-receiving device.

The active layer included in the light-receiving device includes a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer include electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When T-electron conjugation (resonance) spreads in a plane as in benzene, an electron-donating property (donor property) usually increases. However, since fullerene has a spherical shape, fullerene has a high electron-accepting property even when π-electrons widely spread. The high electron-accepting property efficiently causes rapid charge separation and is useful for a light-receiving device. Both $C_{60}$ and $C_{70}$ have a wide absorption band in a visible light region, and $C_{70}$ is particularly preferable because of having a larger π-electron conjugation system and a wider absorption band in a long wavelength region than $C_{60}$. Other examples of the fullerene derivative include [6,6]-Phenyl-$C_{71}$-butyric acid methyl ester (abbreviation: PC70BM), [6,6]-Phenyl-$C_{61}$-butyric acid methyl ester (abbreviation: PC60BM), 1',1'',4',4''-Tetrahydro-di[1,4]methanonaphthaleno[1,2:2',3',56,60:2'',3''] [5,6]fullerene-$C_{60}$ (abbreviation: ICBA), and the like.

Other examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of the p-type semiconductor material included in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of the p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing any of a substance with a high hole-transport property, a substance with a high electron-transport property, a substance with a bipolar property (a substance with a high electron-transport property and a high hole-transport property), and the like. Without limitation to the above, the light-receiving device may further include a substance with a high hole-injection property, a hole-blocking material, a material with a high electron-injection property, an electron-blocking material, and the like.

Either a low molecular compound or a high molecular compound can be used in the light-receiving device, and an inorganic compound may also be included. Each layer included in the light-receiving device can be formed by an evaporation method (including a vacuum evaporation method), a transfer method, a printing method, an inkjet method, a coating method, or the like.

As the hole-transport material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material, an inorganic compound such as zinc oxide (ZnO) can be used.

For the active layer, a high molecular compound such as poly [[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the wavelength range. In this case, the third material may be a low molecular compound or a high molecular compound.

The above is the description of the light-receiving device.

Figures 18E, 18F:
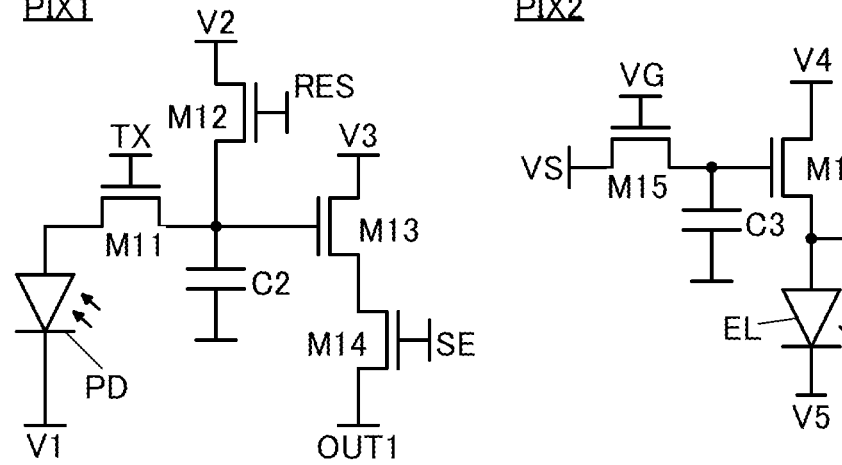
FIG. 18E and FIG. 18F are diagrams each illustrating an example of a pixel circuit of a display apparatus.

FIG. 18E illustrates an example of a pixel circuit of a subpixel including a light-receiving device, and FIG. 18F illustrates an example of a pixel circuit of a subpixel including a light-emitting device.

A pixel circuit PIX1 illustrated in FIG. 18E includes a light-receiving device PD, a transistor M11, a transistor M12, a transistor M13, a transistor M14, and a capacitor C2. Here, an example where a photodiode is used as the light-receiving device PD is illustrated.

A cathode of the light-receiving device PD is electrically connected to a wiring V1, and an anode thereof is electrically connected to one of a source and a drain of the transistor M11. A gate of the transistor M11 is electrically connected to a wiring TX, and the other of the source and the drain thereof is electrically connected to one electrode of the capacitor C2, one of a source and a drain of the transistor M12, and a gate of the transistor M13. A gate of the transistor M12 is electrically connected to a wiring RES, and the other of the source and the drain thereof is electrically connected to a wiring V2. One of a source and a drain of the transistor M13 is electrically connected to a wiring V3, and the other of the source and the drain thereof is electrically connected to one of a source and a drain of the transistor M14. A gate of the transistor M14 is electrically connected to a wiring SE, and the other of the source and the drain thereof is electrically connected to a wiring OUT1.

A constant potential is supplied to the wiring V1, the wiring V2, and the wiring V3. When the light-receiving device PD is driven with a reverse bias, a potential lower than the potential of the wiring V1 is supplied to the wiring V2. The transistor M12 is controlled by a signal supplied to the wiring RES and has a function of resetting the potential of a node connected to the gate of the transistor M13 to a potential supplied to the wiring V2. The transistor M11 is controlled by a signal supplied to the wiring TX and has a function of controlling the timing at which the potential of the node changes, in accordance with current flowing through the light-receiving device PD. The transistor M13 functions as an amplifier transistor for performing output in response to the potential of the node. The transistor M14 is controlled by a signal supplied to the wiring SE and functions as a selection transistor for reading an output corresponding to the potential of the node by an external circuit connected to the wiring OUT1.

A pixel circuit PIX2 illustrated in FIG. 18F includes a light-emitting device EL, a transistor M15, a transistor M16, a transistor M17, and a capacitor C3. Here, an example where a light-emitting diode is used as the light-emitting device EL is illustrated. In particular, an organic EL element is preferably used as the light-emitting device EL.

A gate of the transistor M15 is electrically connected to a wiring VG, one of a source and a drain thereof is electrically connected to a wiring VS, and the other of the source and the drain thereof is electrically connected to one electrode of the capacitor C3 and a gate of the transistor M16. One of a source and a drain of the transistor M16 is electrically connected to a wiring V4, and the other of the source and the drain thereof is electrically connected to an anode of the light-emitting device EL and one of a source and a drain of the transistor M17. A gate of the transistor M17 is electrically connected to a wiring MS, and the other of the source and the drain thereof is electrically connected to a wiring OUT2. A cathode of the light-emitting device EL is electrically connected to a wiring V5.

A constant potential is supplied to the wiring V4 and the wiring V5. In the light-emitting device EL, the anode side can have a high potential and the cathode side can have a lower potential than the anode side. The transistor M15 is controlled by a signal supplied to the wiring VG and functions as a selection transistor for controlling a selection state of the pixel circuit PIX2. The transistor M16 functions as a driving transistor that controls current flowing through the light-emitting device EL, in accordance with a potential supplied to the gate. When the transistor M15 is in a conduction state, a potential supplied to the wiring VS is supplied to the gate of the transistor M16, and the emission luminance of the light-emitting device EL can be controlled in accordance with the potential. The transistor M17 is controlled by a signal supplied to the wiring MS and has a function of outputting a potential between the transistor M16 and the light-emitting device EL to the outside through the wiring OUT2.

Note that in the display panel of this embodiment, the light-emitting element may be made to emit light in a pulsed manner so as to display an image. A reduction in the driving time of the light-emitting element can reduce the power consumption of the display panel and suppress heat generation of the display panel. An organic EL element is particularly preferable because of its favorable frequency characteristics. The frequency can be higher than or equal to 1 kHz and lower than or equal to 100 MHz, for example.

A transistor using a metal oxide (an oxide semiconductor) in a semiconductor layer where a channel is formed is preferably used as the transistor M11, the transistor M12, the transistor M13, and the transistor M14 included in the pixel circuit PIX1 and the transistor M15, the transistor M16, and the transistor M17 included in the pixel circuit PIX2.

A transistor using a metal oxide having a wider band gap and a lower carrier density than silicon can achieve an extremely low off-state current. Thus, such a low off-state current enables long-term retention of electric charge accumulated in a capacitor that is connected in series with the transistor. Therefore, it is particularly preferable to use a transistor using an oxide semiconductor as the transistor M11, the transistor M12, and the transistor M15 each of which is connected in series with the capacitor C2 or the capacitor C3. Moreover, the use of transistors using an oxide semiconductor as the other transistors can reduce the fabrication cost.

Alternatively, transistors using silicon as a semiconductor where a channel is formed can be used as the transistor M11 to the transistor M17. In particular, the use of silicon with high crystallinity, such as single crystal silicon or polycrystalline silicon, is preferable because high field-effect mobility is achieved and a higher-speed operation is possible.

Alternatively, a transistor using an oxide semiconductor may be used as one or more of the transistor M11 to the transistor M17, and transistors using silicon may be used as the other transistors.

Although n-channel transistors are shown as the transistors in FIG. 18E and FIG. 18F, p-channel transistors can also be used.

The transistors included in the pixel circuit PIX1 and the transistors included in the pixel circuit PIX2 are preferably formed to be arranged over the same substrate. It is particularly preferable that the transistors included in the pixel circuit PIX1 and the transistors included in the pixel circuit PIX2 be periodically arranged in one region.

One or more layers including one or both of the transistor and the capacitor are preferably provided at a position overlapping with the light-receiving device PD or the light-emitting device EL. Thus, the effective area of each pixel circuit can be reduced, and a high-resolution light-receiving portion or display portion can be achieved.

As described above, one pixel includes two kinds of light-receiving devices in the display apparatus of this embodiment, whereby the display apparatus can have two additional functions as well as a display function, enabling a multifunctional display apparatus. For example, a high-resolution image capturing function and a sensing function of a touch sensor, a near touch sensor, or the like can be achieved. Furthermore, when a pixel including two kinds of light-receiving devices and a pixel having another structure are combined, the display apparatus can have more functions. For example, a pixel including a light-emitting device that emits infrared light, any of a variety of sensor devices, or the like can be used.

Embodiment 6

In this embodiment, a high-resolution display apparatus will be described.
[Structure Example of Display Panel]

Wearable electronic devices for VR, AR, and the like can provide 3D images by using parallax. In that case, it is necessary to display an image for the right eye in the right eye's field of view and display an image for the left eye in the left eye's field of view. Although the shape of a display portion in a display device may be a horizontal rectangular shape, pixels provided outside the range of vision of both eyes do not contribute to display, and thus black is always displayed in these pixels.

In view of the above, it is preferred that a display portion of a display panel be divided into two regions for the right eye and for the left eye, and that pixels not be provided in an outer region which does not contribute to display. Hence, power consumption needed for writing to pixels can be reduced. Moreover, loads on source lines, gate lines, and the like are reduced, so that display with a high frame rate is possible. Consequently, smooth moving images can be displayed, which improves sense of reality.

Figures 19A, 19B, 19C, 19D, 19E, 19F, 19G, 19H, 19I, 19J:
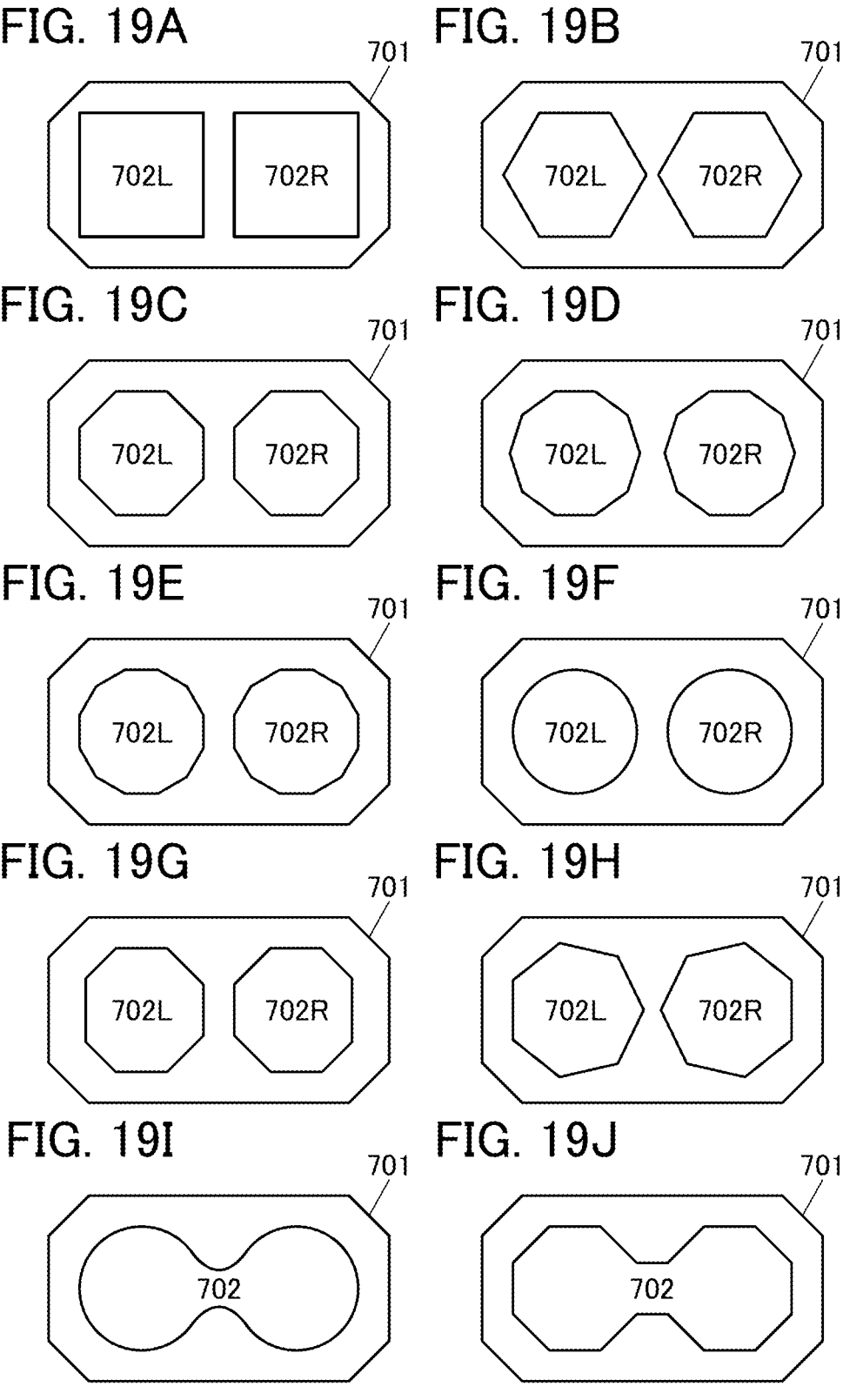
FIG. 19A to FIG. 19J are diagrams illustrating structure examples of a display apparatus.

FIG. 19A illustrates a structure example of a display panel. In FIG. 19A, a display portion 702L for the left eye and a display portion 702R for the right eye are provided inward from a substrate 701. Note that in addition to the display portion 702L and the display portion 702R, a driver circuit, a wiring, an IC, an FPC, or the like may be provided over the substrate 701.

The display portion 702L and the display portion 702R illustrated in FIG. 19A have a square top surface shape.

The top surface shapes of the display portion 702L and the display portion 702R may be other regular polygons. FIG. 19B illustrates an example in which the top surface shape is a regular hexagon: FIG. 19C illustrates an example in which the top surface shape is a regular octagon: FIG. 19D illustrates an example in which the top surface shape is a regular decagon: and FIG. 19E illustrates an example in which the top surface shape is a regular dodecagon. When a polygon with even-numbered corners is used as above, the shape of the display portion can be bilaterally symmetrical. Note that a polygon that is not a regular polygon may be used. Moreover, a regular polygon or a polygon with rounded corners may be used.

Since the display portion consists of pixels arranged in a matrix, a linear portion of the outline of the display portion is not strictly a straight line and can be partly a stair-like portion. In particular, a linear portion that is not parallel to the direction of pixel arrangement has a stair-like top surface shape. Since the user watches images without perceiving the shape of the pixels, a tilted outline, which is stair-like to be exact, of the display portion can be regarded as a straight line. Similarly, a curved portion, which is stair-like to be exact, of the outline of the display portion can be regarded as a curve.

FIG. 19F illustrates an example in which the top surface shapes of the display portion 702L and the display portion 702R are circular.

The top surface shapes of the display portion 702L and the display portion 702R may be bilaterally asymmetrical. Moreover, the top surface shapes are not necessarily regular polygonal.

FIG. 19G illustrates an example in which the top surface shapes of the display portion 702L and the display portion 702R are bilaterally asymmetric octagonal. FIG. 19H illustrates an example in which the top surface shape is regular heptagonal. Even when the top surface shapes of the display portion 702L and the display portion 702R have a bilaterally asymmetrical shape in this manner, the display portion 702L and the display portion 702R are preferably arranged bilaterally symmetrically. Consequently, an image with no unnaturalness can be provided.

Although the structures where the display portion is divided into two are described above, the display portions may have a continuous shape.

FIG. 19I illustrates an example in which the two circular display portions in FIG. 19F are connected. FIG. 19J illustrates an example in which the two regular octagonal display portions in FIG. 19C are connected.

The above is the description of the structure examples of the display panel.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 7

In this embodiment, a metal oxide (also referred to as an oxide semiconductor) that can be used in the OS transistor described in the above embodiment is described.

The metal oxide used in the OS transistor contains preferably at least indium or zinc and further preferably indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and M is further preferably gallium.

The metal oxide can be formed by a sputtering method, a chemical vapor deposition (CVD) method such as a metal organic chemical vapor deposition (MOCVD) method, an atomic layer deposition (ALD) method, or the like.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method. The XRD spectrum obtained by GIXD measurement may be hereinafter simply referred to as an XRD spectrum.

For example, the XRD spectrum of the quartz glass substrate shows a peak with a substantially bilaterally symmetrical shape. On the other hand, the peak of the XRD spectrum of the In—Ga—Zn oxide film having a crystal structure has a bilaterally asymmetrical shape. The bilaterally asymmetrical peak of the XRD spectrum clearly shows the existence of crystals in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film deposited at room temperature. Thus, it is suggested that the In—Ga—

Zn oxide film deposited at room temperature is in an intermediate state, which is neither a single crystal nor polycrystal nor an amorphous state, and it cannot be concluded that In—Ga—Zn oxide film is in an amorphous state.

«Structure of Oxide Semiconductor»

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga, Zn) layer) are stacked. Indium and gallium can be replaced with each other. Therefore, indium may be contained in the (Ga, Zn) layer. In addition, gallium may be contained in the In layer. Note that zinc may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using $\theta/2\theta$ scanning, for example, a peak indicating c-axis alignment is detected at $2\theta$ of $31°$ or around $31°$. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement: however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm: thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

«Structure of Oxide Semiconductor»

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. Alternatively, for example, the first region is a region having [In] higher than [In] in the second region and [Ga] lower than [Ga] in the second region. Moreover, the second region is a region having [Ga] higher than [Ga] in the first region and [In] lower than [In] in the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under conditions where intentional heating is not performed on a substrate, for example. Moreover, in the case of forming the CAC-OS by a sputtering method, any one or more selected from an inert gas (typically, argon), an oxygen gas, and a nitrogen gas are used for a deposition gas. The proportion of the flow rate of an oxygen gas in the total flow rate of the deposition gas during deposition is preferably as low as possible. For example, the proportion of the flow rate of an oxygen gas in the total flow rate of the deposition gas is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material: as a whole, the CAC-OS has a function of a semiconductor. Separation of the conducting function and the insulating function can maximize each function. Accordingly, when the CAC-OS is used for a transistor, high on-state current (Ion), high field-effect mobility (u), and excellent switching operation can be achieved.

A transistor using the CAC-OS has high reliability. Thus, the CAC-OS is most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that impurities in an oxide semiconductor refer to, for example, elements other than the main components of an oxide semiconductor. For example, an element with a concentration lower than 0.1 atomic % can be regarded as an impurity.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 8

In this embodiment, electronic devices of one embodiment of the present invention will be described with reference to FIG. 18 to FIG. 23.

An electronic device in this embodiment includes the display apparatus of one embodiment of the present invention. In the display apparatus of one embodiment of the present invention, increases in resolution, definition, and sizes are easily achieved. Thus, the display apparatus of one embodiment of the present invention can be used for a display portion of a variety of electronic devices.

The display apparatus of one embodiment of the present invention can be fabricated at low cost, which leads to a reduction in the manufacturing cost of an electronic device.

Examples of electronic devices include a digital camera, a digital video camera, a digital photo frame, a mobile phone, a portable game console, a portable information terminal, and an audio reproducing device in addition to electronic devices with a relatively large screen, such as a television device, a desktop or notebook personal computer, a monitor of a computer or the like, digital signage, and a large game machine like a pachinko machine.

In particular, the display apparatus of one embodiment of the present invention can have a high resolution, and thus can be suitably used for an electronic device including a relatively small display portion. Examples of such an electronic devices include information terminals (wearable devices) such as watch-type and bracelet-type information terminals and wearable devices capable of being worn on the head, such as a VR device like a head-mounted display and a glasses-type AR device. Examples of wearable devices include an SR (Substitutional Reality) device and an MR (Mixed Reality) device.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680× 4320). In particular, definition of 4K2K, 8K4K, or higher is preferable. Furthermore, the pixel density (resolution) of the display apparatus of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With the display apparatus with such high definition or high resolution, the electronic device can have higher realistic sensation, sense of depth, and the like in personal use such as portable use or home use.

The electronic device in this embodiment can be incorporated along a curved surface of an inside wall or an outside wall of a house or a building or the interior or the exterior of a car.

The electronic device in this embodiment may include an antenna. With the antenna receiving a signal, a video, information, and the like can be displayed on a display portion. When the electronic device includes the antenna and a secondary battery, the antenna may be used for contactless power transmission.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of kinds of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 20A:
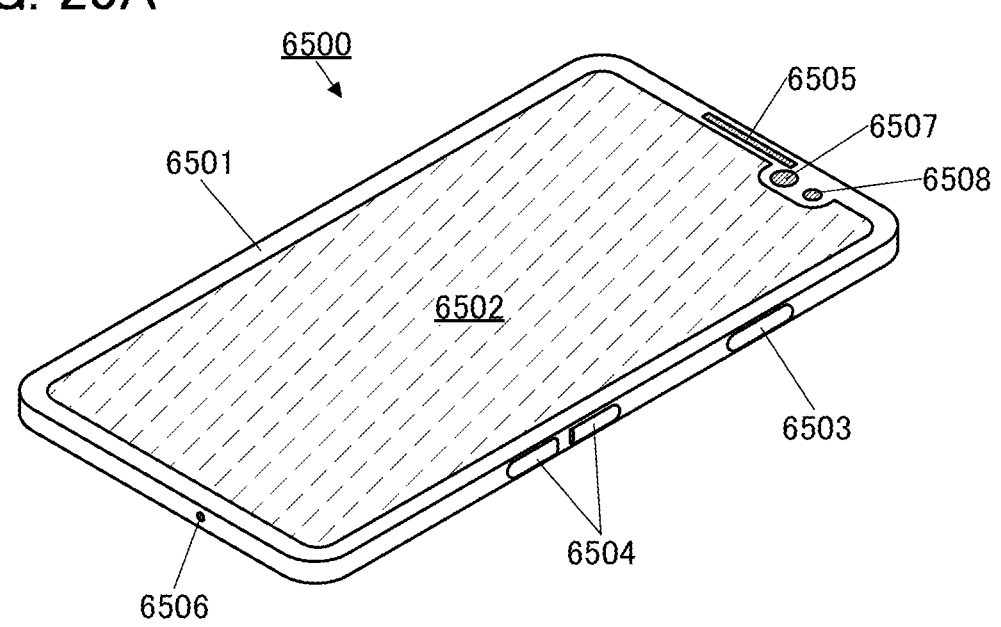
FIG. 20A and FIG. 20B are diagrams illustrating an example of an electronic device.

An electronic device 6500 illustrated in FIG. 20A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 20B:
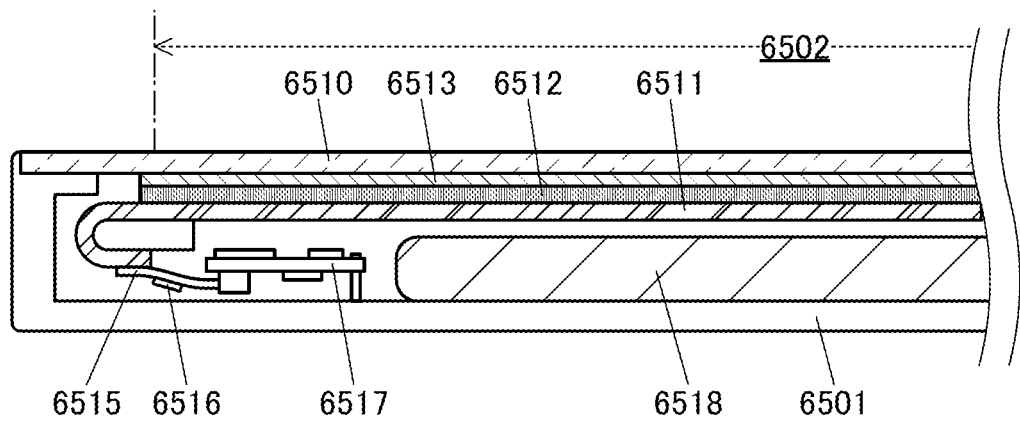

FIG. 20B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display (a display apparatus having flexibility) of one embodiment of the present invention can be used for the display panel 6511. Thus, an extremely lightweight electronic device can be achieved. Since the display panel 6511 is extremely thin, the battery 6518 with high capacity can be mounted while the thickness of the electronic device is controlled. An electronic device with a narrow frame can be obtained when part of the display panel 6511 is folded back so that the portion connected to the FPC 6515 is positioned on the rear side of a pixel portion.

FIG. 21A illustrates an example of a television device. In a television device 7100, a display portion 7000 is incorporated in a housing 7101. Here, a structure where the housing 7101 is supported by a stand 7103 is illustrated.

The display apparatus of one embodiment of the present invention can be used for the display portion 7000.

Operation of the television device 7100 illustrated in FIG. 21A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure where a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 21B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000.

FIG. 21C and FIG. 21D illustrate examples of digital signage.

Digital signage 7300 illustrated in FIG. 21C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 21D is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 21C and FIG. 21D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 21C and FIG. 21D, the digital signage 7300 or the digital signage 7400 is preferably capable of working with an information terminal 7311 or an information terminal 7411 such as a user's smartphone through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

FIG. 22A is a diagram illustrating appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000. Note that the lens 8006 and the housing 8001 may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. The finder 8100 can display a video received from the camera 8000 and the like on the display portion 8102.

The button 8103 functions as a power supply button or the like.

The display apparatus of one embodiment of the present invention can be used for the display portion 8002 of the camera 8000 and the display portion 8102 of the finder 8100. Note that a finder may be incorporated in the camera 8000.

FIG. 22B is a diagram illustrating appearance of a head-mounted display 8200.

The head-mounted display 8200 includes a wearing portion 8201, a lens 8202, a main body 8203, a display portion 8204, a cable 8205, and the like. A battery 8206 is incorporated in the wearing portion 8201.

The cable 8205 supplies electric power from the battery 8206 to the main body 8203. The main body 8203 includes a wireless receiver or the like to receive image data and display it on the display portion 8204. The main body 8203 includes a camera, and data on the movement of the eyeballs or the eyelids of the user can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with use of current flowing through the electrodes. The mounting portion 8201 may include sensors such as a temperature sensor, a pressure sensor, and an acceleration sensor so that the user's biological information can be displayed on the display portion 8204 and an image displayed on the display portion 8204 can be changed in accordance with the movement of the user's head.

The display apparatus of one embodiment of the present invention can be used for the display portion 8204.

FIG. 22C to FIG. 22E are external views of a head-mounted display 8300. The head-mounted display 8300 includes a housing 8301, a display portion 8302, a fixing band 8304, and a pair of lenses 8305.

A user can see display on the display portion 8302 through the lenses 8305. Note that the display portion 8302 is preferably curved and placed because the user can feel a high sense of presence. Another image displayed in another region of the display portion 8302 is viewed through the lenses 8305, so that three-dimensional display using parallax or the like can be performed. Note that the number of display portions 8302 provided is not limited to one: two display portions 8302 may be provided so that one display portion is provided for one eye of the user.

The display apparatus of one embodiment of the present invention can be used for the display portion 8302. The display apparatus of one embodiment of the present invention achieves an extremely high resolution. For example, a pixel is not easily seen by the user even when the user sees display that is magnified by the use of the lenses 8305 as illustrated in FIG. 22E. In other words, a video with a strong sense of reality can be seen by the user with use of the display portion 8302.

FIG. 22F is an external view of a goggles-type head-mounted display 8400. The head-mounted display 8400 includes a pair of housings 8401, a mounting portion 8402, and a cushion 8403. A display portion 8404 and a lens 8405 are provided in each of the pair of housings 8401. Furthermore, when the pair of display portions 8404 display different images, three-dimensional display using parallax can be performed.

A user can perceive display on the display portion 8404 through the lenses 8405. The lens 8405 has a focus adjustment mechanism and can adjust the position according to the user's eyesight. The display portion 8404 is preferably a square or a horizontal rectangle. Accordingly, realistic sensation can be increased.

The mounting portion 8402 preferably has plasticity and elasticity to be adjusted to fit the size of the user's face and not to slide down. In addition, part of the mounting portion 8402 preferably has a vibration mechanism functioning as a bone conduction earphone. Thus, without additionally requiring an audio device such as earphones or a speaker, the user can enjoy video and sound only by wearing. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered by cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Electronic devices illustrated in FIG. 23A to FIG. 23F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 23A to FIG. 23F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The display apparatus of one embodiment of the present invention can be used in the display portion 9001.

The electronic devices illustrated in FIG. 23A to FIG. 23F are described in detail below.

Figure 23A:
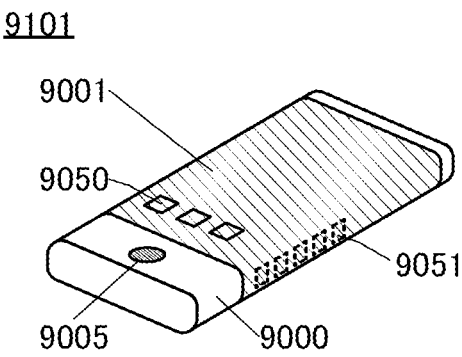
FIG. 23A to FIG. 23F are diagrams illustrating examples of electronic devices.

FIG. 23A is a perspective view showing a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 23A illustrates an example in which three icons 9050 are displayed. Furthermore, information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 23B:
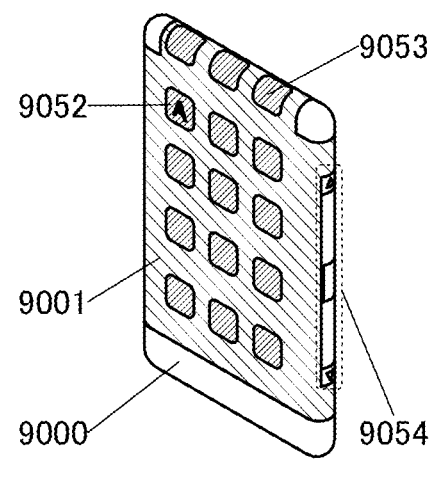

FIG. 23B is a perspective view showing a portable information terminal 9102. The portable information terminal 9102 has a function of displaying information on three or more surfaces of the display portion 9001. Shown here is an example in which information 9052, information 9053, and information 9054 are displayed on different surfaces. For example, a user can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 23C:
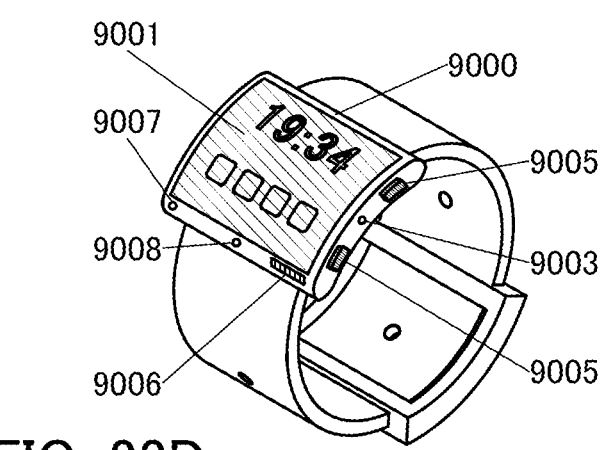

FIG. 23C is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 23D:
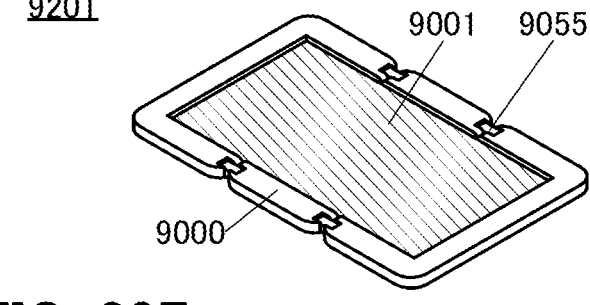
Figure 23E:
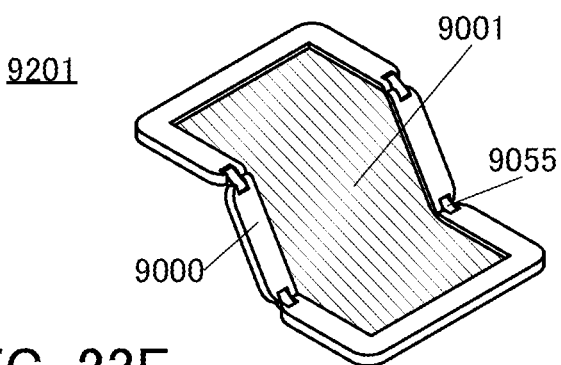
Figure 23F:
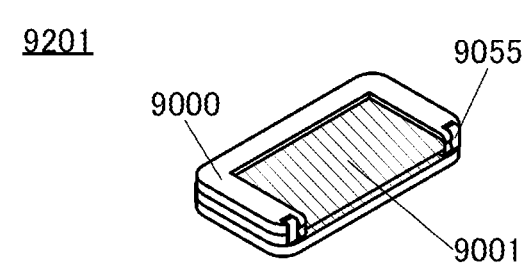

FIG. 23D to FIG. 23F are perspective views illustrating a foldable portable information terminal 9201. FIG. 23D is a perspective view of an opened state of the portable information terminal 9201. FIG. 23F is a perspective view of a folded state thereof, and FIG. 23E is a perspective view of a state in the middle of change from one of FIG. 23D and FIG. 23F to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 9

This embodiment describes the relationship between the screen size and pixel density of electronic devices each including an OLED display apparatuses and techniques applicable to the display apparatus.

Figure 24:
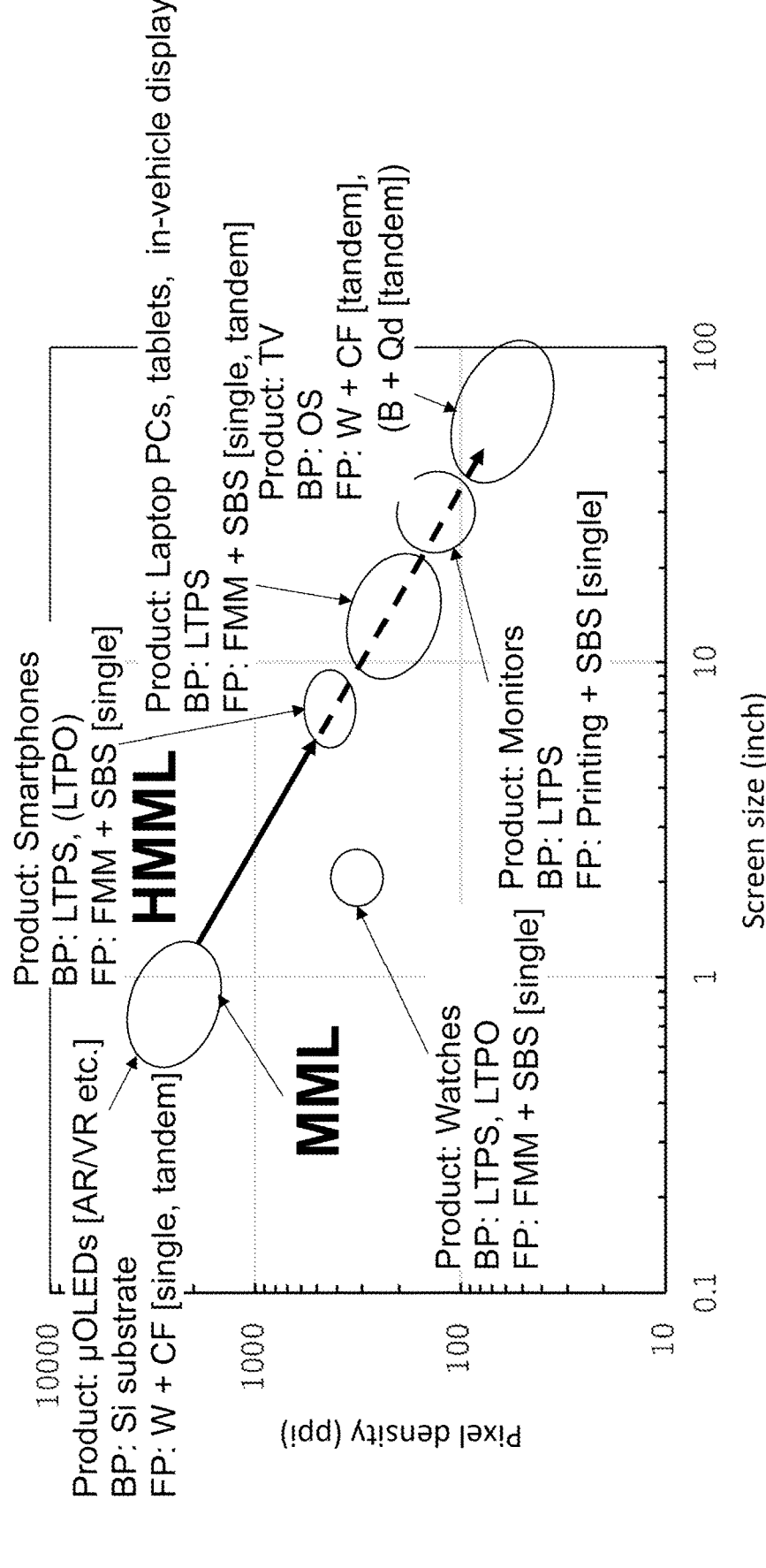
FIG. 24 is a diagram illustrating the relationship between the screen size and pixel density of products.

FIG. 24 is a diagram showing the relationship between the screen size and pixel density of products. The horizontal axis represents screen size (inch) and the vertical axis represents pixel density (ppi). FIG. 24 shows ranges of the typical screen sizes and pixel densities of products such as μOLEDs for AR products, VR products, etc., smartphones, watch-type devices, laptop PCs, tablet terminals, in-vehicle displays, monitor devices, and television devices (TVs). It is found that the resolution generally increases as the screen size decreases.

FIG. 24 also shows the techniques applicable to the products. Here, BP denotes a backplane and FP denotes a frontplane.

For a frontplane, techniques for full-color OLEDs are roughly divided into a side-by-side technique with a fine metal mask (FMM+SBS), a side-by-side technique by a printing method such as inkjetting (printing+SBS), a technique combining a white OLED and color filters (W+CF), a technique combining a blue OLED and quantum dots (B+Qd), and the like.

The types of OLEDs include a tandem structure in which a plurality of light-emitting units are stacked (tandem) and a single structure in which a light-emitting unit is not stacked (single).

As backplane manufacturing techniques, there are an LSI technique using a Si substrate, an LTPS (Low Temperature Poly Silicon) technique, an LTPO (Low Temperature Polysilicon and Oxide) technique, an OS (Oxide Semiconductor) technique, and the like.

Here, a technique in which OLEDs are separately formed by photolithography without using a fine metal mask is referred to as an MML (Metal Mask Less) technique. The MML technique is a technique that can achieve higher aperture ratio, higher efficiency, higher luminance, higher display quality, higher contrast, and higher reliability than the full-color techniques described above. The MML technique can be applied to the display apparatuses with all the screen sizes and all the resolutions in FIG. 24. The technique can be employed particularly suitably for a microdisplay with a screen size of approximately 1 inch and a resolution exceeding 1000 ppi.

A technique using a fine metal mask and photolithography in combination is referred to as HMML (Hybrid MML). The HMML technique can replace the conventional full-color technique with FMM+SBS, and achieve higher aperture ratio, higher reliability, higher display quality, and higher contrast than it.

At least part of this embodiment can be implemented in combination with the other embodiments described in this specification as appropriate.

REFERENCE NUMERALS

100: display apparatus, 101: substrate, 103: pixel, 105: insulating layer, 110B: light-emitting element, 110G: light-emitting element, 110R: light-emitting element, 110: light-emitting element, 111B: pixel electrode, 111C: connection electrode, 111G: pixel electrode, 111R: pixel electrode, 111: pixel electrode, 112B: organic layer, 112G: organic layer, 112R: organic layer, 112: organic layer, 113: common electrode, 114: organic layer, 115: organic layer, 116: organic layer, 117: charge-generation layer, 118: organic layer, 119: organic layer, 120: slit, 121: protective layer, 125a: pixel, 125b: pixel, 125f: insulating film, 125: insulating layer, 126: resin layer, 130: connection portion, 131: insulating layer, 132: insulating layer, 135B: layer, 135G: layer, 135R: layer, 143: resist mask, 144: sacrificial film, 145: sacrificial layer, 146: sacrificial film, 147: sacrificial layer, 151B: FMM, 151G: FMM, 151R: FMM, 161: conductive layer, 162: conductive layer, 163: resin layer

The invention claimed is:

1. A display apparatus comprising:
a first light-emitting element; and
a second light-emitting element,
wherein in the first light-emitting element, a first pixel electrode, a first light-emitting layer, and a common electrode are stacked in this order,
wherein in the second light-emitting element, a second pixel electrode, a second light-emitting layer, and the common electrode are stacked in this order,
wherein a first layer and a second layer are included in a region between the first light-emitting element and the second light-emitting element, wherein the first layer overlaps with the second light-emitting layer and comprises a material that is the same as a material of the first light-emitting layer,
wherein the second layer overlaps with the first light-emitting layer and comprises a material that is the same as a material of the second light-emitting layer,
wherein an end portion of the first light-emitting layer and an end portion of the first layer are provided to face each other in the region between the first light-emitting element and the second light-emitting element, and
wherein an end portion of the second light-emitting layer and an end portion of the second layer are provided to face each other in the region between the first light-emitting element and the second light-emitting element.

2. A display apparatus comprising:
a first light-emitting element; and
a second light-emitting element,
wherein in the first light-emitting element, a first pixel electrode, a first light-emitting layer, a first intermediate layer, a third light-emitting layer, and a common electrode are stacked in this order,
wherein in the second light-emitting element, a second pixel electrode, a second light-emitting layer, a second intermediate layer, a fourth light-emitting layer, and the common electrode are stacked in this order,
wherein a first layer, a second layer, a third layer, and a fourth layer are included between the first light-emitting element and the second light-emitting element,
wherein the first layer overlaps with the second light-emitting layer, the second intermediate layer, and the fourth light-emitting layer and comprises a material that is the same as a material of the first light-emitting layer,
wherein the second layer overlaps with the first light-emitting layer, the first intermediate layer, and the third light-emitting layer and comprises a material that is the same as a material of the second light-emitting layer,
wherein the third layer overlaps with the first layer and comprises a material that is the same as a material of the third light-emitting layer,
wherein the fourth layer overlaps with the second layer and comprises a material that is the same as a material of the fourth light-emitting layer,
wherein an end portion of the first light-emitting layer and an end portion of the first layer are provided to face each other in a region between the first light-emitting element and the second light-emitting element,
wherein an end portion of the second light-emitting layer and an end portion of the second layer are provided to face each other in the region between the first light-emitting element and the second light-emitting element,
wherein an end portion of the third light-emitting layer and an end portion of the third layer are provided to face each other in the region between the first light-emitting element and the second light-emitting element, and
wherein an end portion of the fourth light-emitting layer and an end portion of the fourth layer are provided to face each other in the region between the first light-emitting element and the second light-emitting element.

3. The display apparatus according to claim 2,
wherein the first light-emitting layer comprises the material that is the same as the material of the third light-emitting layer, and wherein the second light-emitting layer comprises the material that is the same as the material of the fourth light-emitting layer.

4. The display apparatus according to claim 1, further comprising a resin layer, wherein the resin layer is in the region between the first light-emitting element and the second light-emitting element, wherein the end portion of the first light-emitting layer and the end portion of the first layer face each other with the resin layer interposed therebetween, and wherein the end portion of the second light-emitting layer and the end portion of the second layer face each other with the resin layer interposed therebetween.

5. The display apparatus according to claim 1, further comprising a first insulating layer, wherein the first insulating layer is in the region between the first light-emitting element and the second light-emitting element, and wherein the first insulating layer is in contact with the end portion of the first light-emitting layer, the end portion of the second light-emitting layer, the end portion of the first layer, and the end portion of the second layer.

6. A manufacturing method of a display apparatus, comprising:

a first step of forming a first pixel electrode and a second pixel electrode side by side;

a second step of forming an island-shaped first light-emitting layer over the first pixel electrode with use of a first metal mask;

a third step of forming an island-shaped second light-emitting layer over the second pixel electrode with use of a second metal mask, the second light-emitting layer overlapping with an end portion of the first light-emitting layer;

a fourth step of dividing each of the first light-emitting layer and the second light-emitting layer by etching in a region between the first pixel electrode and the second pixel electrode; and a fifth step of forming a common electrode covering the first light-emitting layer and the second light-emitting layer.

7. The manufacturing method of a display apparatus, according to claim 6, further comprising, between the fourth step and the fifth step, a sixth step of forming a resin layer in a slit formed by the etching.

8. The manufacturing method of a display apparatus, according to claim 7, wherein a photosensitive organic resin is used for the resin layer.

9. The manufacturing method of a display apparatus, according to claim 7, further comprising, between the fourth step and the sixth step, a seventh step of forming a first insulating layer in contact with a side surface of the first light-emitting layer and a side surface of the second light-emitting layer that are exposed by the etching.

10. The manufacturing method of a display apparatus, according to claim 9, wherein an inorganic insulating film formed by an atomic layer deposition method is used for the first insulating layer.

11. The display apparatus according to claim 2, further comprising a resin layer, wherein the resin layer is in the region between the first light-emitting element and the second light-emitting element, wherein the end portion of the first light-emitting layer and the end portion of the first layer face each other with the resin layer interposed therebetween, and wherein the end portion of the second light-emitting layer and the end portion of the second layer face each other with the resin layer interposed therebetween.

12. The display apparatus according to claim 2, further comprising a first insulating layer, wherein the first insulating layer is in the region between the first light-emitting element and the second light-emitting element, and wherein the first insulating layer is in contact with the end portion of the first light-emitting layer, the end portion of the second light-emitting layer, the end portion of the first layer, and the end portion of the second layer.

* * * * *